(12) United States Patent
Motoyoshi et al.

(10) Patent No.: US 6,992,342 B2
(45) Date of Patent: Jan. 31, 2006

(54) MAGNETIC MEMORY DEVICE HAVING A NON-VOLATILE MAGNETIC SECTION AND MANUFACTURING THEREOF

(75) Inventors: Makoto Motoyoshi, Kanagawa (JP); Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 10/612,842

(22) Filed: Jul. 2, 2003

(65) Prior Publication Data
US 2004/0113175 A1    Jun. 17, 2004

(30) Foreign Application Priority Data
Jul. 8, 2002    (JP)    ............... 2002-198133

(51) Int. Cl.
*H01L 29/76*    (2006.01)
(52) U.S. Cl. ............... 257/295; 365/158; 365/171; 365/173; 438/692; 438/741; 438/745; 438/754
(58) Field of Classification Search ............... 365/158, 365/171, 173; 438/692, 741, 745, 754
See application file for complete search history.

(56) References Cited

U.S. PATENT DOCUMENTS 6,211,090 B1 * 4/2001 Durlam et al. ............... 438/692
6,724,651 B2 * 4/2004 Hirai ........................... 365/158

* cited by examiner

*Primary Examiner*—Mai-Huong Tran
(74) *Attorney, Agent, or Firm*—Sonnenschein, Nath & Rosenthal LLP

(57) ABSTRACT

A magnetic memory device, in which a tunnel magneto resistance element that establishes a connection between a write word line (first interconnection) and a bit line (second interconnection) is provided within a region in which the write word line and the bit line cross in a grade-separated manner. The magnetic memory device comprises a through hole that is provided in such a manner that is insulated from the write word line and also extending through the write word line so as to establish a connection between the tunnel magneto resistance element and a second landing pad (interconnection layer) lower than the write word line, and a contact that is formed in the through hole through a side wall barrier film so as to establish a connection between the tunnel magneto resistance element and the second landing pad.

5 Claims, 26 Drawing Sheets

ENLARGED VIEW

MAGNETIC MEMORY DEVICE HAVING A NON-VOLATILE MAGNETIC SECTION AND MANUFACTURING THEREOF

CROSS REFERENCE TO RELATED APPLICATIONS

The present document is based on Japanese Priority Application JP2002-198133, filed in the Japanese Patent Office on Jul. 8, 2002, the contents of which being incorporated herein by reference to the extent permitted by law.

BACKGROUND OF THE INVENTION

1. Field of the Invention

The present invention relates to a magnetic memory device and a method for manufacturing the magnetic memory device. More specifically, the present invention relates to a nonvolatile magnetic memory device for storing information by utilizing a change in resistance depending on whether spin directions of ferromagnetic materials forming a tunnel magneto resistance element are parallel or antiparallel. The present invention also relates to a method for manufacturing the nonvolatile magnetic memory device.

2. Description of the Related Art

With a remarkable popularization of information communication apparatuses, especially personal small-sized apparatuses such as mobile terminals, there has been a demand for higher performance including higher integration levels, higher speed and a lower power consumption on memory devices, logic elements and other components of those apparatuses. In particular, a nonvolatile memory is seen as an indispensable device that aims at meeting the needs of a ubiquitous networking technological era.

Even when power is reduced, an abnormality occurs, or a connection with a server or a network occurs due to a problem of some sort, for instance, a nonvolatile memory would be able to protect personal valuable information. Accordingly, an approach to a nonvolatile memory of higher-density, larger-capacity becomes increasingly significant as technologies for replacing hard disks or optical disks face an intrinsic limitation for the downsizing due to the presence of movable parts in those apparatuses.

In addition, recent mobile apparatuses have been designed to hold down power consumption as much as possible in such a way as to place unnecessary circuits blocked in a standby mode. However, if a nonvolatile memory combining a high-speed network memory and a large-capacity storage memory is attainable, a waste in power consumption and waste of memory capacity may be reduced. Further, a realization of a higher-speed larger-capacity nonvolatile memory may provide a so-called instant-on function that enables a startup almost in the instant the power is applied.

Examples of the nonvolatile memory include a flash memory employing a semiconductor, a FRAM (Ferroelectric Random Access Memory) employing a ferroelectric material and others. However, the flash memory has a disadvantage of a slow writing operation because of a writing rate as low as the level of $\mu$ (micro) seconds. A problem with the FRAM presents is that the number of times information is erasable is limited to a range of $10^{12}$ to $10^{14}$, which leads to a low endurance that is not enough to replace the FRAM with a static random access memory or a dynamic random access memory completely. The FRAM also involves a problem in that it is difficult to fabricate a ferroelectric capacitance by etching.

A memory that is attractive as a candidate for a nonvolatile memory free from the above drawbacks is a magnetic memory called a MRAM (Magnetic Random Access Memory). Early MRAMs are of a type that is based on a spin valve realized with an AMR (Anisotropic Magneto Resistive) effect and/or a GMR (Giant Magneto Resistance) effect. The AMR effect has been reported in "Thin Solid Films" Vol. 216(1992), pages 162 to 168, by J. M. Daughton. The GMR effect has been reported in "IEDM Technical Digest" (1997), pages 995 to 997, by D. D. Tang et al. However, the MRAM has had a disadvantage of a high power consumption per bit at the time of reading because of a loaded memory cell resistance as low as 10 $\Omega$ to 100 $\Omega$, resulting in a difficulty in ensuring larger capacity.

In addition, as reported in "Physics Reports" Vol. 238 (1994), pages 214 to 217, by R. Meservey et al, a TMR (Tunnel Magneto Resistance) effect has had a limitation in resistance change rate to a range of 1% to 2% at room temperature. However, as having been reported in "J. Magnetism & Magnetic Material" Vol. 139 (1995), L 231, by T. Miyazaki et al, a resistance change rate as high as close to 20% has proved to be attainable with the TMR effect. Accordingly, the MRAM realized with the TMR effect has attracted much attention.

The MRAM has a simple structure enough to easily ensure a higher integration level. In addition, the MRAM is to store information with a magnetic moment rotation, so that it is expected to have a greater number rewriting. With respect to an access time, the MRAM is also expected to be accessible at a considerably high rate. Specifically, an accessibility of the MRAM at a rate of 100 MHz has been already reported in "ISSCC Digest of Technical Papers" (February 2000), pages 128 to 129, by R. Scheuerlein et al.

A MRAM of a conventional type that is composed of 1 switching element and one TMR element (of a 1T1J structure) will now be described with reference to FIG. 30 showing a cross-sectional view of a schematic configuration of the MRAM of the conventional type. In FIG. 30, there is shown an exemplary MRAM using a MOS transistor as a switching element.

As shown in FIG. 30, a silicon substrate 21 has thereon a MOS transistor 24 for the switching element. One end of an extraction electrode 137 of a TMR (Tunneling Magneto Resistance) element 13 is connected to one diffusion layer 28 of the MOS transistor 24 through a contact 30, a first landing pad 31, a contact 32, a second landing pad 33, a contact 34, a third landing pad 35 and a contact 36 that are stacked in ascending order. The other end of the extraction electrode 137 is connected to an anti-ferromagnetic layer 131 of the TMR element 13. The extraction electrode 137 is formed with a conductive material, for instance, and the anti-ferromagnetic layer 131, which will be described later, is used as the extraction electrode. Alternatively, the extraction electrode may be a part of the anti-ferromagnetic layer 131.

A sense line 15 is connected to the other diffusion layer 27 of the MOS transistor 24 through a contact 29 including a tungsten plug.

The TMR element 13 is configured with a tunnel barrier layer 133 interposed between a ferromagnetic layer forming a fixed magnetization layer 132 and a ferromagnetic layer forming a storage layer 134 that yields a relatively easy spinning of magnetization. The TMR element 13 also has the anti-ferromagnetic layer 131 that is in contact with a lower surface of the fixed magnetization layer 132. The TMR element 13 further has a cap layer 135 and an electrode layer 136 that are stacked on the storage layer 134, and a bit line 12 is connected to the electrode layer 136. A write word line 11 is provided beneath the extraction electrode 137 of the TMR element 13 through a fourth insulator film 44. The write word line 11 and the bit line 12 cross in a grade-separated manner with the TMR element 13 interposed therebetween.

The storage layer 134 and the fixed magnetization layer 132 are formed with, for instance, nickel, iron, cobalt, an alloy including at least two out of nickel, iron and cobalt and a ferromagnetic material mainly containing the above alloys. The fixed magnetization layer 132 is in contact with the anti-ferromagnetic layer 131, so that an interlayer exchange coupling between the fixed magnetization layer 132 and the anti-ferromagnetic layer 131 causes the fixed magnetization layer 132 to have an intensive unidirectional magnetic anisotropy.

The anti-ferromagnetic layer 131 may be formed with, for instance, one of an iron-manganese alloy, a nickel-manganese alloy, a platinum-manganese alloy, an iridium-manganese alloy, a rhodium-manganese alloy, a cobalt oxide and a nickel oxide.

The tunnel barrier layer 133 includes, for instance, an insulator material such as an aluminum oxide, a magnesium oxide, a silicon oxide, an aluminum nitride, a magnesium nitride, a silicon nitride, an aluminum oxy-nitride, a magnesium oxy-nitride and a silicon oxy-nitride. The tunnel barrier layer 133 plays a role of carrying a tunnel current while disconnecting a magnetic bond between the storage layer 134 and the fixed magnetization layer 132. These magnetic films and conductive films are formed typically using a sputtering method. The tunnel barrier layer 133 is obtainable by means of oxidation, nitridation or oxy-nitridation of a metal film having been formed by sputtering.

Further, the cap layer 135 provides functions such as a prevention of mutual diffusion between the cap layer 135 and an interconnection that is to connect the TMR element 13 with a different TMR element 13, a reduction in contact resistance and an anti-oxidation of the storage layer 134. Typically, the cap layer 135 is formed with a material such as copper, a tantalum nitride, tantalum and a titanium nitride.

An operation of the above-mentioned magnetic memory device is described next. In the TMR element 13, information is read by means of detecting a change of a tunnel current due to the magneto resistance effect, while the magneto resistance effect depends on orientations of magnetization of the storage layer 134 relative to the fixed magnetization layer 132.

A way to write data onto the TMR element 13 is to store "1" or "0" by changing a magnetization orientation of the storage layer 134 with a resultant magnetic field generated by applying a current to the bit line 12 and the write word line 11. Meanwhile, readout of information from the TMR element 13 is performed by means of detecting the change of the tunnel current due to the magneto resistance effect. When magnetization orientations of the storage layer 134 and the fixed magnetization layer 132 are parallel, a resistance is assumed to be low (a low resistance will be defined as "0", for instance). On the other hand, when the magnetization orientations of the storage layer 134 and the fixed magnetization layer 132 are antiparallel, a resistance is assumed to be high (a high resistance will be defined as "1", for instance).

An easy axis magnetic field ($H_{EA}$) of the storage layer 134 is generated by a current passing through the bit line 12, while a hard axis magnetic field ($H_{HA}$) of the storage layer 134 is generated by a current passing through the write word line 11.

An asteroid curve shown in FIG. 31 represents an inverted threshold value in the magnetization orientation of the storage layer with a generated easy axis magnetic field $H_{EA}$ and a generated hard axis magnetic field $H_{HA}$. When a resultant magnetic field vector equivalent to parts A and B on the outside of the asteroid curve is generated, a field reversal occurs, which enables data to be stored. A resultant magnetic field vector equivalent to a part C on the inside of the asteroid curve causes no reversal of a cell from one of current bistable states thereof. In addition, magnetic fields individually generated from the word line and the bit line are also applied to cells other than that at a point of intersection between the word line and the bit line that are carrying a current. Thus, when the generated magnetic fields are more intensive than a unidirectional inverted magnetic field $H_K$ (or within a region B), magnetization orientations of the cells other than that at the point of intersection are also inverted. Accordingly, selective writing of information onto a selected cell is enabled only when the resultant magnetic field falls on a region A shown by slanted lines.

As described above, the MRAM is configured with an array of memory cells located at points of intersection of a lattice composed of the bit lines and the write word lines. In the case of the MRAM, asteroid magnetization reversal characteristics obtainable with the write word line and the bit line are typically utilized to store information selectively into individual memory cells.

A resultant magnetization in a single storage region is determined depending on how to combine vectors in the easy axis magnetic field $H_{EA}$ and the hard axis magnetic field $H_{HA}$ respectively applied to the single storage region. A current passing through the bit line applies the easy axis magnetic field ($H_{EA}$) to the cells, while a current passing through the write word line applies the hard axis magnetic field ($H_{HA}$) to the cells.

There are two main types of MRAMS. One is the MRAM composed of one switching element and one TMR element (of the 1T1J structure) as previously described with reference to FIG. 30. The other is a well-known cross-point MRAM as shown in FIG. 32.

As shown in FIG. 32, a cross-point MRAM 301 is obtainable with a configuration, in which a TMR element 313 and a pn-junction diode 314 are interposed between a write word line 311 and a bit line 312 that cross in a grade-separated manner. The TMR element 313 is configured with a tunnel barrier layer 333 interposed between two ferromagnetic layers 332 and 334 and also has an anti-ferromagnetic layer 331 connected to one ferromagnetic layer 332. The pn-junction diode 314 is located adjacent to the anti-ferromagnetic layer 331 and is composed of n pieces of layers connected together.

As shown in FIG. 33, a minimum size of a line width (or line interval) of each write word line 311 and each bit line 312 that are arrayed to meet a design rule is now assumed to be F. Then, the cross-point MRAM 301 would be obtainable in a cell area as much as $4F^2$. The cross-point MRAM requires no switching element for each TMR element 313, providing a memory that ensures a large capacity though being inferior in access rate.

Meanwhile, the MRAM cell composed of one switching element and one TMR element (of the 1T1J structure) as shown in FIG. 30 or a MRAM cell realized with two switching elements and two TMR elements (of 2T2J structure) of the above-mentioned MRAM cell in a complementary manner should be configured with the write word line electrically insulated from the TMR element, among two crossing lines of the write word line and the bit line. Thus, the fixed magnetization layer of the TMR element needs to be connected to the diffusion layer of the MOS transistor for the switching element by providing an extraction electrode, a contact hole and others in such a manner as to bypass the write word line located right beneath the TMR element.

In the MRAM composed of one switching element and one TMR element, when a minimum size of a line width (or line interval) of each write word line 11 and each bit line 12 that are arrayed to meet a design rule is assumed to be F, there is a limit to a cell size. Specifically, a minimum length required for a cell configuration is limited to 4F in a parallel direction to an array of the bit lines 12 and 2F in a parallel direction to an array of the write word lines 11, as shown in FIG. 34, for reason that there must be provided the TMR element 13 in a region between the write word line 11 and the bit line 12, and also the contact C that is to establish a connection between the bit line 12 and the diffusion layer (not shown) of the transistor for the switching element. Thus, a cell area as small as less than $8F^2$ is unobtainable. It is to be noted that the transistor for the switching element of the MRAM having the above configuration shown in FIG. 34 has a gate electrode 24 located on a lower lateral side of each write word line 11.

SUMMARY OF THE INVENTION

As described above, the MRAM of one switching element-one TMR element type presents a problem of a lower integration level of a memory cell array by half than the above cross-point MRAM, though being not so inferior in access rate thereto. Thus, there is a need for a MRAM of one switching element-one TMR element type, in which a similar access rate as the conventional MRAM of one switching element-one TMR element type is maintained, and a higher integration level is attainable in such a way as to obtain the same cell area as the cross-point MRAM.

The present invention has been conceived in view of the above mentioned problems and, according to the preferred embodiments of the present invention, there are provided a magnetic memory device and a method for manufacturing the magnetic memory device.

In a non-volatile magnetic memory device including a first interconnection, a second interconnection that crosses the first interconnection in a grade-separated manner, and a tunnel magneto resistance element configured with a tunnel barrier layer interposed between ferromagnetic materials within a region, in which the first and second interconnections cross, so as to be electrically insulated from the first interconnection, while being electrically connected to the second interconnection, wherein information is stored by utilizing a change in resistance depending on whether spin directions of the ferromagnetic materials are parallel or antiparallel, a magnetic memory device according a preferred embodiment of the present invention includes a through hole provided in such a manner as to be electrically insulated from the first interconnection and also to extend through the first interconnection so as to establish a connection between the tunnel magneto resistance element and an interconnection layer provided lower than the first interconnection, and a contact formed in the through hole so as to establish a connection between the interconnection layer provided lower than the first interconnection and the opposite side of the tunnel magneto resistance element to a side, to which the second interconnection is connected.

The above-mentioned magnetic memory device may have the through hole provided in such a manner as to be electrically insulated from the first interconnection and also to extend through the first interconnection, and the contact formed in the through hole so as to establish the connection between the interconnection layer provided lower than the first interconnection and the opposite side of the tunnel magneto resistance element to the side, to which the second interconnection is connected, thereby providing the contact located right beneath the tunnel magneto resistance element. Thus, a connection between the tunnel magneto resistance element and the interconnection layer lower than the first interconnection may be established by making use of a cell area of the tunnel magneto resistance element without newly creating an area of the contact allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

A method for manufacturing a magnetic memory device according a first preferred embodiment of the present invention includes a step of fabricating a first interconnection on a substrate having an insulated surface, a step of forming an insulator film that covers the first interconnection, a step of opening a through hole extending from the insulator film to an interconnection layer on the substrate through the first interconnection, a step of forming a side wall barrier film on a side wall of the through hole, a step of forming a contact in the through hole, a step of forming a tunnel magneto resistance element that is configured with a tunnel barrier layer interposed between ferromagnetic materials and is electrically insulated from the first interconnection, while being electrically connected to the contact, and a step of fabricating a second interconnection that is electrically connected to the tunnel magneto resistance element and crosses the first interconnection in a grade-separated manner with the tunnel magneto resistance element interposed therebetween.

The above-mentioned first method for manufacturing the magnetic memory device may still have a step of opening the through hole extending from the insulator film to the interconnection layer on the substrate lower than the first interconnection through the first interconnection, a step of forming the side wall barrier film on the side wall of the through hole, and step of forming the contact in the through hole, thereby providing the magnetic memory device having the contact located right beneath the tunnel magneto resistance element. Thus, a connection between the tunnel magneto resistance element and the other interconnection may be established by making use of a cell area of the tunnel magneto resistance element without newly creating an area of the contact allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

A method for manufacturing a magnetic memory device according a second preferred embodiment of the present invention includes a step of forming a high permeability film, a first interconnection layer and an insulator film in ascending order on a substrate having an insulated surface, a step of opening a through hole extending from the insulator film to an interconnection layer on the substrate through the first interconnection layer and the high permeability film, a step of forming a side wall barrier film on a side wall of the through hole, a step of forming a contact in the through hole, a step of forming a dummy film on the insulator film, a step of etching a multi-layered film ranging from the dummy film to the high permeability film into a shape of a first interconnection, a step of forming a flux concentrator with the high permeability film and a high permeability side wall including a high permeability material by forming the high permeability side wall on a side wall of a multi-layered structure formed in the shape of the first interconnection by etching, a step of stripping the dummy film, a step of forming, on the insulator film, a tunnel magneto resistance element that is configured with a tunnel barrier layer interposed between ferromagnetic materials and is connected to the contact, and a step of fabricating a second interconnection that is electrically connected to the tunnel magneto resistance element and crosses the first interconnection in a grade-separated manner with the tunnel magneto resistance element interposed therebetween.

The above-mentioned second method for manufacturing the magnetic memory device may have the step of opening the through hole extending through the first interconnection or write word line, the flux concentrator and others and the step of forming the contact in the through hole through the side wall barrier film, thereby providing the magnetic memory device having the contact located right beneath the tunnel magneto resistance element, like the above-mentioned first method. Thus, a connection between the tunnel magneto resistance element and the other interconnection may be established by making use of a cell area of the tunnel magneto resistance element without newly creating an area of the contact allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

The above-mentioned second method for manufacturing the magnetic memory device further includes the step of forming the flux concentrator of the high permeability film so as to surround the opposite side faces of the first interconnection and an opposite face of the first interconnection to a side facing the tunnel magneto resistance element, so that a galvano-magnetic field generated at the time of applying a current to the first interconnection is concentrated efficiently on the storage layer (which will be also called a recording layer) of the tunnel magneto resistance element with the high permeability film formed on the opposite side faces of the first interconnection. Thus, it is possible to reduce current required for writing, thus reducing current consumption and also increasing lifetime of the first interconnection against electromigration. Further, there is less drive current required, which reduces an area of a current drive circuit, thereby providing an increased integration level. Furthermore, as leakage of magnetic field is also reduced, interference with adjacent cells is reduced.

A method for manufacturing a magnetic memory device according to a third preferred embodiment of the present invention includes a step of forming a high permeability film, a first interconnection layer and a first insulator film in ascending order on a substrate having an insulated surface, a step of opening a through hole extending from the first insulator film to an interconnection layer on the substrate through the first interconnection layer and the high permeability film, a step of forming a side wall barrier film on a side wall of the through hole, a step of forming a contact in the through hole, a step of etching a multi-layered film ranging from the first insulator film to the high permeability film into a shape of a first interconnection, a step of forming a flux concentrator with the high permeability film and a first high permeability side wall including a high permeability material by forming the first high permeability side wall on a side wall of a multi-layered structure formed in the shape of the first interconnection by etching, a step of forming a second insulator film that covers the first insulator film, the contact and the flux concentrator, an then subjecting the second insulator film to planarization, while allowing an end of the flux concentrator to be exposed to the outside, a step of forming, on the first insulator film, a tunnel magneto resistance element that is configured with a tunnel barrier layer interposed between ferromagnetic materials and is connected to the contact, a step of forming a side wall barrier film on a side wall of the tunnel magneto resistance element, a step of forming, on the side wall of the tunnel magneto resistance element through the side wall barrier film, a second high permeability side wall that is connected to the end of the flux concentrator, and a step of fabricating a second interconnection that is electrically connected to the tunnel magneto resistance element and crosses the first interconnection in a grade-separated manner with the tunnel magneto resistance element interposed therebetween.

The above-mentioned third method for manufacturing the magnetic memory device includes the step of opening the through hole extending through the first interconnection or write word line, the flux concentrator and others, and also the step of forming the contact in the through hole through the side wall barrier film, thereby providing the magnetic memory device having the contact located right beneath the tunnel magneto resistance element, like the above-mentioned first method. Thus, a connection between the tunnel magneto resistance element and the other interconnection may be established by making use of a cell area of the tunnel magneto resistance element without newly creating an area of the contact allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

The above-mentioned third method for manufacturing the magnetic memory device further includes the step of forming the flux concentrator of the high permeability film so as to surround the opposite side faces of the first interconnection and an opposite face of the first interconnection to the side facing the tunnel magneto resistance element, so that a galvano-magnetic field generated at the time of applying a current to the first interconnection is concentrated efficiently on the storage layer (which will be also called a recording layer) of the tunnel magneto resistance element with the high permeability film formed on the opposite side faces of the first interconnection. Thus, it is possible to reduce current required for writing, thus reducing current consumption and also increasing lifetime of the first interconnection against electromigration. Further, there is less drive current required, which reduces an area of a current drive circuit, thereby providing an increased integration level. Furthermore, as leakage of magnetic field is also reduced, interference with adjacent cells is reduced.

A method for manufacturing a magnetic memory device according a fourth preferred embodiment of the present invention includes a step of fabricating a first interconnection on a substrate having an insulated surface, a step of forming a first insulator film that covers the first interconnection, a step of forming a high permeability film and a second insulator film in ascending order on the first insulator film, a step of opening a through hole extending from the second insulator film to an interconnection layer on the substrate through the high permeability film, the first insulator film and the first interconnection, a step of forming a side wall barrier film on a side wall of the through hole, a step of forming a contact in the through hole, a step of forming a dummy film on the second insulator film, a step of etching the dummy film, the second insulator film and the high permeability film on the first interconnection into a shape of the first interconnection, a step of forming a flux concentrator with the high permeability film and a high permeability side wall including a high permeability material by forming the high permeability side wall on a side wall of a multi-layered structure formed in the shape of the first interconnection by etching, a step of stripping the dummy film, a step of forming, on the second insulator film, a tunnel magneto resistance element that is configured with a tunnel barrier layer interposed between ferromagnetic materials and is connected to the contact, and a step of fabricating a second interconnection that is electrically connected to the tunnel magneto resistance element and crosses the first interconnection in a grade-separated manner with the tunnel magneto resistance element interposed therebetween.

The above-mentioned fourth method for manufacturing the magnetic memory device has the step of opening the through hole extending through the first interconnection or write word line, the flux concentrator and others, and the step of forming the contact in the through hole through the side wall barrier film, thereby providing the magnetic memory device having the contact located right beneath the tunnel magneto resistance element, like the above-mentioned first method. Thus, a connection between the tunnel magneto resistance element and the other interconnection may be established by making use of a cell area of the tunnel magneto resistance element without newly creating an area of the contact allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

The above-mentioned fourth method for manufacturing the magnetic memory device may further include the step of forming the flux concentrator of the high permeability film so as to be located between the first interconnection and the tunnel magneto resistance element, while extending along the side face of the tunnel magneto resistance element through the insulator film, after a fabrication of the first interconnection, so that a galvano-magnetic field generated at the time of applying a current to the first interconnection is concentrated efficiently on the storage layer (which will be also called a recording layer) of the tunnel magneto resistance element with the flux concentrator formed on a lower side of the side face of the tunnel magneto resistance element. Thus, it is possible to reduce current required for writing, thus reducing current consumption and also increasing lifetime of the first interconnection against electromigration. Further, there is less drive current required, which reduces an area of a current drive circuit, thereby providing an increased integration level. Furthermore, as leakage of magnetic field is also reduced, interference with adjacent cells is reduced.

A method for manufacturing a magnetic memory device according a fifth preferred embodiment of the present invention includes a step of forming a first high permeability film, a first interconnection layer and a first insulator film in ascending order on a substrate having an insulated surface, a step of etching a multi-layered film ranging from the first insulator film to the first high permeability film into a shape of a first interconnection, a step of forming a first flux concentrator with the first high permeability film and a high permeability side wall including a high permeability material by forming the high permeability side wall on a side wall of a multi-layered structure formed in the shape of the first interconnection by etching, a step of forming a second insulator film that covers the first flux concentrator and the first insulator film, a step of forming a second high permeability film and a third insulator film in ascending order on the second insulator film, a step of opening a through hole extending from the third insulator film to an interconnection layer on the substrate through the second high permeability film, the second insulator film, the first insulator film, the first interconnection and the first flux concentrator, a step of forming a side wall barrier film on a side wall of the through hole, a step of forming a contact in the through hole, a step of forming a dummy film on the third insulator film, a step of etching the dummy film, the third insulator film and the second high permeability film on the first interconnection into a shape of the first interconnection, a step of forming a second flux concentrator with the second high permeability and a high permeability side wall including a high permeability material by forming the high permeability side wall on a side wall of a multi-layered structure formed in the shape of the first interconnection by etching, a step of stripping the dummy film, a step of forming, on the third insulator film, a tunnel magneto resistance element that is configured with a tunnel barrier layer interposed between ferromagnetic materials and is connected to the contact, and a step of fabricating a second interconnection that is electrically connected to the tunnel magneto resistance element and crosses the first interconnection in a grade-separated manner with the tunnel magneto resistance element interposed therebetween.

The above-mentioned fifth method for manufacturing the magnetic memory device may have the step of opening the through hole extending through the first interconnection or write word line, the flux concentrator and others, and the step of forming the contact in the through hole through the side wall barrier film, thereby providing the magnetic memory device having the contact located right beneath the tunnel magneto resistance element. Thus, a connection between the tunnel magneto resistance element and the other interconnection may be established by making use of a cell area of the tunnel magneto resistance element without newly creating an area of the contact allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

The above-mentioned fifth method for manufacturing the magnetic memory device further may further include the step of forming the first flux concentrator of the high permeability film so as to surround the opposite side faces of the first interconnection and an opposite face of the first interconnection to the side facing the tunnel magneto resistance element, and the step of forming the second flux concentrator of the high permeability film so as to be located between the first interconnection and the tunnel magneto resistance element while extending along the side face of the tunnel magneto resistance element through the insulator film, after a fabrication of the first interconnection, so that a galvano-magnetic field generated at the time of applying a current to the first interconnection may be concentrated efficiently on the storage layer (which will be also called a recording layer) of the tunnel magneto resistance element through a transfer from the first flux concentrator to the second flux concentrator. Thus, it is possible to reduce current required for writing, thus reducing current consumption and also increasing lifetime of the first interconnection against electromigration. Further, there is less drive current required, which reduces an area of a current drive circuit, thereby providing an increased integration level. Furthermore, as leakage of magnetic field is also reduced, interference with adjacent cells is reduced.

As described mentioned above, the magnetic memory device of the present invention has the contact that is connected to the interconnection layer lower than the first interconnection. Specifically, the contact of the magnetic memory device of the present invention is insulated from the first interconnection and also extends through the first interconnection so as to be connected to the opposite face of the tunnel magneto resistance element to the side, to which the second interconnection is connected. As a result, there may be provided the contact within an area, in which the tunnel magneto resistance element occupies. Thus, the magnetic memory device of the present invention may eliminate a need to fabricate a conventionally required extraction interconnection portion connected to the tunnel magneto resistance element, thereby enabling a decrease of a length in a parallel direction to an array of the second interconnections (bit lines) without newly creating an area of the contact allotted to the cell area. Specifically, when a minimum line width is assumed to be F, a conventional magnetic memory device has required a cell area having a size equal to or more than $8F^2$, whereas the magnetic memory device of the present invention is obtainable in a cell size smaller than $8F^2$. More specifically, the cell size of the magnetic memory device of the present invention is minimized to $4F^2$, for instance. Thus, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element is made smaller as much as a cell area of the cross-point MRAM.

The magnetic memory device manufactured by the method according to the preferred embodiments of the present invention may eliminate a need to fabricate a conventionally required extraction interconnection part connected to the tunnel magneto resistance element, thereby enabling a decrease of a length in parallel to an array of the second interconnections (bit lines) without newly creating an area of the contact allotted to the cell area. Specifically, when a minimum line width is assumed to be F, the conventional magnetic memory device has required a cell area having a size equal to or more than $8F^2$, whereas the magnetic memory device of the present invention is obtainable in a cell size smaller than $8F^2$. More specifically, the cell size of the magnetic memory device of the present invention is minimized to $4F^2$, for instance. Thus, there may be provided a MRAM composed of one switching element and one TMR element, in which the same access rate as the conventional MRAM or magnetic memory device of one witching element-one TMR element type is maintained, and a more reduction in cell area as compared with the conventional magnetic memory device is enabled. A cell area of the MRAM composed of one switching element and one TMR element is made smaller as much as a cell area of the cross-point MRAM. The magnetic memory device having the flux concentrator may also produce the above effects likewise.

Further, because of no need to fabricate the conventionally required extraction interconnection part connected to the tunnel magneto resistance element, single etching is applicable to form the tunnel magneto resistance element. Thus, there is no need to take a margin of a mask alignment into consideration in fabricating the extraction interconnection, thereby enabling a further proportional reduction in cell area. Further, an applicability of single etching to form the tunnel magneto resistance element requires no fine control of etching such as suspension of etching on the tunnel barrier layer, the fixed magnetization layer or the anti-ferromagnetic layer, thereby enabling a decrease of a load on an etching process.

BRIEF DESCRIPTION OF THE DRAWINGS

The above and other features and advantages of the present invention will become more apparent to those skilled in the art through the following description of the presently preferred exemplary preferred embodiments of the invention taken in conjunction with the accompanying drawings, in which:

FIG. 2 illustrates a relation between an amount of dislocation between a TMR element and a through hole and a current required for a storage layer of the TMR element in reverting magnetization, in which

FIG. 3 shows a second preferred embodiment of the magnetic memory device according a preferred embodiment of the present invention, in which

DESCRIPTION OF THE PREFERRED EMBODIMENTS OF THE PRESENT INVENTION

Figure 1:
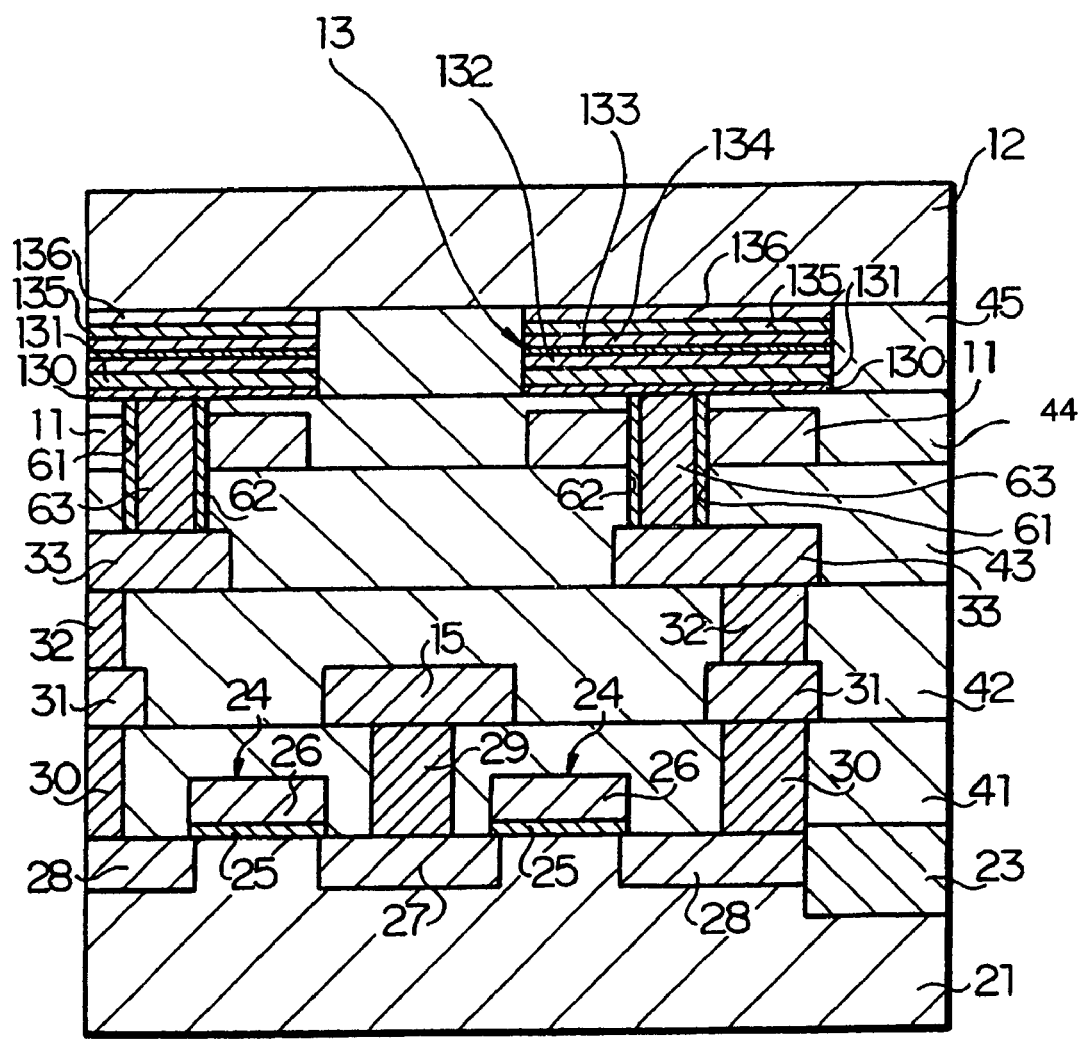
FIG. 1 is showing a cross-sectional view of a schematic configuration of a first preferred embodiment of a magnetic memory device according a preferred embodiment of the present invention.

A first preferred embodiment of a magnetic memory device according a preferred embodiment of the present invention will be described next with reference to FIG. 1 showing a cross-sectional view of a schematic configuration of the first preferred embodiment.

As shown in FIG. 1, a semiconductor substrate 21 (p-type semiconductor substrate, for instance) has on a surface side thereof a p-type well region (not shown). The p-type well region has a device isolation region 23 for isolating a transistor fabrication region, and the device isolation region 23 is formed with STI (Shallow Trench Isolation), for instance. The p-type well region also has field effect transistors 24, 24 for switching elements. Each field effect transistor 24 has a gate electrode (word line) 26 through a gate insulator film 25 located on the p-type well region. Each field effect transistor 24 also has diffusion layer regions ($N^+$ diffusion layer regions, for instance) 27, 28 in the p-type well region located on the opposite sides of the gate electrode 26. In FIG. 1, there is shown a configuration in which two field effect transistors 24 for the switching elements share the single diffusion layer 27.

The field effect transistors 24 provide functions as switching elements for reading. The field effect transistors 24 are not limited to n- or p-type field effect transistors, and different switching elements such as diodes and bipolar transistors may be also employed.

There is also provided a first insulator film 41 that covers the field effect transistors 24. The first insulator film 41 has contacts (conductive plugs including a refractory metal such as tungsten) 29, 30 respectively connected to the diffusion layer regions 27, 28. The first insulator film 41 also has thereon a sense line 15 connected to the contact 29, a landing pad (first landing pad) 31 connected to the contact 30 and others.

The first insulator film 41 also has thereon a second insulator film 42 that covers the sense line 15, the first landing pad 31 and others. The second insulator film 42 has a contact (conductive plug including a refractory metal such as tungsten, for instance) 32 connected to the first landing pad 31. The second insulator film 42 also has thereon a landing pad (second landing pad) 33 connected to the contact 32.

The second insulator film 42 also has thereon a third insulator film 43 that covers the second landing pad 33 and others. The third insulator film 43 has thereon a write word line 11 located so as to pass above the second landing pad 33.

The third insulator film 43 also has thereon a fourth insulator film 44 that covers the write word line 11 and others. The fourth insulator film 44 has a through hole 61 that extends to the second landing pad 33 through the write word line 11.

The through hole 61 has therein a contact 63 through a side wall barrier film 62. The contact 63 is formed with a conductive plug including a refractory metal such as tungsten. Accordingly, the write word line 11 and the contact 63 are electrically insulated from each other with the side wall barrier film 62.

The fourth insulator film 44 also has thereon a barrier metal layer 130, which has on an upper surface thereof an anti-ferromagnetic layer 131 located above the write word line 11. The anti-ferromagnetic layer 131 has thereon a multi-layered structure composed of a fixed magnetization layer 132 including a ferromagnetic material, a tunnel barrier layer 133 and a storage layer 134 that yields a relatively easy spinning of magnetization. The multi-layered structure has thereon a cap layer 135. A multi-layered film ranging from the anti-ferromagnetic layer 131 to the cap layer 135 provides an information storage element (which will be hereinafter referred to as a TMR element) 13. Further, the cap layer 135 has thereon an electrode layer 136 connected to a bit line 12 forming a second interconnection.

The fourth insulator film 44 also has thereon a fifth insulator film 45 that covers the TMR element 13 and others. A surface of the fifth insulator film 45 is subjected to planarization, thereby allowing a surface of the electrode layer 136 to be exposed to the outside through the surface of the fifth insulator film 45. The fifth insulator film 45 has thereon the bit line 12 that is in contact with an upper surface of the electrode layer 136. The bit line 12 is located on the write word line 11 and crosses (or extends orthogonal to, for instance) the write word line 11 in a grade-separated manner with the TMR element 13 interposed therebetween.

The fixed magnetization layer 132 and the storage layer 13 of the TMR element 13 may be of a single layer structure of a ferromagnetic layer. Alternatively, a multi-layered structure may be also employed, in which two or more ferromagnetic layers are stacked with a conductive layer including ruthenium, copper, chromium, gold, silver and the like interposed therebetween, for instance. Alternatively, a substrate of the anti-ferromagnetic layer 131 may be covered with a substrate conductive layer (not shown) that is to connect the anti-ferromagnetic layer 131 with a switching element connected to the TMR element in series. Alternatively, the anti-ferromagnetic layer 131 may have the function of the substrate conductive layer.

The storage layer 134 and the fixed magnetization layer 132 are formed with, for instance, nickel, iron, cobalt, an alloy including at least two out of nickel, iron and cobalt or a ferromagnetic material mainly containing the above alloy. The fixed magnetization layer 132 is in contact with the anti-ferromagnetic layer 131, so that an interlayer exchange coupling between the fixed magnetization layer 132 and the anti-ferromagnetic layer 131 causes the fixed magnetization layer 132 to nave an intensive unidirectional magnetic anisotropy.

The anti-ferromagnetic layer 131 may be formed with one of an iron-manganese alloy, a nickel-manganese alloy, a platinum-manganese alloy, an iridium-manganese alloy, a rhodium-manganese alloy, a cobalt oxide and a nickel oxide, for instance.

The tunnel barrier layer 133 includes, for instance, an insulator material such as an aluminum oxide, a magnesium oxide, a silicon oxide, an aluminum nitride, a magnesium nitride, a silicon nitride, an aluminum oxy-nitride, a magnesium oxy-nitride and a silicon oxy-nitride. The tunnel barrier layer 133 plays a role of carrying a tunnel current, while disconnecting a magnetic bond between the storage layer 134 and the fixed magnetization layer 132. These magnetic films and conductive films are typically formed using a sputtering method. The tunnel barrier layer 133 is obtained by means of oxidation, nitridation or oxy-nitridation of a metal film formed by sputtering.

The storage layer 134 has also thereon the cap layer 135 and the electrode layer 136 connected to the bit line. The cap layer 135 provides functions such as a prevention of mutual diffusion between the cap layer 135 and an interconnection that is to connect the TMR element 13 with a different TMR element 13, a reduction in contact resistance and an anti-oxidation of the storage layer 134. The cap layer 135 is typically formed with a material such as copper, a tantalum nitride, tantalum and a titanium nitride. The electrode layer 136 is formed with a conductive material connected to the bit line, and tungsten or a tungsten nitride is typically used.

An operation of the above-mentioned magnetic memory device 1 will be described next. In the TMR element 13, information is read by means of detecting a change of a tunnel current due to a magneto-resistance effect, while the magneto resistive effect depends on magnetization orientations of the storage layer 134 relative to the fixed magnetization layer 132.

In the TMR element 13, "1" or "0" is stored by changing the magnetization orientation of the storage layer 134 with a resultant magnetic field generated by applying a current to the bit line 12 and the write word line 11. Meanwhile, readout of information is performed by means of detecting a change of the tunnel current due to the magneto resistance effect. When the magnetization orientations of the storage layer 134 and the fixed magnetization layer 132 are parallel, resistance is assumed to be low (a low resistance will be defined as "0", for instance). On the other hand, when the magnetization orientations of the storage layer 134 and the fixed magnetization layer 132 are antiparallel, resistance is assumed to be high (a high resistance will be defined as "1", for instance).

Figure 2A:
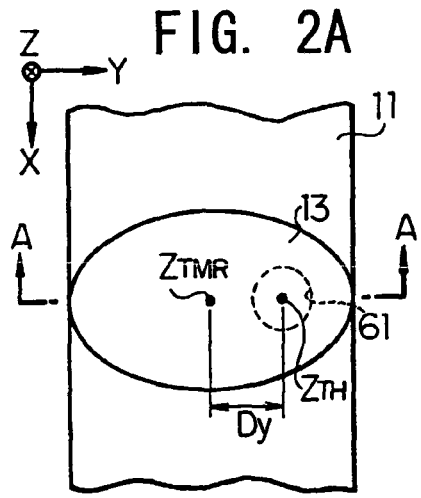
FIG. 2A is a plan view showing an exemplary relation among a write word line, the TMR element and the through hole.
Figure 2B:
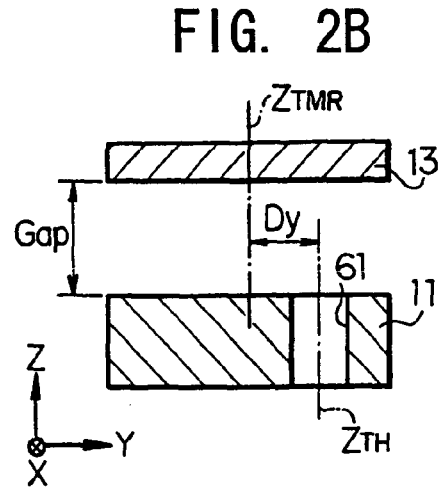
FIG. 2B is a fragmentary cross-cross-sectional view taken along line A—A in FIG. 2A, and FIG. 2C and FIG. 2D are graphs showing the relation between the amount of dislocation between the TMR element and the through hole and the current required for the storage layer of the TMR element in reverting the magnetization.

In the TMR element having the above configuration, there is risk that a magnetic field of the storage layer 132 varies with the through hole 61 opened in the write word line 11 and a misalignment between the through hole 61 and the write word line 11. In this connection, a relation between an amount Dy of dislocation between a position of a center axis $Z_{TH}$ of the through hole 61 and a position of a center axis $Z_{TMR}$ of the TMR element and a current required for the storage layer of the TMR element 13 in reverting magnetization was measured by simulation in such a manner as to open the through hole 61 in the write word line 11 as shown in FIG. 2A of a plan view and FIG. 2B of a cross-sectional view taken along line A—A in FIG. 2A. The amount of dislocation between the TMR element and the through hole is scaled at a horizontal axis of each of graphs shown in FIG. 2C and FIG. 2D. The current required for the storage layer of the TMR element 13 in reverting the magnetization is scaled at a vertical axis of each of the graphs shown in FIG. 2C and FIG. 2D. Results of the above measurement are shown in FIG. 2C and FIG. 2D.

In the above measurement, it was assumed that the write word line 11 extends in a X-axis direction, and the TMR element 13 is an ellipsoidal TMR element having a shorter diameter (in the X-axis direction) of 0.13 μm and a longer diameter (in a Y-axis direction) of 0.26 μm. It was also assumed that the through hole 61 has a circular opening whose diameter is limited to 50 nm and 80 nm. In addition, the amount of dislocation (in the Y-axis direction) between the center axis $Z_{TH}$ of the through hole 61 and the center axis $Z_{TMR}$ of the TMR element 13 is indicated by Dy on the condition that the dislocation between the center axis $Z_{TH}$ of the through hole 61 and the center axis $Z_{TMR}$ of the TMR element occurs in the Y-axis direction. Thus, if Dy=0, the center axis $Z_{TMR}$ of the TMR element 13 is supposed to be in alignment with the center axis $Z_{TH}$ of the through hole 61. Further, a distance between the TMR element 13 and the write word line 11 is indicated by Gap. It is to be noted that there is shown no insulator film for simplification purposes in FIG. 2A and FIG. 2B.

Figure 2C:
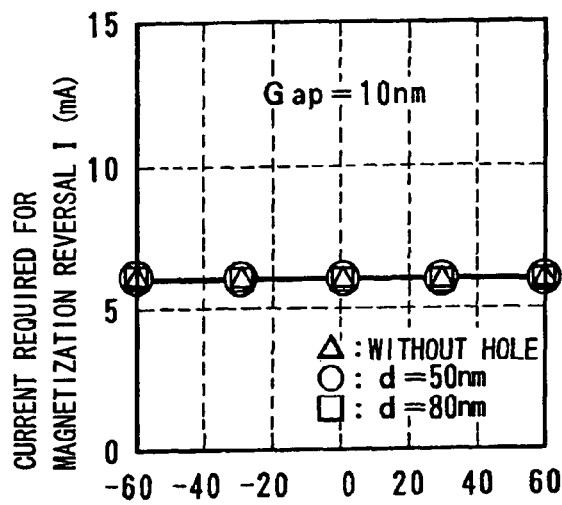

The graph in FIG. 2C shows a relation between a current I required for the storage layer of the TMR element 13 in reverting the magnetization and the amount Dy of dislocation between the TMR element 13 and the through hole 61 when Gap=10 nm. When the diameter of the through hole 61 was 50 nm and 80 nm, as well as a case where no through hole 61 was provided, a constant current of 6 mA was attained over a range of the amount Dy of dislocation between the TMR element 13 and the through hole 61 within the range of −60 nm≦Dy≦+60 nm. Specifically, an inverting current was maintained constant irrespectively of the amount Dy of dislocation between the TMR element 13 and the through hole 61.

Figure 2D:
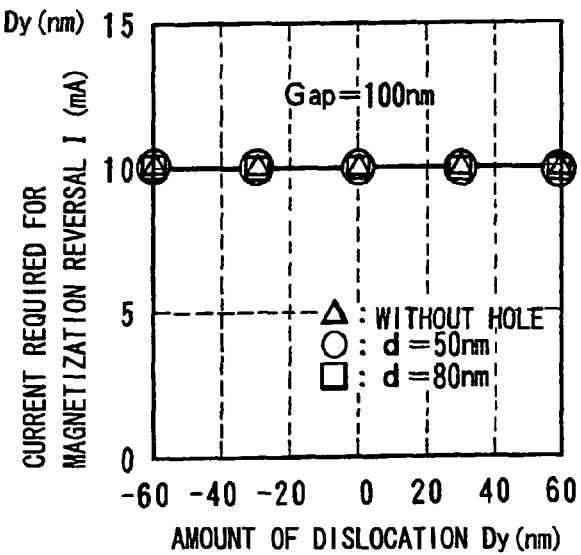

The graph in FIG. 2D also shows a relation between the current I required for the storage layer of the TMR element 13 in reverting the magnetization and the amount Dy of dislocation between the TMR element 13 and the through hole 61 when Gap=100 nm. When the diameter of the through hole 61 was 50 nm and 80 nm, as well as a case where no through hole 61 was provided, a constant current of 10 mA was attained over a range of the amount Dy of dislocation between the TMR element 13 and the through hole 61 within the range of −60 nm≦Dy≦+60 nm. Specifically, an inverting current was maintained constant irrespectively of the amount Dy of dislocation between the TMR element 13 and the through hole 61.

Accordingly, it is understood that the through hole 61 that extends through the waste word line 11 hardly affects the intensity of a magnetic field generated from the write word line 11. It is also understood that the misalignment between the through hole 61 and the write word line 11 at least from −60 nm to +60 nm does not affect the intensity of the generated magnetic field.

The above-mentioned magnetic memory device 1 has the through hole 61 provided in such a manner as to be insulated from the write word line 11 forming the first interconnection and also to extend through the write word line 11. The above-mentioned magnetic memory device 1 also has the contact 63 that is to establish a connection between the opposite side of the TMR element 13 to the side, to which the bit line 12 forming the second interconnection is connected, and the second landing pad 33 forming the other interconnection layer through the through hole 61, thereby providing the contact 63 located right beneath the TMR element 13. Thus, a connection between the TMR element 13 and the second landing pad 33 connected to the diffusion layer 28 of the MOS transistor 24 for the switching element through the contacts 30, 32, the first landing pad 31 and others may be established by making use of a cell area of the TMR element 13 without newly creating an area of the contact 63 allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made as smaller as a cell area of the cross-point MRAM.

Figure 3A:
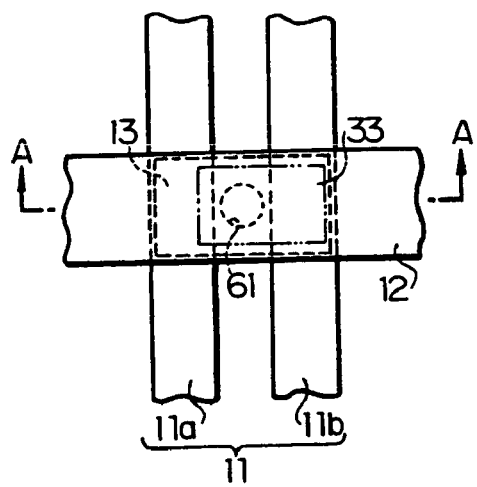
FIG. 3A is a layout drawing.
Figure 3B:
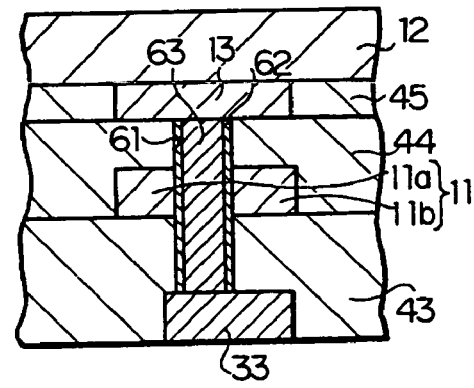
FIG. 3B is a cross-sectional view taken along line A—A in FIG. 3A.

A second preferred embodiment of the magnetic memory device will be described next with reference to FIGS. 3A and 3B. FIG. 3A is a layout drawing, and FIG. 3B is a cross-sectional view taken along line A—A in FIG. 3A.

The magnetic memory device of the second preferred embodiment differs from the magnetic memory device of the above first preferred embodiment in the configuration of the write word line and the through hole that is provided so as to extend through the write word line. Other configurations of the magnetic memory device of the second preferred embodiment are the similar as the magnetic memory device of the above first preferred embodiment.

In the following description, emphasis will be placed on components that differ from those of the magnetic memory device of the above first preferred embodiment. As shown in FIG. 3B, a third insulator film 43 that covers a second landing pad 33 has thereon an array of two pieces of parallel write word lines 11 (11a, 11b). A fourth insulator film 44 that covers the two pieces of the write word lines 11 has thereon a TMR element 13 located above these two pieces of write word lines 11. The fourth insulator film 44 also has thereon a fifth insulator film 45 that covers the TMR element 13, and an upper surface of the TMR element 13 is exposed to the outside through a surface of the fifth insulator film 45. The fifth insulator film 45 has thereon a bit line 12 that is in contact with the upper surface of the TMR element 13. The bit line 12 is located above the two pieces of write word lines 11 and crosses these write word lines 11 in a grade-separated manner with the TMR element 13 interposed therebetween. There is also provided a through hole 61 so as to extend from a lower surface of the TMR element 13 to a second landing pad 33 on a lower layer through a gap between the two pieces of write word lines 11a, 11b. The through hole 61 has on a side wall thereof a side wall barrier film 62. The through hole 61 also has therein a contact 63 through the side wall barrier film 62. The contact 63 is to establish a connection between the lower surface of the TMR element 13 and the second landing pad 33 and is formed with a tungsten plug, for instance.

The magnetic memory device of the second preferred embodiment has the following advantages, in addition to the same advantages as the magnetic memory device of the above first preferred embodiment. Specifically, the array of two pieces of write word lines 11 causes a magnetic flux to be applied to the TMR element 13 in a concentrated manner, thereby providing the advantage of an easy magnetization reversal of a storage layer of the TMR element 13.

Figure 4:
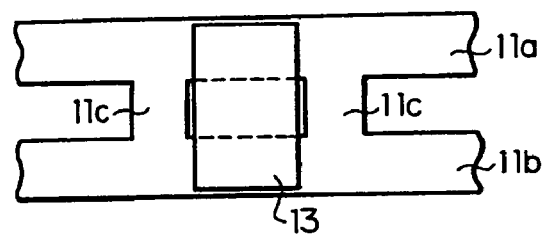
FIG. 4 is a layout drawing showing a modification of the write word line in the second preferred embodiment of the magnetic memory device according a preferred embodiment of the present invention.

Alternatively, as shown in the layout of FIG. 4, the two pieces of write word lines 11a, 11b may be partially connected together. Preferably, connection parts 11c between the two pieces of write word lines 11a, 11b are located at the opposite ends of the TMR element 13 as shown in FIG. 4. Alternatively, the connection parts 11c may be overlapped with the TMR element 13. A modification, in which the connection parts 11c for connecting the write word lines 11a, 11b together are provided at the opposite ends of the TMR element 13 as described above, enables the magnetic field generated in the write word lines to be applied to the TMR element more efficiently. It is to be noted that the number of write word lines 11 is not limited to two, and three or more write word lines 11 may be also employed.

Figure 5:
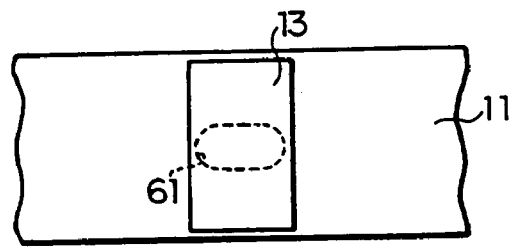
FIG. 5 is a layout diagram showing a modification of the through hole in the magnetic memory device according a preferred embodiment of the present invention.

As shown in the layout of FIG. 5, the through hole 61 may be a through hole having a longer portion in parallel to the write word line 11. Alternatively, the through hole 61 may be also a through hole that exceeds or projects from the TMR element 13. A modification of the through hole 61 as described above may increase a contact area between the TMR element 13 and a lower interconnection, such as a contact area between the TMR element 13 and a landing pad (not shown), leading to a reduction in contact resistance. The through hole 61 having a longer axis in a parallel direction to the write word line 11 may be also applied likewise to the modification previously described with reference to FIG. 4, in which the plurality of write word lines are provided. Alternatively, the through hole 61 that exceeds or projects from the TMR element 13 may be also applied likewise.

A third preferred embodiment of the magnetic memory device of the present invention will be described next with reference to cross-sectional views of FIG. 6A and FIG. 6B. The magnetic memory device of the third preferred embodiment of the invention relates to a modification of the magnetic memory device previously described with reference to FIG. 1, and further has a flux concentrator that allows a galvano-magnetic field generated from a write word line to be efficiently concentrated on a storage layer.

Figure 6A:
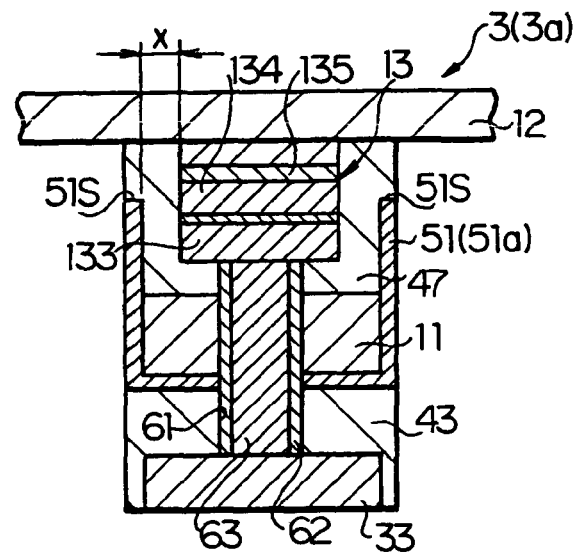
FIG. 6 is showing a cross-sectional view of a schematic configuration of a third preferred embodiment of the magnetic memory device according a preferred embodiment of the present invention.

FIG. 6A shows a basic configuration of the magnetic memory device of the third preferred embodiment. As shown in FIG. 6A, a magnetic memory device 3 (3a) has a write word line 11, and a bit line 12. The bit line 12 is located above the write word line 11 and crosses (extends orthogonal to, for instance) the write word line 11. The magnetic memory device 3 (3a) further has a tunneling magneto resistance (which will be hereinafter referred to as a TMR) element 13 through an insulator film 47. The TMR element 13 is located above the write word line 11 within a region, in which the bit line and the write word line cross. The TMR element 13 is connected to the bit line 12.

The write word line 11 has a flux concentrator 51 (51a) of a high permeability film so as to surround at least the opposite side faces of the write word line 11 and an opposite face of the write word line 11 to a side facing the TMR element 13. In addition, at least one side (or the opposite sides as shown in FIG. 6A) of the flux concentrator 51 on the side face of the write word line 11 projects from the write word line 11 toward the TMR element 13. Specifically, a side wall portion of the flux concentrator 51 projects toward the TMR element 13 so as to extend along a side face of the TMR element 13 through the insulator film 47. An end 51S of the side wall portion of the flux concentrator 51 may be as high as an interface between a storage layer 134 and a cap layer (not shown) of the TMR element 13, preferably, within a height range of an interface between a tunnel barrier film 133 and the storage layer 134 to an interface between the storage layer 134 and the cap layer 135. In addition, a distance x between the end 51S of the flux concentrator 51 and the TMR element 13 needs to be such a distance as to allow a galvano-magnetic flux having been concentrated on the end 51S of the flux concentrator 51 to reach the storage layer 134 efficiently. The distance x shall be preferably equal to or less than 200 nm, for instance.

Examples of high permeability materials used for the flux concentrator 51 include a soft magnetic material whose maximum permeability $\mu_m$ is equal to or more than 100, for instance. Specifically, an alloy containing nickel, iron and cobalt, an iron-aluminum (FeAl) alloy, a ferrite alloy and other soft magnetic materials may be used.

There is also provided a through hole 61 that extends through the insulator film 47, the write word line 11, the flux concentrator 51 and a third insulator film 43 so as to establish a connection between the TMR element 13 and a landing pad 33. In addition, the through hole 61 has on a side wall thereof a side wall barrier film 62. The through hole 61 also has therein a contact 63 through the side wall barrier film 62. The contact 63 is to establish a connection between an anti-ferromagnetic layer 131 (or barrier metal layer (not shown)) of the TMR element 13 and the landing pad 33.

If no electric insulator layer is provided between the write word line 11 and the flux concentrator 51 as shown in FIG. 6A, the flux concentrator 51 formed with a soft magnetic film having a high specific resistivity is preferably employed in order to prevent a current loss. As shown in FIGS. 6A and 6B, the side wall portion of the flux concentrator 51 projects from the opposite side faces of the write word line 11 toward the TMR element 13. Alternatively, the flux concentrator 51 may be a flux concentrator having a side wall portion projecting from one side face of the write word line 11.

A specific configuration of the magnetic memory device 3 with the above basic configuration incorporated therein will be described next with reference to FIG. 6B. It is to be noted that the specific configuration of the magnetic memory device 3 of the third preferred embodiment is also applicable to the magnetic memory device previously described with reference to FIG. 1.

Figure 6B:
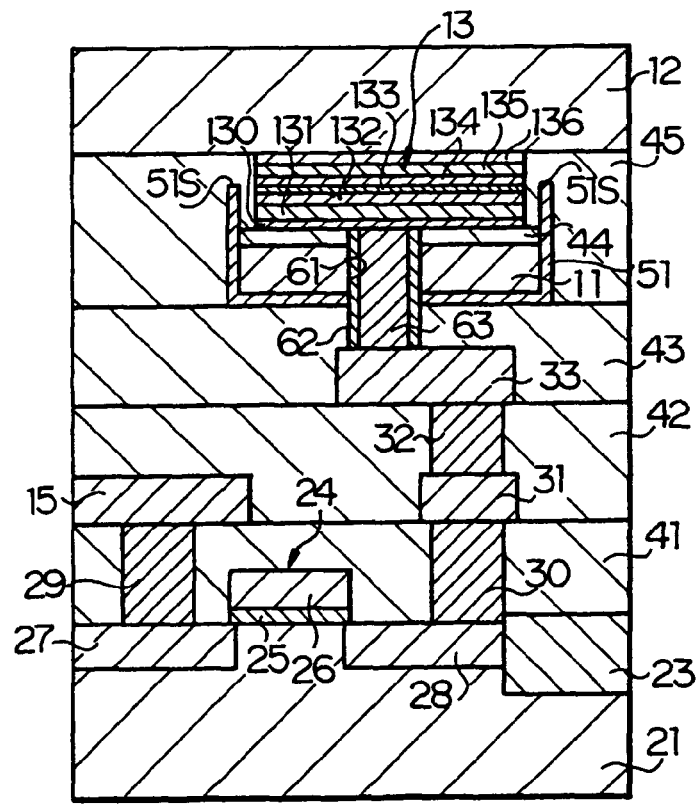

As shown in FIG. 6B, a semiconductor substrate (p-type semiconductor substrate, for instance) 21 has on a surface side thereof a p-type well region (not shown). The p-type well region has a device isolation region 23 that is to isolate a transistor fabrication region, and the device isolation region 23 is formed with STI (Shallow Trench isolation), for instance. The p-type well region also has a field effect transistor 24 for a switching element. The field effect transistor 24 has a gate electrode (word line) 26 through a gate insulator film 25 located on the p-type well region. The field effect transistor 24 also has diffusion layer regions (N+ diffusion layer regions, for instance) 27, 28 located in the p-type well region on the opposite sides of the gate electrode 26.

The field effect transistor 24 provides functions as a switching element for reading. The field effect transistor 24 is not limited to n- or p-type field effect transistors, and different switching elements such as diodes and bipolar transistors may be also employed.

There is also provided a first insulator film 41 that covers the field effect transistor 24. The first insulator film 41 has contacts (conductive plugs including a refractory metal such as tungsten, for instance) 29, 30 connected to the diffusion layer regions 27, 28. The first insulator film 41 also has thereon a sense line 15 connected to the contact 29, a landing pad (first landing pad) 31 connected to the contact 30 and others.

The first insulator film 41 also has thereon a second insulator film 42 that covers the sense line 15, the first landing pad 31 and others. The second insulator film 42 has a contact (conductive plug including a refractory metal such as tungsten, for instance) 32 connected to the first landing pad 31. The second insulator film 42 also has thereon a landing pad (second landing pad) 33 connected to the contact 32.

The second insulator film 42 also has thereon a third insulator film 43 that covers the second landing pad 33 and others. The third insulator film 43 has thereon a write word line 11 located so as pass above the second landing pad 33.

The write word line 11 has a flux concentrator 51 of the same configuration as previously described with reference to FIG. 6A so as to surround at least the opposite side faces of the write word line 11 and the opposite face thereof to a side facing a tunneling magneto resistance (which will be hereinafter referred to as a TMR) element 13. In addition, at least one side (or the opposite sides as shown in FIG. 6B) of the flux concentrator 51 on the side face of the write word line 11 projects from the write word line 11 toward the TMR element 13, as will be described later in detail.

In FIG. 6B, a side wall portion of the flux concentrator 51 projects toward the TMR element 13 so as to extend along the side face of the TMR element 13 through a fourth insulator film 44 and a part of a fifth insulator film 45. An end 51S of the side wall portion of the flux concentrator 51 is substantially as high as a storage layer 134 of the TMR element 13, for instance. In addition, a distance between the end 51S of the flux concentrator 51 and the TMR element 13 needs to be such a distance as to allow a galvano-magnetic flux having been concentrated on the end 51S of the flux concentrator 51 to efficiently reach the storage layer 134. The distance shall be preferably equal to or less than 200 nm, for instance.

Examples of high permeability materials used for the flux concentrator 51 include a soft magnetic material whose maximum permeability $\mu_m$ is equal to or more than 100, for instance. Specifically, an alloy containing nickel, iron and cobalt, an iron-aluminum (FeAl) alloy, a ferrite alloy and other soft magnetic materials may be used.

The third insulator film 43 also has thereon the fourth insulator film 44 that covers the write word line 11, the flux concentrator 51, the second landing pad 33 and others. The fourth insulator film 44 and the third insulator film 43 have a through hole 61 that extends to the second landing pad 33 through the write word line 11 and the flux concentrator 51.

The through hole 61 has therein a contact 63 through a side wall barrier film 52. The contact 63 is formed with a conductive plug including a refractory metal such as tungsten, for instance. Thus, the write word line 11 and the flux concentrator 51 are electrically insulated from the contact 63 with the side wall barrier film 62.

The fourth insulator film 44 also has thereon a barrier layer 130, which has on an upper surface thereof an anti-ferromagnetic layer 131 located above the write word line 11. The anti-ferromagnetic layer 131 has thereon a multi-layered structure composed of a fixed magnetization layer 132 including a ferromagnetic material, a tunnel barrier layer 133 and a storage layer 134 that yields a relatively easy spinning of magnetization. The multi-layered structure has thereon a cap layer 135. A multi-layered film ranging from the anti-ferromagnetic layer 131 to the cap layer 135 provides an information storage element (which will be hereinafter referred to as a TMR) element 13. Further, the cap layer 135 has thereon an electrode layer 136 connected to a bit line 12 forming a second interconnection.

The fourth insulator film 44 has also thereon a fifth insulator film 45 that covers the TMR element 13 and others. A surface of the fifth insulator film 45 is subjected to planarization, thereby allowing a surface of the electrode layer 136 to be exposed to the outside through the surface of the fifth insulator film 45. The fifth insulator film 45 has thereon a bit line 12 that is in contact with an upper surface of the electrode layer 136. The bit line 12 is located on the write word line 11 and crosses (or extends orthogonal to, for instance) the write word line 11 in a grade-separated manner with the TMR element 13 interposed therebetween.

The fixed magnetization layer 132 and the storage layer 134 of the TMR element 13 may be of a single-layer structure of a ferromagnetic layer. Alternatively, a multi-layered structure may be also employed, in which two or more ferromagnetic layers are stacked with a conductive layer including ruthenium, copper, chromium, gold and silver and the like interposed therebetween. Alternatively, a substrate of the anti-ferromagnetic layer 131 may be covered with a substrate conductive layer (not shown) that is to connect the anti-ferromagnetic layer 131 with a switching element connected to the TMR element in series. Alternatively, the anti-ferromagnetic layer 131 may have the function of the substrate conductive layer.

The components of the above magnetic memory device 3 are the same as the magnetic memory device 1 previously described with reference to FIG. 1, except for the flux concentrator 51.

Figure 7:
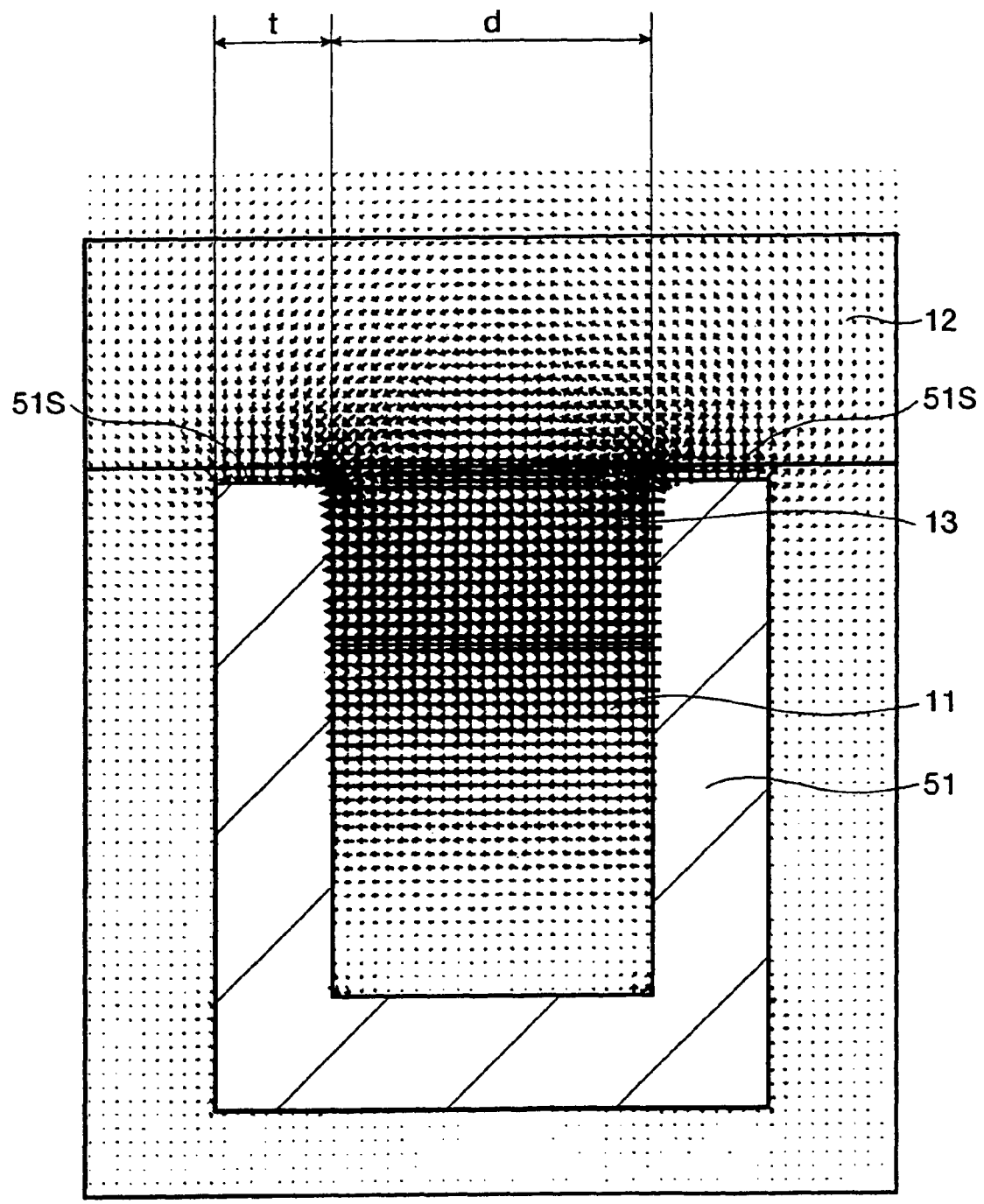
FIG. 7 is showing a cross-sectional view of a schematic configuration that illustrates a result of simulation on a distribution of a galvano-magnetic field generated from a write word line of the magnetic memory device according to the first preferred embodiment.

Results of measurement by simulation on a distribution of a galvano-magnetic field generated from the write word line 11 of the magnetic memory device 3 having the above configuration will be described next with reference to FIG. 7. In FIG. 7, there are shown the write word line 11, the bit line 12, the TMR element 13 and the flux concentrator 51 in a simplified form. In the simulation, it was assumed that the end 51S of the side wall portion of the flux concentrator 51 on the side face of the write word line 11 has a thickness of 0.21 $\mu$m, and an interval d of the end 51S between the opposite side faces of the write word line 11 is 0.59 $\mu$m. In FIG. 7, the galvano-magnetic field is indicated by arrows, each arrow has a length representing how intensive the galvano-magnetic field is, and a direction of each arrow represents a direction of the galvano-magnetic field.

As shown in FIG. 7, on the distribution of the galvano-magnetic field, the above magnetic memory device 3 proves to be effective in allowing the galvano-magnetic field generated from the write word line 11 to be concentrated on the storage layer 134 of the TMR element 13 (See FIGS. 6A and 6B) efficiently through a transfer to the flux concentrator 51 through the end 51S thereof.

Figure 8:
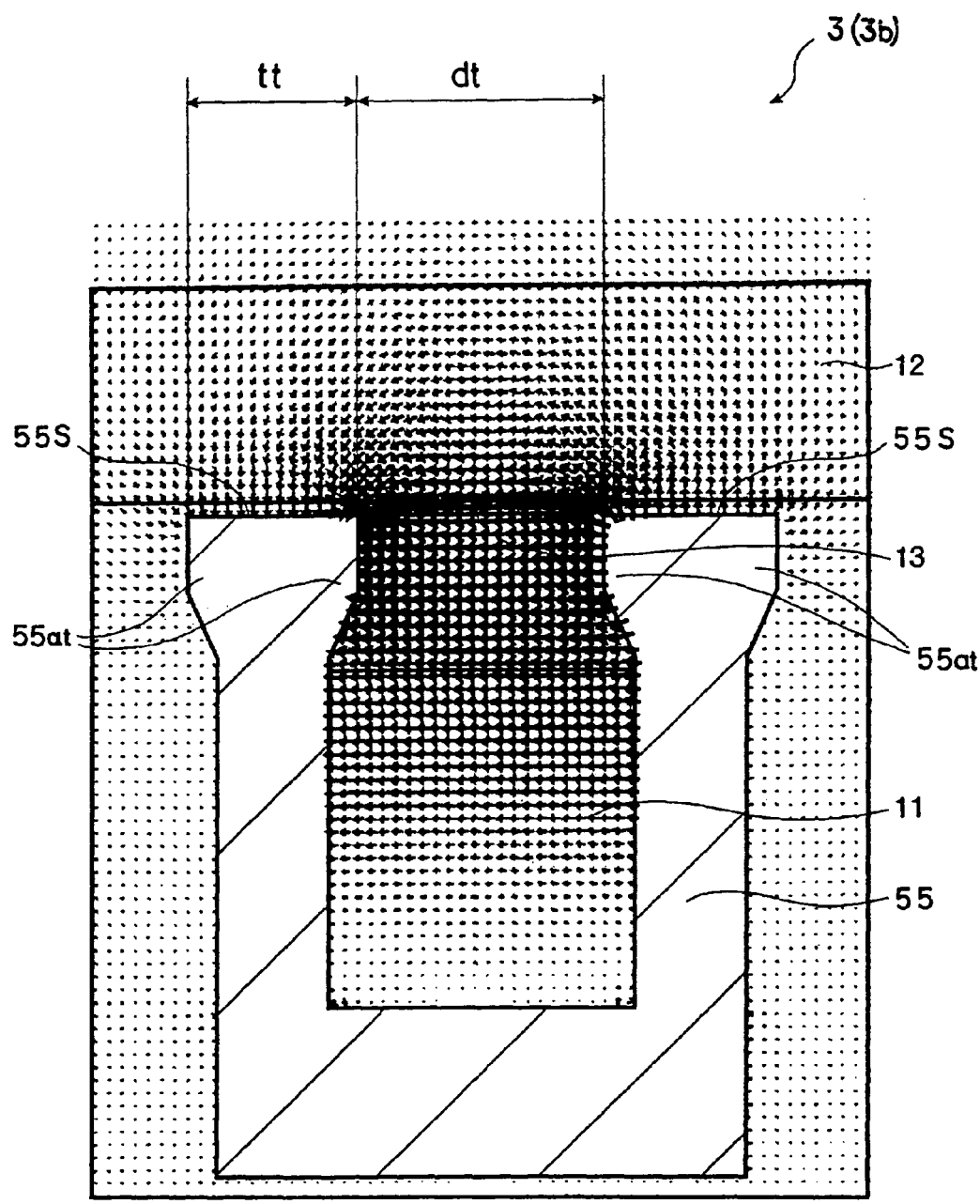
FIG. 8 is showing a cross-sectional view of a schematic configuration of a fourth preferred embodiment of the magnetic memory device according a preferred embodiment of the present invention, together with a result of simulation on a distribution of a galvano-magnetic field generated from a write word line of the magnetic memory device.

A fourth preferred embodiment of the magnetic memory device according to the present invention will be described next with reference to FIG. 8 showing a cross-sectional view of a schematic configuration of the fourth preferred embodiment. The magnetic memory device of the fourth preferred embodiment relates to a modification of the magnetic memory device 3 previously described with reference to FIGS. 6A and 6B, and is configured to allow a galvano-magnetic field generated from a write word line to be concentrated on a storage layer more efficiently. In FIG. 8, for purposes of simplification, there is shown no components such as an insulator film, a through hole, a side wall barrier film and a contact other than a relation among a write word line, a bit line, a TMR element and a flux concentrator. In FIG. 8, the galvano-magnetic field is indicated by arrows, each arrow has a length representing how intensive the galvano-magnetic field is, and a direction of each arrow represents a direction of the galvano-magnetic field.

As shown in FIG. 8, a magnetic memory device 3(3b) has the following configuration. Specifically, the magnetic memory device 3 has a write word line 11 and a bit line 12. The bit line 12 is located above the write word line 11 and crosses the write word line 11 in a grade-separated manner. The magnetic memory device 3 also has a TMR element 13 located above the write word line 11 within a region in which the write word line 11 and the bit line 12 cross. An upper surface of the TMR element 13 is connected to the bit line 12. The write word line 11 has a flux concentrator 51 including a high permeability film so as to surround the opposite side faces of the write word line 11 and an opposite face of the write word line 11 to a side facing the TMR element 13. In addition, at least one side of the flux concentrator 55 on the side face of the write word line 11 projects from the write word line 11 toward the TMR element 13. The flux concentrator 51 also has an end 55S having an expanded portion 55 at extending in a thickness direction of the end 55S. In the fourth preferred embodiment, it was assumed that the end 55S including the expanded portion 55 at has a thickness of 0.328 µm, and an interval dt between inner side parts of the expanded portion 55 at of the end 55S is 0.472 µm, for instance.

In the configuration shown in FIG. 8, the flux concentrator 55 has the expanded portion 55 at on the opposite sides of the end 55S. Alternatively, the flux concentrator 55 may be a flux concentrator having an expanded portion on one side of the end 55S. As shown in FIG. 8, the side wall portion of the flux concentrator 55 projects from the opposite side faces of the write word line 11 toward the TMR element 13. Alternatively, the flux concentrator 55 may be a flux concentrator having a side wall portion projecting from one side face of the write word line 11.

A basic configuration of the magnetic memory device of the fourth preferred embodiment may be replaced with that of the magnetic memory device of the above third preferred embodiment, and is therefore acceptable to the configuration of the magnetic memory device previously described with reference to FIG. 6B.

The flux concentrator 55 having the configuration in the fourth preferred embodiment may reduce a leakage of the galvano-magnetic flux as compared with the flux concentrator 51 of the above third preferred embodiment, thereby allowing the galvano-magnetic field generated from the write word line 11 to be concentrated on the storage layer 134 of the TMR element 13 more efficiently as compared with the flux concentrator 51 of the above third preferred embodiment.

Figure 9:
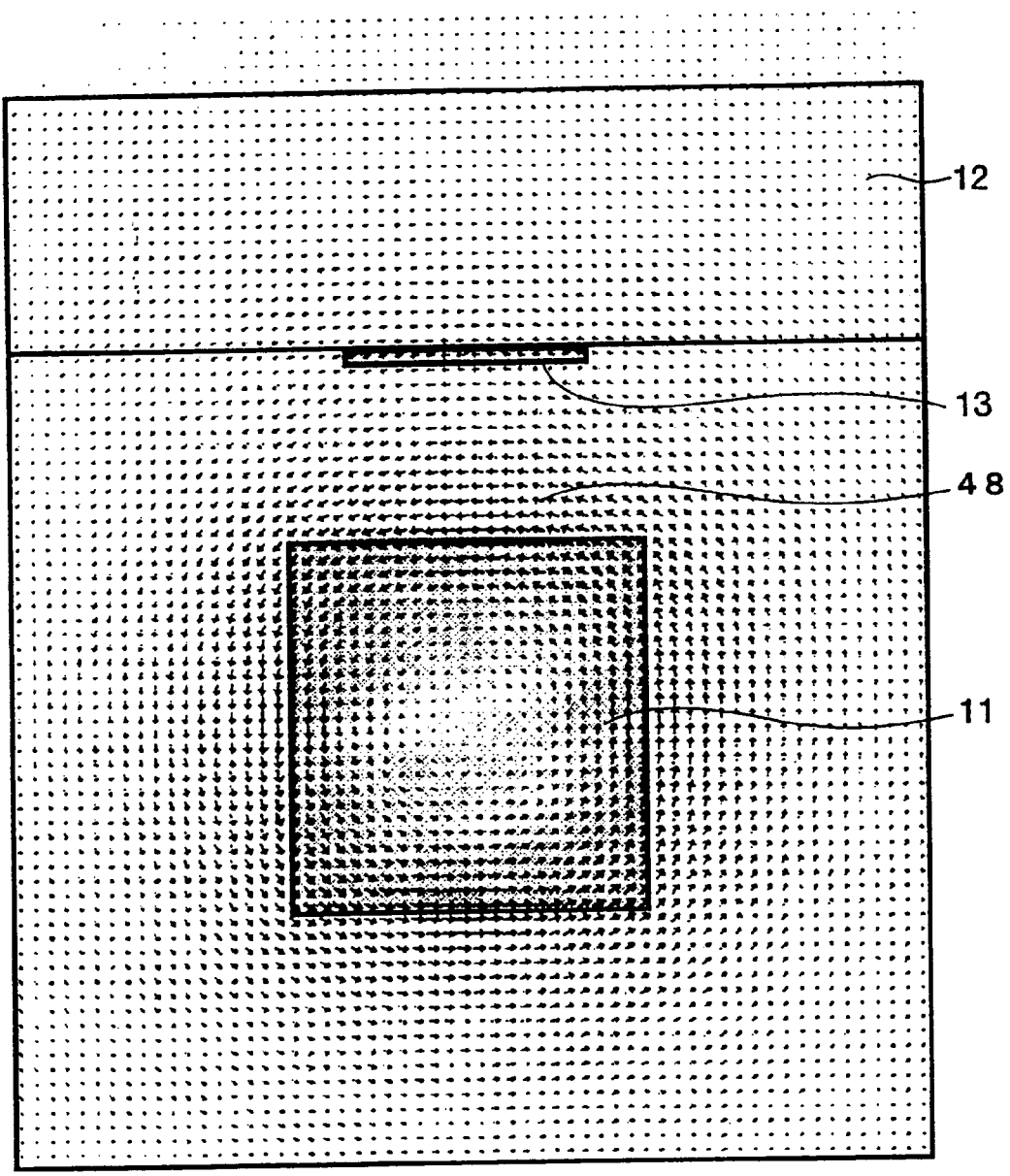
FIG. 9 is showing a cross-sectional view of a schematic configuration of a write word line and its peripheral structure in a MRAM cell of a conventional structure, together with a result of simulation on a distribution of a galvano-magnetic field around the write word line according to a comparative example 1.

A galvano-magnetic field distribution of a write word line of a MRAM cell of a conventional structure and that of a periphery of the write word line in a configuration having a through hole extending through the write word line will be described next with reference to FIG. 9 as a comparative example 1. In FIG. 9, the galvano-magnetic field is indicated by arrows, each arrow has a length representing how intensive the galvano-magnetic field is, and a direction of each arrow represents a direction of the galvano-magnetic field. In FIG. 9, for simplification purposes, there is shown no components such as an insulator film, a through hole, a side wall barrier film and a contact other than a relation among the write word line, a bit line, a TMR element and a flux concentrator.

As shown in FIG. 9, a magnetic memory device of the comparative example 1 has a write word line 11 and a bit line 12. The bit line 12 is located above the write word line 11 and crosses the write word line 11 in a grade-separated manner. This magnetic memory device also has a TMR element 13 having a size of 0.4 µm×0.8 µm, for instance, within a region in which the write word line 11 and the bit line 12 cross. Specifically, the TMR element 13 is located on the write word line 11 through an insulator film 48 having a thickness of 300 nm, and an upper surface of the TMR element 13 is connected to the bit line 12.

The galvano-magnetic field generated by applying a current to the write word line 11 was measured by simulation. FIG. 9 shows a result with the galvano-magnetic field distributed so as to surround the write word line 11. Thus, the comparative example 1 proves to be ineffective in allowing the galvano-magnetic field generated from the write word line 11 to be concentrated on the TMR element 13, unlike the above preferred embodiment having the flux concentrator 51 or 55. In addition, the galvano-magnetic field induced by the current applied to the write word line 11 rapidly decreases with increasing distance between the TMR element 13 and the write word line 11.

Figure 10:
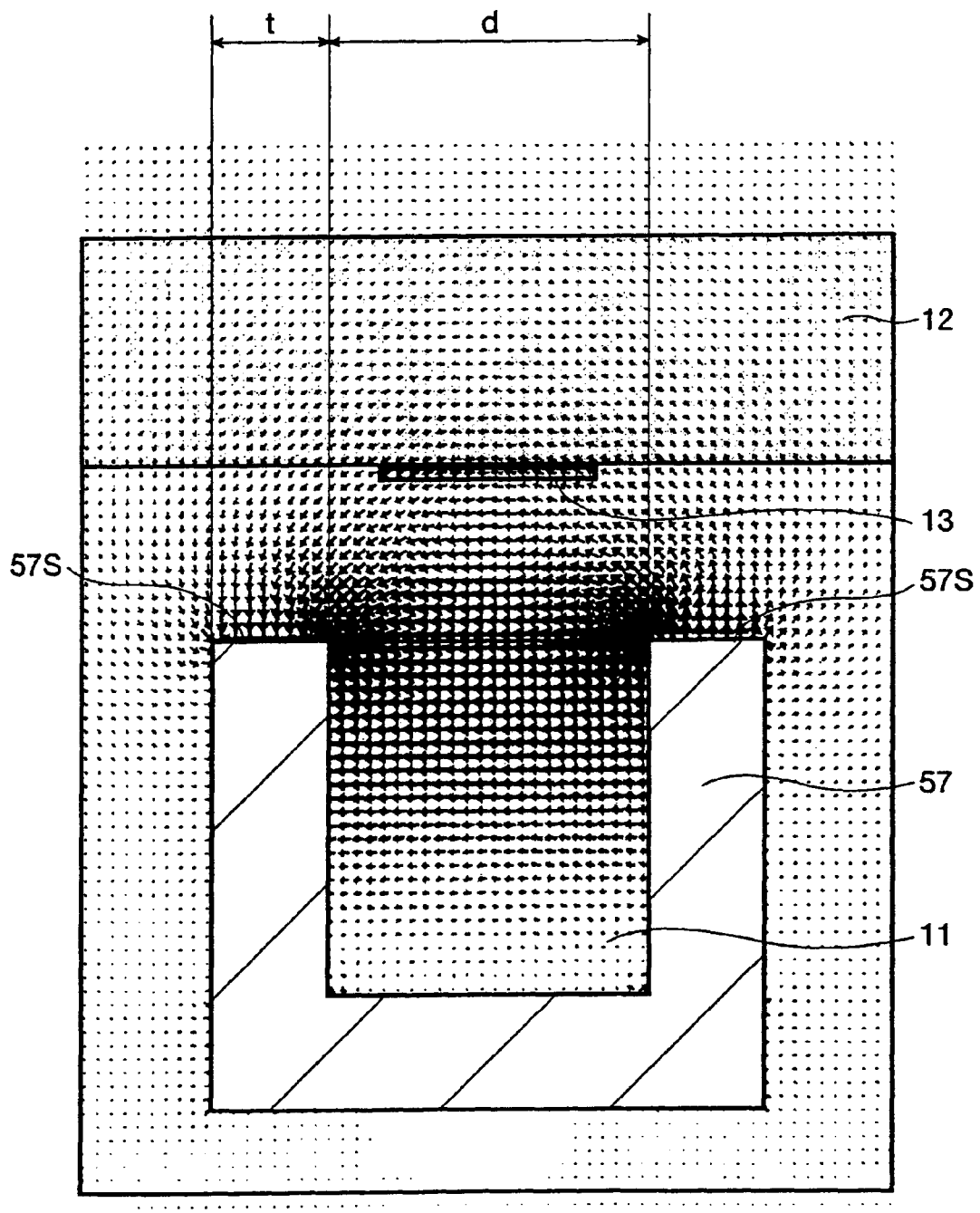
FIG. 10 is showing a cross-sectional view of a schematic configuration of a write word line and its peripheral structure in a MRAM cell of a conventional structure and a result of simulation on a distribution of a galvano-magnetic filed around the write word line according to a comparative example 2.

A galvano-magnetic field distribution of a write word line of the same MRAM cell as having been described in a specification of U.S. Pat. No. 5,940,319 and that of a periphery of the write word line in a configuration having a through hole extending through the write word line will be described next with reference to FIG. 10, as a comparative example 2. In FIG. 10, the galvano-magnetic field is indicated by arrows, each arrow has a length representing how intensive the galvano-magnetic field is, and a direction of each arrow represents a direction of the galvano-magnetic field. In FIG. 10, for simplification purposes, there is shown no components such as an insulator film, a through hole, a side wall barrier film and a contact other than a relation among a write word line, a TMR element and a flux concentrator.

As shown in FIG. 10, a magnetic memory device of the comparative example 2 has a write word line 11 and a bit line 12. The bit line 12 is located above the write word line 11 and crosses the write word line 11 in a grade-separated manner. This magnetic memory device also has a TMR element 13 located above the write word line 11 within a region in which the write word line 11 and the bit line 12 cross, and an upper surface of the TMR element 13 is connected to the bit line 12. The write word line 11 has a flux concentrator 57 formed with a soft magnetic film so as to surround the write word line 11, except for one side facing the TMR element 13. An end 57S of a side wall portion of the flux concentrator 57 on the side face of the write word line 11 is as high as a TMR element 13-side face of the write word line 11. In other words, the side wall portion of the flux concentrator 57 is not projecting from the write word line 11 toward the TMR element 13.

The galvano-magnetic field generated from the write word line 11 was measured by simulation with respect to the comparative example 2 having the above configuration. In the simulation of the comparative example 2, it was assumed that the end 57S of the side wall portion of the flux concentrator 57 on the side face of the write word line 11 has a thickness t of 0.21 $\mu$m, and an interval d of the end 57S of the flux concentrator 57 is 0.59 $\mu$m.

The result was that the galvano-magnetic field generated from the write word line 11 is transferred with the flux concentrator 57 to the end 57S thereof, and is peaked at the end 57S of the flux concentrator 57 between the opposite side faces of the write word line 11. However, it was proved that no satisfactory transfer of the galvano-magnetic flux to the TMR element 13 occurs because of a large distance between the end 57S of the flux concentrator 57 and the TMR element 13.

Figure 11:
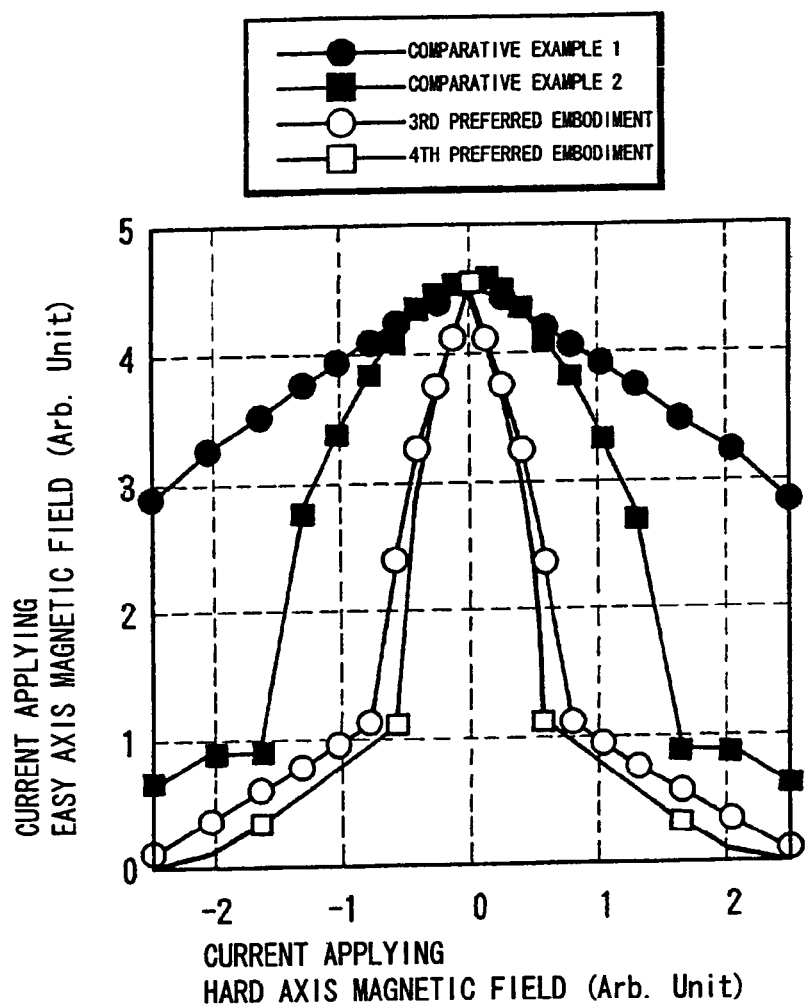
FIG. 11 shows how a bit line current required for magnetization reversal in an array in a parallel direction to a magnetization orientation is dependent on a write word line current as to the magnetic memory device according to the first and second preferred embodiments and the comparative examples 1 and 2, specifically, a relation between a current that applies an easy axis magnetic field and a current that applies a hard axis magnetic field.

The way a bit line current required for magnetization reversal in an array in a parallel direction to a magnetization orientation is dependent on a write word line current will be described next with reference to FIG. 11, as to the third and fourth preferred embodiments and the comparative examples 1 and 2. FIG. 11 shows a relation between a current that applies an easy axis magnetic field and a current that applies a hard axis magnetic field.

As shown in FIG. 11, the third and fourth preferred embodiments of the present invention prove to be effective in largely improving the relation between the current that applies the easy axis magnetic field and the current that applies the hard axis magnetic field as compared with the comparative examples 1 and 2. Specifically, according to the third and fourth preferred embodiments, the current that applies the easy axis magnetic field decreases with increasing absolute value of the current that applies the hard axis magnetic field as compared with the comparative examples 1 and 2.

Figure 12:
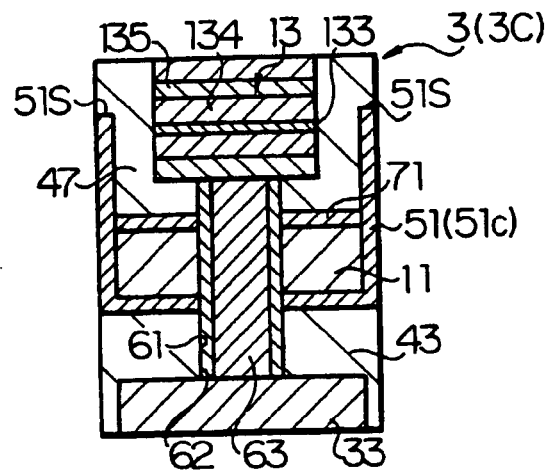
FIG. 12 is showing a cross-sectional view of a schematic configuration of a magnetic memory device according to a fifth preferred embodiment of the present invention.

A fifth preferred embodiment of the magnetic memory device according to the present invention will be described next with reference of FIG. 12 showing a cross-sectional view of a schematic configuration of the fifth preferred embodiment. In FIG. 12, for simplification purposes, there is shown no components other than essential components such as a write word line, a TMR element, a flux concentrator, a landing pad, a through hole, a contact and a part of insulator films according to the fifth preferred embodiment of the magnetic memory device. In addition, similar components to those of the magnetic memory device 3 of the above third preferred embodiment are designated by similar reference numerals.

As shown in FIG. 12, a magnetic memory device 3 (3c) of the fifth preferred embodiment relates to a modification of the magnetic memory device having the flux concentrator 51 previously described with reference to FIG. 6A, and further has a high permeability film 71 on an opposite face of a write word line 11 to a side facing a TMR element 13. Specifically, a flux concentrator of the magnetic memory device 3 of the fifth preferred embodiment is a flux concentrator 51(51c) configured inclusively of the high permeability film 71. In addition, at least one side of the flux concentrator 51 on the side face of the write word line 11 projects from the high permeability film 71 on a TMR element 13-side face of the write word line 11 toward the TMR element 13 in a similar manner as the magnetic memory device 3a in the above third preferred embodiment. Specifically, an end 51S of a side wall portion of the flux concentrator 51 may be as high as an interface between a storage layer 134 and a cap layer 135 of the TMR element 13 through the side face of the TMR element 13 and an insulator film 47, preferably within a height range of an interface between a tunnel barrier layer 133 and the storage layer 134 to an interface between the storage layer 134 and the cap layer 135, for instance.

In addition, a distance between the end 51S of the flux concentrator 51 and the TMR element 13 needs to be such a distance as to allow a galvano-magnetic flux having been concentrated on the end 51S of the flux concentrator 51 to reach the storage layer 134 efficiently. For instance, the distance shall be equal to or less than 200 nm, preferably, equal to or less than 100 nm.

There is also provided a through hole 61 that extends through the insulator film 47, the high permeability film 71, the write word line 11, the flux concentrator 51 and a third insulator film 43 so as to establish a connection between the TMR element 13 and a landing pad 33. The through hole 61 has on a side wall thereof a side wall barrier film 62. The through hole 61 also has therein a contact 63 through the side wall barrier film 62. The contact 63 is to establish a connection between an anti-ferromagnetic layer 131 (or barrier metal layer (not shown)) of the TMR element 13 and the landing pad 33.

A basic configuration of the magnetic memory device of the fifth preferred embodiment may be replaced with that of the magnetic memory device of the above third preferred embodiment and is therefore acceptable to the configuration of the magnetic memory device previously described with reference to FIG. 6B.

Figure 13:
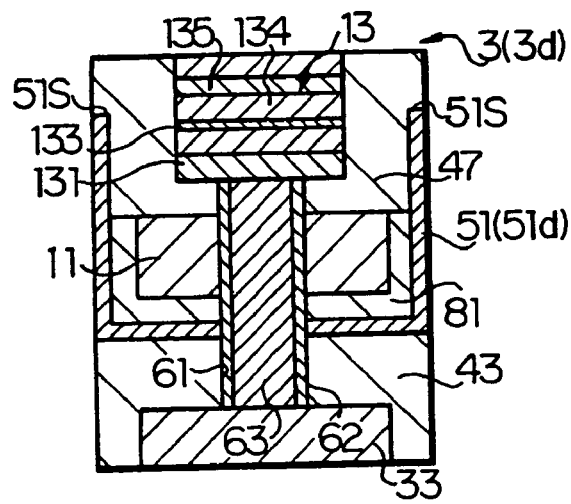
FIG. 13 is showing a cross-sectional view of a schematic configuration of a magnetic memory device according to a sixth preferred embodiment of the present invention.

A sixth preferred embodiment of the magnetic memory device of the present invention will be described next with reference to FIG. 13 showing a cross-sectional view of a schematic configuration of the sixth preferred embodiment. In FIG. 13, for simplification purposes, there as shown no components other than essential components such as a write word line, a TMR element, a flux concentrator, a landing pad, a through hole, a contact and a part of insulator films according to the sixth preferred embodiment of the magnetic memory device. In addition, similar components to those of the magnetic memory device 3 of the above third preferred embodiment are designated by similar reference numerals.

As shown in FIG. 13, a magnetic memory device 3 (3d) of the sixth preferred embodiment relates to a modification of the magnetic memory device 3(c) previously described with reference to FIG. 6A, and further has an insulator film 81 between the bottom and side faces of a write word line 11 and a flux concentrator 51 (51d) including a high permeability film. In the magnetic memory device 3 of the sixth preferred embodiment, one side (or the opposite sides as shown in FIG. 13) of the flux concentrator 51 on the side face of the write word line 11 is also projecting from the write word line 11 toward the TMR element 13. Specifically, an end 51S of a side wall portion of the flux concentrator 51 may be as high as an interface between a storage layer 134 and a cap layer 135 of the TMR element 13, preferably within a height range of an interface between a tunnel barrier film 133 and the storage layer 134 to an interface between the storage layer 134 and the cap layer 135, for instance.

In addition, a distance between the end 51S of the flux concentrator 51 and the TMR element 13 needs to be such a distance as to allow a galvano-magnetic flux having been concentrated on the end 51S of the flux concentrator to reach the storage layer 134 efficiently. For instance, the distance shall be equal to or less than 200 nm, preferably, equal to or less than 100 nm.

There is also provided a through hole 61 that extends through the insulator film 47, the write word line 11, the insulator film 81, the flux concentrator 61 and a third insulator film 43 so as to establish a connection between the TMR element 13 and a landing pad 33. The through hole 61 has on a side wall thereof a side wall barrier film 62. The through hole 61 also has therein a contact 63 through the side wall barrier film 62. The contact 63 is to establish a connection between an anti-ferromagnetic layer 131 (or barrier metal layer (not shown)) and the landing pad 33.

A basic configuration of the magnetic memory device of the sixth preferred embodiment may be replaced with that of the magnetic memory device of the above third preferred embodiment and is therefore acceptable to the configuration of the magnetic memory device previously described with reference to FIG. 6B.

Figure 14:
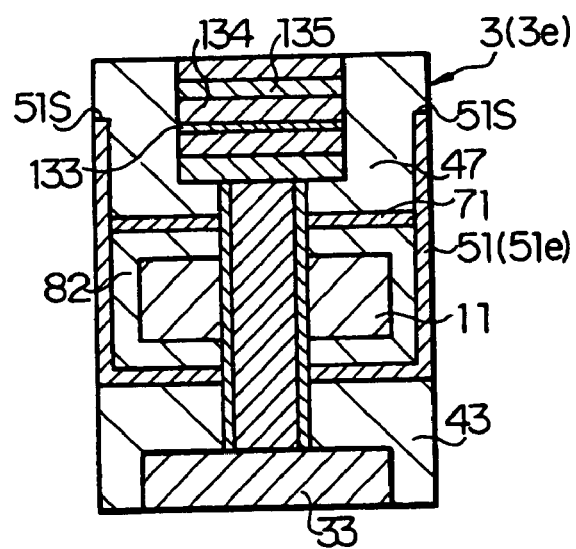
FIG. 14 is showing a cross-sectional view of a schematic configuration of a a magnetic memory device according to a seventh preferred embodiment of the present invention.

A seventh preferred embodiment of the magnetic memory device of the present invention will be described next with reference to FIG. 14 showing a cross-sectional view of a schematic configuration of the seventh preferred embodiment. In FIG. 14, for simplification purposes, there is shown no components other than essential components such as a write word line, a TMR element, a flux concentrator, a landing pad, a through hole, a contact and a part of insulator films according to the seventh preferred embodiment of the magnetic memory device. In addition, similar components to those of the magnetic memory device 3 of the above third preferred embodiment are designated by similar reference numerals.

As shown in FIG. 14, a magnetic memory device 3 (3a) of the seventh preferred embodiment relates to a modification of the magnetic memory device 3 (3d) previously described with reference to FIG. 13, and further has an insulator film 82 around the write word line 11 such that a flux concentrator 51 (51e) of a high permeability film is provided through the insulator film 82. In the magnetic memory device 3 of the seventh preferred embodiment in FIG. 14, at least one side (or the opposite sides as shown in FIG. 14) of the flux concentrator 51 on the side face of the write word line 11 is also projecting from the high permeability film 71 on the write word line 11 through the insulator film 82 toward the TMR element 13. Specifically, an end 51S of a side wall portion of the flux concentrator 51 may be as high as an interface between a storage layer 134 and a cap layer 135 of the TMR element 13 through the side face of the TMR element 13 and an insulator film 47, preferably within a height range of an interface between a tunnel barrier film 133 and the storage layer 134 to an interface between the storage layer 134 and the cap layer 135, for instance.

In addition, a distance between the end 51S of the flux concentrator 51 and the TMR element 13 needs to be such a distance as to allow a galvano-magnetic flux having been concentrated on the end 51S of the flux concentrator 51 to efficiently reach the storage layer 134. For instance, the distance shall be equal to or less than 200 nm, preferably, equal to or less than 100 nm.

In other words, the flux concentrator 51e of the high permeability film in the seventh preferred embodiment relates to a modification of the flux concentrator 51d in the sixth preferred embodiment previously described with reference to FIG. 13, and further has the high permeability film on a TMR element 13-side face of the write word line 11 through an insulator film. Specifically, the flux concentrator 51e of the high permeability film is a flux concentrator that is surrounding the write word line 11 through the insulator film 82. In the magnetic memory device 3 of the seventh preferred embodiment, at least one side (or the opposite sides as shown in FIG. 14) of the flux concentrator 51 on the side face of the write word line 11 is also projecting from the write word line 11 toward the TMR element 13.

There is also provided a through hole 61 that extends through the insulator film 47, the high permeability film 71, the insulator film 82 on one side, the write word line 11, the insulator film 82 on the other side, the flux concentrator 51 and a third insulator film 43 so as to establish a connection between the TMR element 13 and a landing pad 33. The through hole 61 has on a side wall thereof a side wall barrier film 62. The through hole 61 also has therein a contact 63 through the side wall barrier film 62. The contact 63 is to establish a connection between an anti-ferromagnetic layer 131 (or barrier metal layer (not shown)) of the TMR element 13 and the landing pad 33.

A basic configuration of the magnetic memory device of the seventh preferred embodiment may be replaced with that of the magnetic memory device of the above third preferred embodiment and is therefore acceptable to the configuration of the magnetic memory device previously described with reference to FIG. 6B.

In the above magnetic memory device 3 (3a to 3e), at least the opposite side faces of the write word line 11 and the opposite face of the write word line 11 to the side facing the TMR element 13 are surrounded with the flux concentrator 51 including the high permeability film. In addition, at least one side of the flux concentrator 51 of the high permeability film on the side face of the write word line 11 projects from the write word line 11 toward the TMR element 13 up to an extent that the end 51S of a side wall portion of the flux concentrator 51 is as high as the storage layer 134. Thus, the galvano-magnetic field generated from the write word line 11 is transferred up to the end 51S of the flux concentrator 51 and is peaked at the end 51S between the opposite side faces of the write word line 11. Accordingly, the galvano-magnetic field may be concentrated on the storage layer 134 of the TMR element 13 efficiently. Thus, it is possible to reduce current required for writing, thus reducing current consumption and also increasing lifetime of the write word line 11 against electromigration. In addition, there is less drive current required, which reduces an area of a current drive circuit, thereby providing an increased integration level. Further, as leakage of magnetic field is also reduced, interference with adjacent cells is reduced.

Figure 15:
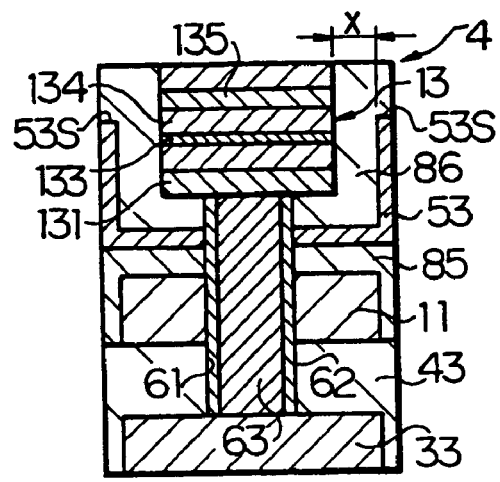
FIG. 15 is showing a cross-sectional view of a schematic configuration of magnetic memory device according to an eighth preferred embodiment of the present invention.

An eighth preferred embodiment of the magnetic memory device of the present invention will be described next with reference to FIG. 15 showing a cross-sectional view of a schematic configuration of the eighth preferred embodiment. In FIG. 15, for purposes of simplification, there is shown no components other than essential components such as a write word line, a TMR element, a flux concentrator, a landing pad, a through hole, a contact and a part of insulator films according to the eighth preferred embodiment of the magnetic memory device. In addition, similar components to those of the magnetic memory device 3 of the above third preferred embodiment are designated by similar reference numerals.

As shown in FIG. 15, a magnetic memory device 4 has a flux concentrator 53 of a high permeability film on a write word line 11 through an insulator film 85, and a TMR element 13 on the flux concentrator 53 through an insulator film 86.

A side wall portion of the flux concentrator 53 extends toward a side wall of the TMR element 13 through the insulator film 86. An end 53S of the side wall portion of the flux concentrator 53 may be as high as an interface between a storage layer 134 and a cap layer 135 of the TMR element 13, preferably within a height range of an interface between a tunnel barrier film 133 and the storage layer 134 to an interface between the storage layer 134 and the cap layer 133, for instance. In addition, a distance x between the end 53S of the flux concentrator 53 and the TMR element 13 needs to be such a distance as to allow a galvano-magnetic flux having been concentrated on the end 53S of the flux concentrator 53 to efficiently reach the storage layer 134. For instance, the distance x shall be equal to or less than 200 nm, preferably, equal to or less than 100 nm.

Examples of high permeability materials used for the flux concentrator 53 include a soft magnetic material whose maximum permeability $\mu_m$ is equal to or more than 100, for instance. Specifically, an alloy containing nickel, iron and cobalt, an iron-aluminum (FeAl) alloy, a ferrite alloy or other soft magnetic materials may be used.

There is also provided a through hole 61 that extends through the insulator film 86, the flux concentrator 53, the insulator film 85, the write word line 11 and a third insulator film 43 so as to establish a connection between the TMR element 13 and a landing pad 33. The through hole 61 has on a side wall thereof a side wall barrier film 62. The through hole 61 also has therein a contact 63 through the side wall barrier film 62. The contact 63 is to establish a connection between an anti-ferromagnetic layer 131 (or barrier layer (not shown)) of the TMR element 13 and the landing pad 33.

Other components of the magnetic memory device 4 are the same as previously described with reference to FIG. 6. It does not matter if the magnetic memory device 4 has no flux concentrator 51 previously described with reference to FIG. 6. However, the flux concentrator 51 is useful in allowing a galvano-magnetic field to be concentrated on the TMR element 13 more efficiently, so that the magnetic memory device 4 having the flux concentrator 51 together with the flux concentrator 53 is preferably employed. A configuration of a magnetic memory device having both the flux concentrators 51 and 53 will be described later in detail. Alternatively, in the magnetic memory device as previously described with reference to FIG. 15, the flux concentrator 53 may be in contact with an upper surface of the write word line 11.

The above magnetic memory device 4 has the flux concentrator 53 of the high permeability film so as to be located between the write word line 11 and the TMR element 13 while extending along the side face of the TMR element 13 through the insulator film 85. Thus, the galvano-magnetic field generated from the write word line 11 may be efficiently concentrated on the storage layer 134 of the TMR element 13 with the flux concentrator 53 on the lower side of the side face of the TMR element 13. Thus, it is possible to reduce current required for writing, thus reducing current consumption and also increasing lifetime of the write word line 11 against electromigration. In addition, there is less drive current required, which reduces an area of a current drive circuit, thereby providing an increased integration level. Furthermore, as leakage of magnetic field is also reduced, interference with adjacent cells is reduced.

A basic configuration of the magnetic memory device of the eighth preferred embodiment may be replaced with that of the magnetic memory device of the above third preferred embodiment and is therefore acceptable to the configuration of the magnetic memory device previously described with reference to FIG. 6B.

Figure 16:
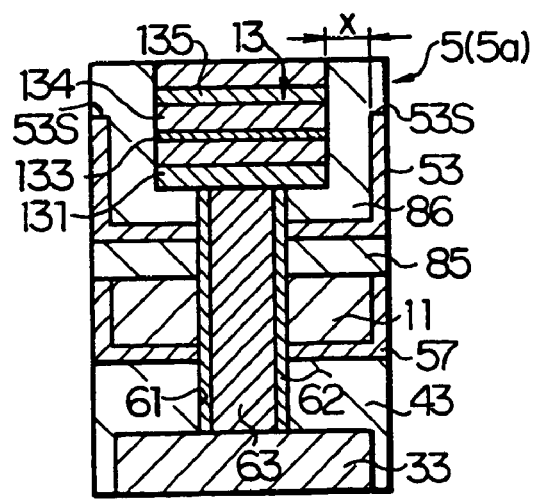
FIG. 16 is showing a cross-sectional view of a schematic configuration of a magnetic memory device according to a ninth preferred embodiment of the present invention.

A ninth preferred embodiment of the magnetic memory device according to the present invention will be described next with reference to FIG. 16 showing a cross-sectional view of a schematic configuration of the ninth preferred embodiment. In FIG. 16, for simplification purposes, there is shown no components other than essential components such as a write word line, a TMR element, first and second flux concentrators, a landing pad, a through hole, a contact and a part of insulator films according to the ninth preferred embodiment of the magnetic memory device. In addition, similar components to those of the magnetic memory device 3 of the above third preferred embodiment are designated by similar reference numerals.

A basic configuration of a magnetic memory device 5(5a) of the ninth preferred embodiment relates to a combination of the configuration shown in FIG. 10 with that shown in FIG. 15. Specifically, as shown in FIG. 16, the magnetic memory device 5(5a) of the ninth preferred embodiment has a flux concentrator (first flux concentrator) 57 of a high permeability film so as to surround the opposite side faces of a write word line 11 and an opposite face of the write word line 11 to a side facing a TMR element 13 provided on the write word line 11 through insulator films 85, 86. A side wall portion (portion along a side wall of the write word line 11) of the flux concentrator 57 extends up to a level as high as an upper face (TMR element 13-side face) of the write word line 11.

The magnetic memory device 5 of the ninth preferred embodiment further has the same flux concentrator (second flux concentrator) 53 as previously described with reference to FIG. 15 so as to be located between the write word line 11 and the TMR element 13. A side wall portion of the flux concentrator 53 on the opposite sides of the TMR element 13 extends up to the vicinity of the side wall of the TMR element 13 through the insulator film 86. An end 53S of the side wall portion of the flux concentrator 53 may be as high as an interface between a storage layer 134 and a cap layer 133 of the TMR element 13, preferably within a height range of an interface between a tunnel barrier film 133 and the storage layer 134 to an interface between the storage layer 134 and the cap layer 133, for instance. In addition, a distance x between the end 53S of the flux concentrator 53 and the TMR element 13 needs to be such a distance as to allow a galvano-magnetic flux having been concentrated on the end 53S of the flux concentrator 53 to reach efficiently the storage layer 134 efficiently. The distance x shall be equal to or less than 200 nm, preferably, equal to or less than 100 nm, for instance.

Examples of high permeability materials used for the flux concentrators 53, 57 include a soft magnetic material whose maximum permeability $\mu m$ is equal to or more than 100, for instance. Specifically, an alloy containing nickel, iron and cobalt, an iron-aluminum (FeAl) alloy, a ferrite alloy or other soft magnetic materials may be used.

There is also provided a through hole 61 that extends through the insulator film 86, the flux concentrator 53, the insulator film 85, the write word line 11, the flux concentrator 57 and a third insulator film 43 so as to establish a connection between the TMR element 13 and a landing pad 33. The through hole 61 has on a side wall thereof a side wall barrier film 62. The through hole 61 also has therein a contact 63 through the side wall barrier film 62. The contact 63 is to establish a connection between an anti-ferromagnetic layer (or barrier metal layer (not shown)) of the TMR element 13 and the landing pad 33.

Figure 17:
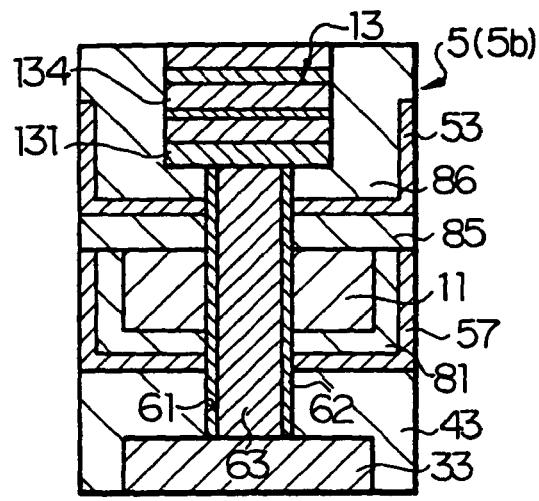
FIG. 17 is showing a cross-sectional view of a schematic configuration of a magnetic memory device according to a tenth preferred embodiment of the present invention.

A tenth preferred embodiment of the magnetic memory device according to the present invention will be described next with reference to FIG. 17 showing a cross-sectional view of a schematic configuration of the tenth preferred embodiment. In FIG. 17, for simplification purposes, there is shown no components other than essential components such as a write word line, a TMR element, first and second flux concentrators, a landing pad, a through hole, a contact and a part of insulator films according to the tenth preferred embodiment of the magnetic memory device. In addition, similar components to those of the magnetic memory device 3 of the above third preferred embodiment are designated by similar reference numerals.

As shown in FIG. 17, a magnetic memory device 5(5*b*) of the tenth preferred embodiment relates to a modification of the magnetic memory device 5*a* previously described with reference to FIG. 16, and further has an insulator film 81 between a flux concentrator (first flux concentrator) 57 and a write word line 11. Other configurations of the magnetic memory device 5 of the tenth preferred embodiment are similar to as previously described with reference to FIG. 16.

Thus, a through hole 61 that is to establish a connection between a TMR element 13 and a landing pad 33 is provided so as to extend through an insulator film 86, a flux concentrator 53, an insulator film 85, the write word line 11, the insulator film 81, the flux concentrator 57 and a third insulator film 43. The through hole 61 has on a side wall thereof a side wall barrier film 62. The through hole 61 also has therein a contact 63 through the side wall barrier film 61. The contact 63 is to establish a connection between an anti-ferromagnetic layer 131 (or barrier metal layer (not shown)) of the TMR element 13 and the landing pad 33.

Figure 18:
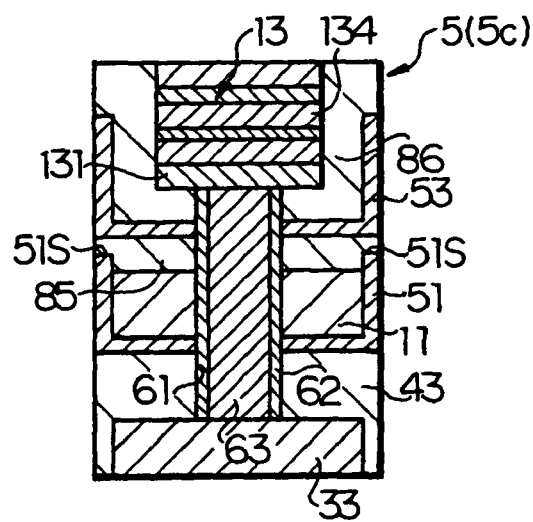
FIG. 18 is showing a cross-sectional view of a schematic configuration of a magnetic memory device according to an eleventh preferred embodiment of the magnetic memory device.

An eleventh preferred embodiment of the magnetic memory device according to the present invention will be described next with reference to FIG. 18 showing a cross-sectional view of a schematic configuration of the eleventh preferred embodiment. In FIG. 18, for simplification purposes, there are shown no components other than essential components such as a write word line, a TMR element, first and second flux concentrators, a landing pad, a through hole, a contact and a part of insulator films according to the eleventh preferred embodiment of the magnetic memory device. In addition, similar components to those of the magnetic memory device 3 of the above third preferred embodiment are designated by similar reference numerals.

As shown in FIG. 18, a magnetic memory device 5 (5*c*) of the eleventh preferred embodiment relates to a magnetic memory device having the same flux concentrator (first flux concentrator) 51 as previously described with reference to FIG. 6A so as to surround a bottom side and the opposite side faces of the write word line 11, together with the same flux concentrator (second flux concentrator) 53 as previously described with reference to FIG. 15 so as to be located between the write word line 11 and the TMR element 13. The flux concentrator 53 and an end 51S of a side wall portion of the flux concentrator 51 are spaced apart through an insulator film 85.

Thus, a through hole 61 that is to establish a connection between the TMR element 13 and a landing pad 33 is provided so as to extend through an insulator film 86, the flux concentrator 53, the insulator film 85, the write word line 11, the flux concentrator 51 and a third insulator film 43. The through hole 51 has on a side wall thereof a side wall barrier film 62. The through hole 61 also has therein a contact 63 through the side wall barrier film 62. The contact 63 is to establish a connection between an anti-ferromagnetic layer 131 (or barrier metal layer (not shown)) of the TMR element 13 and the landing pad 33.

Alternatively, it does not matter if the end 51S of a side wall portion of the flux concentrator 51 is in contact with the flux concentrator 53, although not shown.

Figure 19:
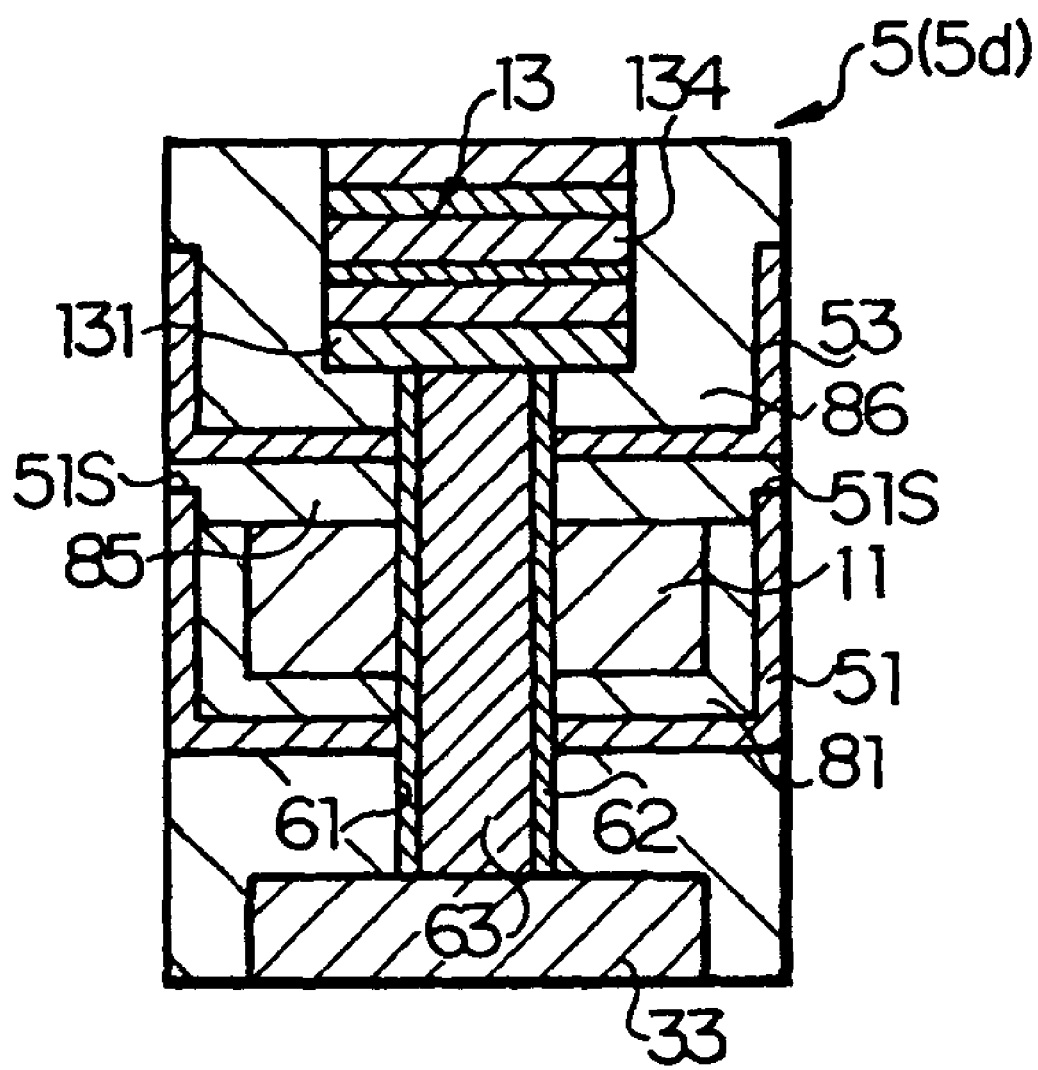
FIG. 19 is showing a cross-sectional view of a schematic configuration of a magnetic memory device according to a twelfth preferred embodiment of the magnetic memory device.

A twelfth preferred embodiment of the magnetic memory device according to the present invention will be described next with reference to FIG. 19 showing a cross-sectional view of a schematic configuration thereof. In FIG. 19, for simplification purposes, there is shown no components other than essential components such as a write word line, a TMR element, first and second flux concentrators, a landing pad, a through hole, a contact and a part of insulator films according to the twelfth preferred embodiment of the magnetic memory device. In addition, similar components to those of the magnetic memory device 3 of the above third preferred embodiment are designated by similar reference numerals.

As shown in FIG. 19, a magnetic memory device 5 (5*d*) of the twelfth preferred embodiment relates to a magnetic memory device having the same flux concentrator (first flux concentrator) 51 as previously described with reference to FIG. 13 so as to surround a bottom side and the opposite side faces of a write word line 11 through an insulator film 81, together with the same flux concentrator (second flux concentrator) 53 as previously described with reference to FIG. 15 so as to be located between the write word line 11 and a TMR element 13. The flux concentrator 53 and an end 51S of a side wall portion of the flux concentrator 51 are spaced apart through an insulator film 85.

Thus, a through hole 61 that is to establish a connection between the TMR element 13 and a landing pad 33 is provided so as to extend through an insulator film 86, the flux concentrator 53, the insulator film 85, the write word line 11, the insulator film 81, the flux concentrator 51 and a third insulator film 43. The through hole 61 has on a side wall thereof a side wall barrier film 62. The through hole 61 also has therein a contact 63 through the side wall barrier film 62. The contact 63 is to establish a connection between an anti-ferromagnetic layer 131 (or barrier metal layer (not shown)) of the TMR element 13 and the landing pad 33.

Alternatively, it does not matter if the end 51S of the side wall portion of the flux concentrator 51 is in contact with the flux concentrator 53, although not shown.

A basic configuration of the magnetic memory device of each of the ninth to the twelfth preferred embodiments may be replaced with that of the magnetic memory device of the above third preferred embodiment and is therefore acceptable to the configuration of the magnetic memory device previously descried with reference to FIG. 6B.

The magnetic memory device 5(5*a* to 5*d*) has the flux concentrator (first flux concentrator) 51 or the flux concentrator (first flux concentrator) 57 of the high permeability film so as to surround the opposite side faces of the write word line 11 and the opposite face of the write word line 11 to the side facing the TMR element 13, together with the flux concentrator (second flux concentrator) 53 of the high permeability film so as to be located between the write word line 11 and the TMR element 13 while extending along the side face of the TMR element 13 through the insulator film 86. In addition, the end 53S of the flux concentrator 53 is as high as the storage layer 134. Thus, the galvano-magnetic field generated from the write word line 11 is concentrated on the storage layer 134 of the TMR element 13 efficiently through a transfer from the flux concentrator 51 or 57 to the flux concentrator 53. Accordingly, it is possible to reduce current required for writing, thus reducing current consumption and also increasing lifetime of the write word line 11 against electromigration. Further, there is less drive current required, which reduces an area of a current drive circuit, thereby providing an increased integration level. Furthermore, as leakage of magnetic field is also reduced, interference with adjacent cells is reduced.

Alternatively, the magnetic memory device having the configuration as previously described in each of the third to the twelfth preferred embodiments may employ a plurality of write word lines as previously described in the second preferred embodiment. The magnetic memory device of the third to the twelfth preferred embodiments employing the plurality of write word lines may produce the functions and effects including those of the second preferred embodiment.

A first preferred embodiment of a first method for manufacturing a magnetic memory device according a preferred embodiment of the present invention will be described next with reference to FIG. 20A to FIG. 22C of cross-sectional views showing steps of the first preferred embodiment. In FIG. 20A to FIG. 22C, there is shown a MRAM composed of one switching element and one TMR element (of 1T1J structure).

Figure 20A:
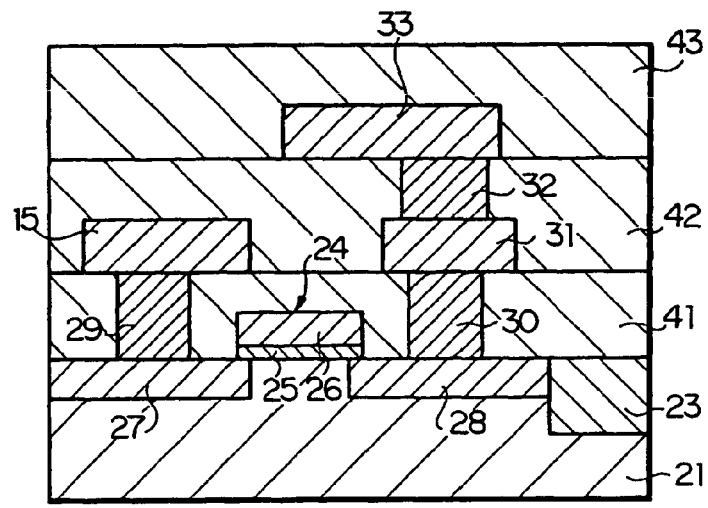
FIGS. 20A to 20C are cross-sectional views showing steps of a first method for manufacturing a magnetic memory device according to a preferred embodiment of the present invention.

As shown in FIG. 20A, a device isolation region 23 is formed on a semiconductor substrate 21 with STI (Shallow Trench Isolation) by using a typical trench etching technology. Next, a field effect transistor 24 forming a switching element is formed on the semiconductor substrate 21 by using a typical technology for field effect transistor fabrication. Alternatively, two field effect transistors 24 for switching elements may also be employed, as shown in FIG. 1. In the configuration shown in FIG. 1, two field effect transistors that share a single diffusion layer 27 are formed. It is to be noted that a magnetic memory device employing the two field effect transistors for the switching elements like the first preferred embodiment of the magnetic memory device previously described with reference to FIG. 1 is also obtainable using the following manufacturing method.

Next, a first insulator film 41 that covers the MOS transistor 24 is formed. Thereafter, a surface of the first insulator film 41 is subjected to planarization by polishing with a CMP (Chemical Mechanical Polishing) process, for instance. Subsequently, a contact hole is opened so as to reach each of the diffusion layers 27, 28 by using a typical lithography technology and a typical etching technology. Then, contacts 29, 30 including tungsten plugs are formed in the contact holes respectively by using a typical technology for tungsten plug fabrication, for instance. Subsequently, a conductive film is formed on the first insulator film 41, and then etched using the typical lithography technology and the typical etching technology, and a sense line connected to the contact 29 and a first landing pad 31 connected to the contact 30 are formed. Alternatively, a typical trench etching technology may be also applied to form the sense line 15, the first landing pad 31 and others.

Next, a second insulator film 42 that covers the sense line 15, the first landing pad 31 and others is formed. Thereafter, a surface of the second insulator film 42 is subjected to planarization by polishing through the CMP process, for instance. Subsequently, a contact hole is opened so as to reach the first landing pad 31 by using the typical lithography technology and the typical etching technology. Then, a contact 32 including a tungsten plug is formed in each contact hole by using the typical technology for tungsten plug fabrication, for instance. Subsequently, a conductive film is formed on the second insulator film 42 and then etched using the typical lithography technology and the typical etching technology, and a second landing pad 33 connected to the contact 32 is formed. Alternatively, the typical trench etching technology may be also applied to form the second landing pad 33.

Next, a third insulator film 43 that covers the second landing pad 33 and others is formed using a HDP (High Density Plasma) CVD process, for instance. More specifically, the third insulator film 43 is formed in such a manner as to form a silicon oxide by a thickness of 1000 nm, for instance, so as to ensure that a silicon oxide layer of a predetermined thickness (thickness enough to ensure a sufficient electrical insulation on the second landing pad 33, for instance) or more will remain after the CMP process. In this process, after a formation of the silicon oxide as described above, a surface of the silicon oxide layer is subjected to planarization by polishing through the CMP process so as to ensure that a silicon oxide layer having a thickness of 500 nm, for instance, will remain so as to attain the sufficient electric isolation on the second landing pad 33.

Figure 20B:
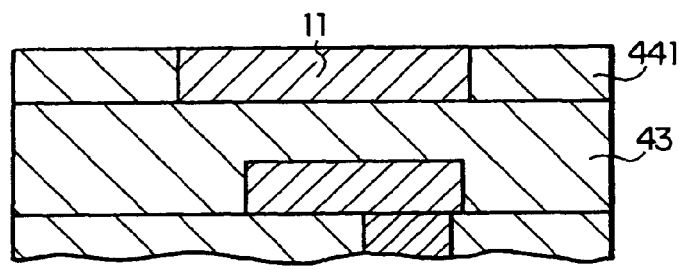

Next, as shown in FIG. 20B, a conductive film for forming a write word line is formed on the third isolator film 43. In the first preferred embodiment, a titanium film (with a thickness of 20 nm, for instance), a titanium nitride film (with a thickness of 20 nm, for instance), an aluminum-copper alloy film (with a thickness of 300 nm, for instance), a titanium film (with a thickness of 10 nm, for instance) and a titanium nitride film (with a thickness of 100 nm, for instance) are formed in ascending order, for instance. Then, the conductive film is etched using the typical lithography technology and the etching technology, and a write word line 11 is fabricated. Alternatively, the typical trench etching technology may be also applied to form the write word line 11. For simplification purposes, there is shown no lower configuration of the third insulator film 43 in drawings on and after FIG. 20B.

Next, a lower layer 441 of a fourth insulator film that covers the write word line 11 is formed with a silicon oxide by a thickness of 500 nm, for instance, by using the HDPCVD process, for instance. Thereafter, a surface of the lower layer 441 of the fourth insulator film is subjected to planarization by polishing through the CMP process, for instance, thereby allowing a surface of the write word line 11 to be exposed to the outside.

Figure 20C:
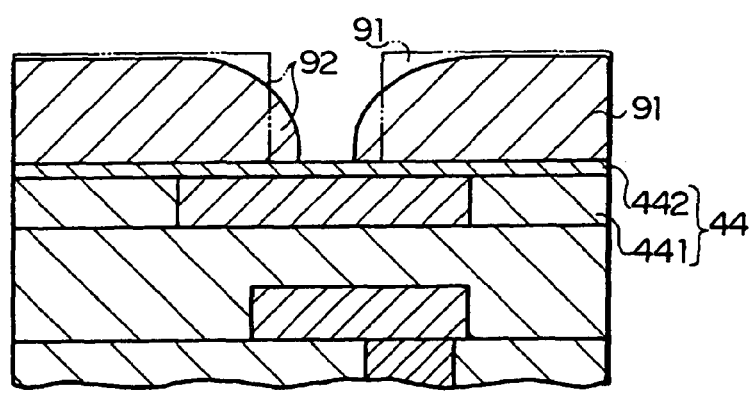

Next, as shown in FIG. 20C, an upper layer 442 of the fourth insulator film is formed with an aluminum oxide by a thickness of 50 nm, for instance, on the surface of the lower layer 441 of the fourth insulator film. The fourth insulator film 44 is formed in this manner. Subsequently, the fourth insulator film 44 is coated with a resist film 91, and a hole 92 is opened in the resist film 91 by using the typical lithography technology. Further, the resist film 91 is heat-treated at temperatures within a range of 200° C. to 300° C. to subject the resist film 91 to re-flow, thereby allowing a bore of the hole 92 to be reduced. In FIG. 20C, the resist film 91 before a re-flow treatment is shown by a chain double-dashed line, and the resist film 91 after the re-flow treatment is shown by a solid line.

It is to be noted that a method to reduce the bore of the hole in the resist film 91 is not limited to the re-flow treatment. Alternatively, a method having been reported in "IEDM" (International Electron Devices Meeting) (1998), pages 333 to 336, by T. Toyoshima et al, for instance, may be also employed. Alternatively, a hole partially opened in a resist film in a thickness direction may also be used. In this case, a side wall barrier film is formed on a side wall of the partially opened hole. Then, the side wall barrier film is used as a mask to reduce a bore of the above partially opened hole, thereby providing a hole having a smaller bore in the resist film.

Figure 21A:
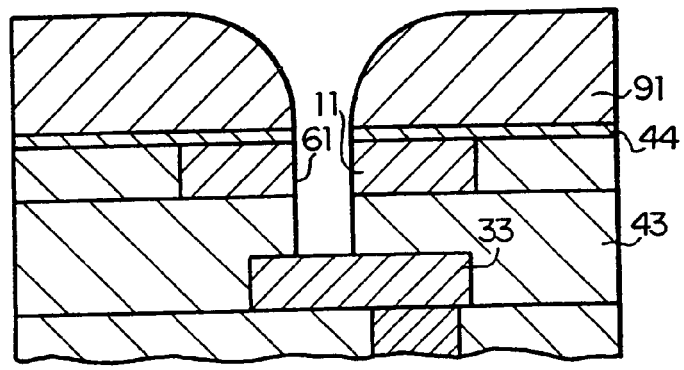
FIGS. 21A to 21D are cross-sectional views showing more steps of the method for manufacturing the magnetic memory device according the first preferred embodiment of the present invention.

Subsequently, as shown in FIG. 21A, a through hole 61 is opened over a range of the fourth insulator film 44 to the third insulator film 43 so as to extend to the second landing pad 33 through the write word line 11 by using an etching technology employing the resist film 91 as an etching mask.

Figure 21B:
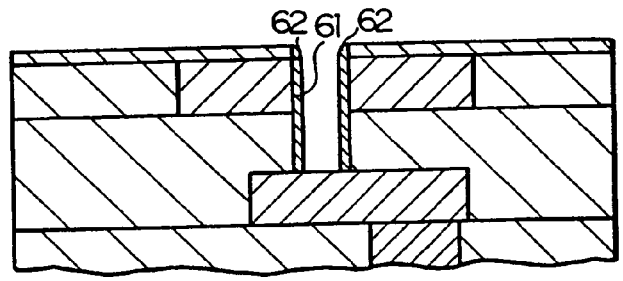

Next, as shown in FIG. 21B, an insulator film forming a side wall barrier film is formed on an inner face of the through hole 61 and on a surface of the fourth insulator film 44 with a silicon oxide by a thickness of 20 nm, for instance, enough to ensure an electric insulation for the through hole 61 with a side wall portion thereof. Thereafter, the insulator film is etched back, and a side wall barrier film 62 is formed on a side wall of the through hole 61.

Figure 21C:
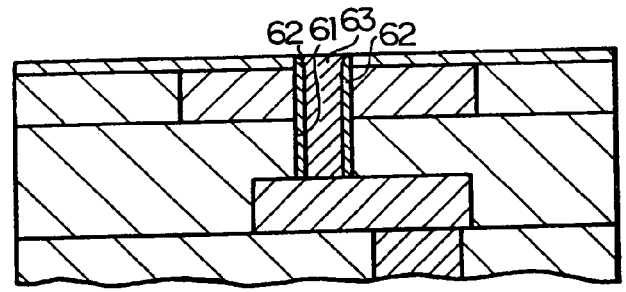

Thereafter, the resist film is stripped. Subsequently, as shown in FIG. 21C, a tungsten film is formed on the fourth insulator film 44 by using the typical technology for tungsten plug fabrication such that the through hole 61 is filled with the tungsten film. Then, an extra tungsten film on the fourth insulator film 44 is removed by polishing through the CMP process, for instance, and a contact 63 of a tungsten plug is formed with tungsten remained in the through hole 61 through the side wall barrier film 62 on the side wall of the through hole 61. A surface of the fourth insulator film 44 is made plane with this CMP process.

Figure 21D:
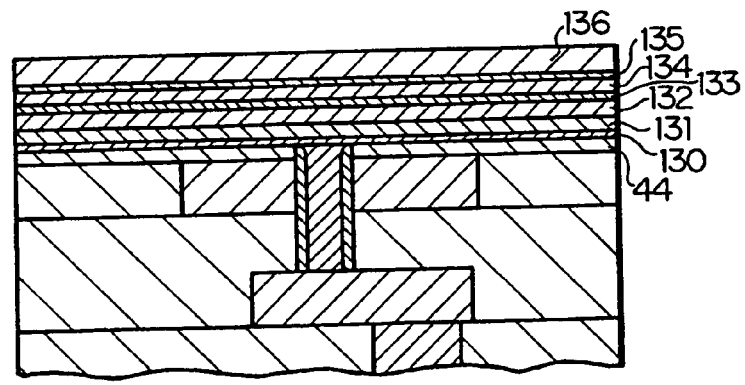

Next, a TMR element 13 connected to the contact 63 is formed on the fourth insulator film 44 according to the following steps. Firstly, as shown in FIG. 21D, a barrier layer 130, an anti-ferromagnetic layer 131, a fixed magnetization layer 132 including a ferromagnetic material, a tunnel barrier film 133, a storage layer 134 including a ferromagnetic material, a cap layer 135 and an electrode layer 136 are formed in ascending order on the fourth insulator film 44 by using a PVD (Physical Vapor Formation) process.

The barrier layer 130 is formed with a titanium nitride, tantalum or a tantalum nitride.

The anti-ferromagnetic layer 131 is formed with, for instance, at least one of an iron-manganese alloy, a nickel-manganese alloy, a platinum-manganese alloy, an iridium-manganese alloy, a rhodium-manganese alloy, a cobalt oxide and a nickel oxide. A substrate conductive layer used to connect the anti-ferromagnetic layer 131 with a switching element connected to the TMR element 13 in series may be the anti-ferromagnetic layer 131 itself. Thus, the present preferred embodiment employs the anti-ferromagnetic layer 131 as a part of an interconnection that is to connect the TMR element with the switching element (not shown).

The fixed magnetization layer 132 is formed with, for instance, a ferromagnetic material such as nickel, iron, cobalt and an alloy including at least two out of nickel, iron and cobalt. The fixed magnetization layer 132 is in contact with the anti-ferromagnetic layer 131. Thus, an interlayer exchange coupling between the fixed magnetization layer 132 and the anti-ferromagnetic layer 131 causes the fixed magnetization layer 132 to have an intensive unidirectional magnetic anisotropy. Specifically, a magnetization orientation of the fixed magnetization layer 132 is pinned with an exchange bond between the fixed magnetization layer 132 and the anti-ferromagnetic layer 131.

Alternatively, the fixed magnetization layer 132 may be of a multi-layered structure, in which magnetic layers are stacked with a conductive layer put therebetwen. For instance, a multi-layered structure may be employed, in which a first fixed magnetization layer, a conductive layer that yields an anti-ferromagnetic bond to a magnetic layer, and a second fixed magnetization layer are stacked in this order from the side of the anti-ferromagnetic layer 131. Alternatively, the fixed magnetization layer 132 may also be of a more multi-layered structure, in which three or more ferromagnetic layers are stacked with the conductive layer interposed therebetween. The conductive layer may be formed with, for instance, ruthenium, copper, chromium, gold and silver and the like.

The tunnel barrier layer 133 provides functions for carrying a tunnel current, while disconnecting a magnetic bond between the storage layer 134 and the fixed magnetization layer 132. Thus, an aluminum oxide having a thickness of 0.5 nm to 5 nm is typically used. Alternatively, a magnesium oxide, a silicon oxide, an aluminum nitride, a magnesium nitride, a silicon nitride, an aluminum oxy-nitride, a magnesium oxy-nitride, a silicon oxy-nitride may also be employed. An ALD (Atomic Layer Formation) process is used to form the tunnel barrier layer 133, because of its extremely small thickness as thin as 0.5 nm to 5 nm as described above. Alternatively, the tunnel barrier layer 133 is also obtainable by means of plasma-assisted oxidation or nitridation of a metal film such as aluminum having been formed by sputtering.

The storage layer 134 is formed with, for instance, a ferromagnetic material such as nickel, iron, cobalt and an alloy including at least two out of nickel, iron and cobalt. The storage layer 134 may vary a magnetization that is oriented in parallel or antiparallel to the magnetization of a lower layer or the fixed magnetization layer 132 with an externally applied magnetic field.

The cap layer 135 provides functions such as a prevention of mutual diffusion between the cap layer 135 and an interconnection that is to connect the TMR element with a different TMR element, a reduction in contact resistance and an anti-oxidation of the storage layer 134. The cap layer 135 is typically formed with a material such as copper, a tantalum nitride, tantalum and a titanium nitride. Thus, the same material as the barrier layer 130 may be used for the cap layer 135.

The electrode layer 136 is formed with tungsten or tungsten nitride by a thickness of 50 nm, for instance, by using the CVD process, for instance.

Figure 22A:
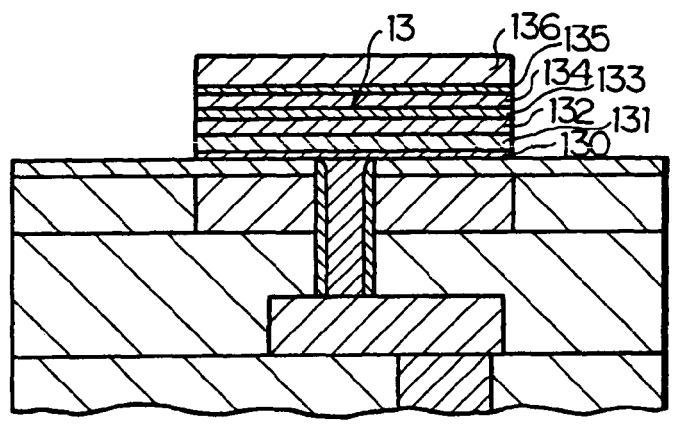
FIGS. 22A to 22C are cross-sectional views showing more steps of the first method for manufacturing the magnetic memory device according a preferred embodiment of the present invention.

Next, as shown in FIG. 22A, the TMR element 13 is formed by etching a multi-layered film (composed of the electrode layer 136, the cap layer 135, the storage layer 134, the tunnel barrier layer 133, the fixed magnetization layer 132, the anti-ferromagnetic layer 131 and the barrier layer 130) forming the TMR element 13 by using the lithography technology and the etching (reactive ion etching) technology with a photo resist (not shown) as a mask. Examples of etching gas used for the above etching process include halogen gas containing chlorine (Cl) and a gas system resulting from adding ammonium ($NH_3$) to carbon monoxide (CO). Thereafter, the photo resist is stripped.

Figure 22B:
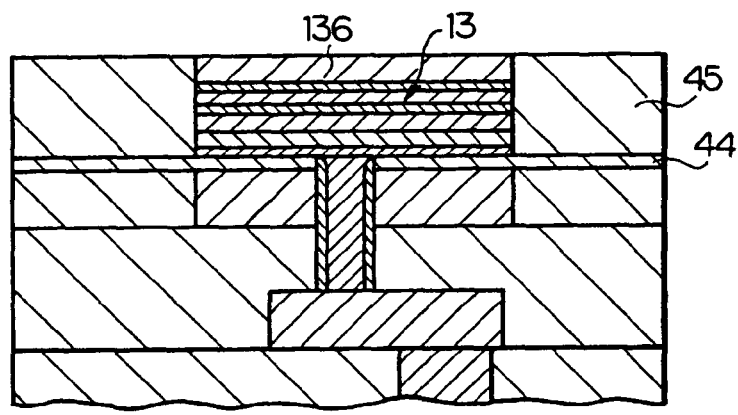

Next, as shown in FIG. 22B, a fifth insulator film 45 that covers the TMR element 13 is formed on the fourth insulator film 44. Specifically, the fifth insulator film 45 is formed with a silicon oxide, an aluminum oxide and the like by a thickness of 100 nm, for instance, or a thickness larger than that of the TMR element 13 by using a plasma CVD or PVD process, for instance. Thereafter, a surface of the fifth insulator film 45 is subjected to planarization by polishing through the CMP process, for instance, thereby allowing an upper surface of the electrode layer 136 of the TMR element 13 to be exposed to the outside.

Figure 22C:
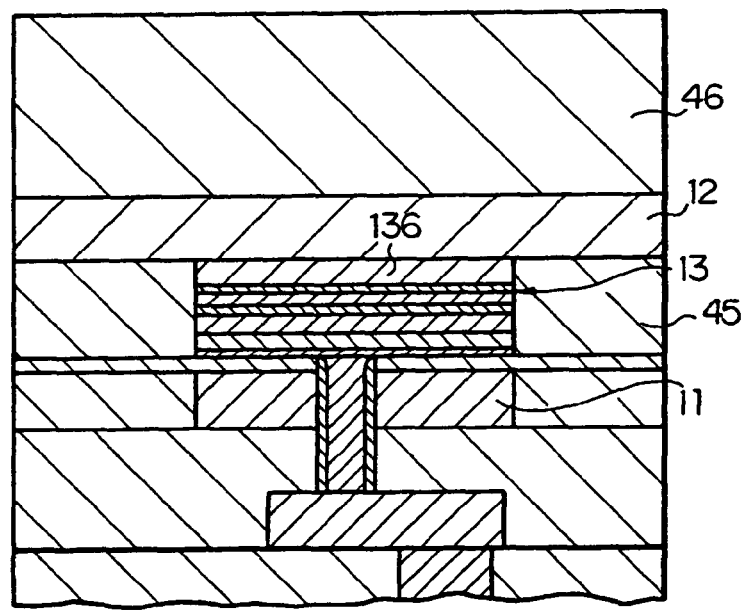

Next, as shown in FIG. 22C, a bit line 12 connected to the electrode layer 136 of the TMR element 13 is formed on the fifth insulator film 45 by using a typical interconnection fabrication technology such that the bit line 12 crosses (or extends orthogonal to the write word line 11 in a grade-separated manner with the TMR element 13 interposed therebetween. Also, interconnections (not shown) of peripheral circuits and a bonding pad region (not shown) are formed. Further, a sixth insulator film 46 forming a protection film is formed over the entire surface of the bit line 12 with a silicon nitride film by using the plasma CVD process, for instance. Then, a bonding pad portion (not shown) is opened, and consequently, a wafer process of the magnetic memory device is completed.

The method for manufacturing the magnetic memory device as described with reference to FIG. 20A to FIG. 22C includes the step of opening the through hole 61 that extends from the fourth insulator film 44 to the second landing pad 33 lower than the write word line 11 through the write word line 11, the step of forming the side wall barrier film 62 on the side wall of the through hole 61 and the step of forming the contact 63 in the through hole 61, thereby providing the magnetic memory device having the contact 63 located right beneath the TMR element 13. Thus, a connection between the TMR element 13 and the second landing pad 33 connected to the diffusion layer 28 of the field effect transistor 24 forming the switching element is established by making use of a cell area of the TMR element 13 without newly creating an area of the contact 63 allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

Figure 23A:
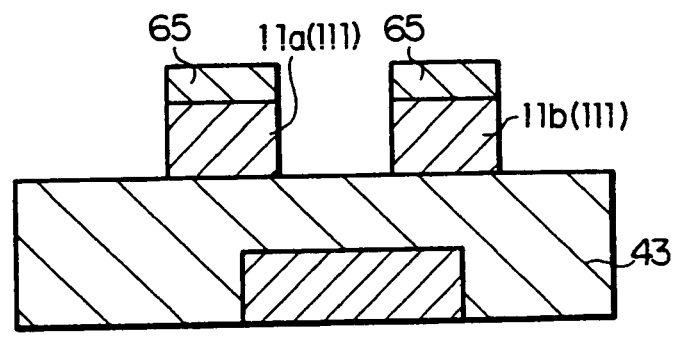
FIGS. 23A to 23C are cross-sectional views showing steps of a second preferred embodiment of the first method for manufacturing the magnetic memory device according a preferred embodiment of the present invention.
Figure 23B:
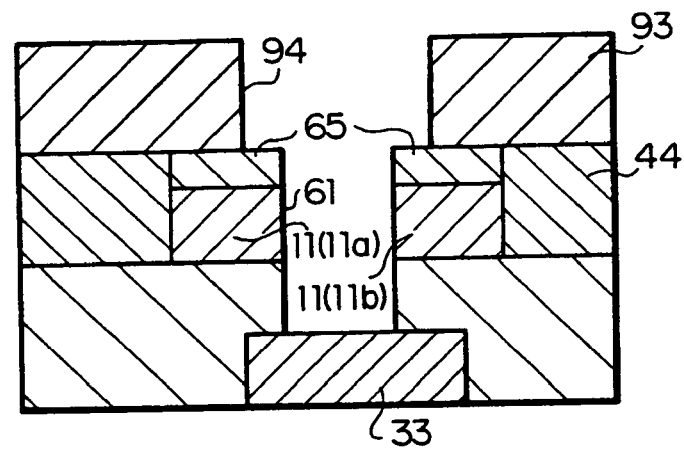
Figure 23C:
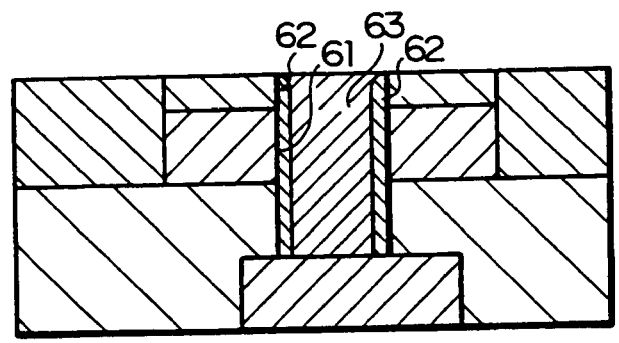

A second preferred embodiment of the first method for manufacturing the magnetic memory device according a preferred embodiment of the present invention will be described next with reference to FIG. 23A to FIG. 23C showing a cross-sectional view of steps of the second preferred embodiment. The second preferred embodiment of the first method relates to a method that is applied for obtaining the magnetic memory device of the second preferred embodiment previously described with reference to FIG. 2.

The second preferred embodiment of the first method for manufacturing the magnetic memory device is different from the first preferred embodiment of the first method for manufacturing the magnetic memory device in the way of forming a write word line and a though hole that is provided so as to extend through the write word line. The first and second preferred embodiments of the first method for manufacturing the magnetic memory device are similar in the other steps.

In the following description, emphasis is placed on different steps from those of the first preferred embodiment of the first method for manufacturing the magnetic memory device, specifically, a step of fabricating the write word line and a step of opening the through hole. In fabricating the write word line 11, a conductive film 111 forming the write word line is formed on a third insulator film 43, and an offset insulator film 65 is then formed on the conductive film 111, as shown in FIG. 23A. All that is required for this step is to form the offset insulator film 65 with an insulator material that will be used as an etching mask in a later etching process for the third insulator film 43 and a subsequently formed fourth insulator film. Specifically, the offset insulator film 65 is formed with an aluminum oxide or a silicon nitride, for instance. Thereafter, a resist is coated in a typical manner, and a resist mask (not shown) is formed according to the lithography technology. Then, the conductive film 111 and the offset insulator film 65 are etched simultaneously, and the write word lines 11a (111) and 11b (111) with the offset insulator films 65 put thereon are formed. It is to be noted that the steps previous to a formation of the third insulator film 43 may be conducted in a similar manner as the first preferred embodiment of the first method for manufacturing the magnetic memory device.

Thereafter, the resist mask is stripped. Subsequently, as shown in FIG. 23B, the fourth insulator film 44 is formed on the third insulator film 43 so as to cover the write word lines 11 (11a) and 11 (11b) with the offset insulator films 65 put thereon. Then, a surface of the fourth insulator film 44 is subjected to planarization by polishing through the CMP process, for instance, such that the offset insulator films 65 will be exposed to the outside. Then, a resist film 93 is formed using a typical resist coating process, and a hole 94 is opened in the resist film 93 by using the lithography technology. Then, the fourth insulator film 44 and the third insulator film 43 are etched with the resist film 93 as an etching mask, and a through hole 61 that extends to a landing pad 33 forming a lower interconnection layer is opened. In this case, a choice of an etching condition that the offset insulator films 65 are hard to be etched makes it possible to provide the through hole 61 between the write word lines 11 (11a) and 11 (11b) to the very limit. Thereafter, the resist mask is stripped.

A next step will do as shown in FIG. 23C, as long as a side wall barrier film 62 is formed on the side wall of the through hole 61 and a contact 63 filled in the through hole is formed with a tungsten plug, for instance, in a similar manner as the above first preferred embodiment of the first method for manufacturing the magnetic memory device. Thereafter, steps on and after a TMR element formation step are conducted in a similar manner as the above first preferred embodiment of the first method for manufacturing the magnetic memory device, although not shown.

The second preferred embodiment of the first method for manufacturing the magnetic memory device has the following advantages, in addition to the similar advantages as the above first preferred embodiment of the first method for manufacturing the magnetic memory device. Specifically, the offset insulator films 65 formed on the write word lines 11 form so-called etching stop layers, so that the hole 94 may be provided in the resist film 93 forming the etching mask so as to extend over the write word lines 11. Thus, the advantages of eliminating a need for a fine bore hole provided in the resist film 93 or ensuring a larger margin for a mask alignment in a lithography process and others are offered.

The first and second preferred embodiments of the first method for manufacturing the magnetic memory device may provide the magnetic memory device having the through hole 61 whose axis in a parallel direction to the write word line 11 is longer so as to be projecting from the TMR element 13 as previously described with reference to FIG. 5 of the layout drawing. The magnetic memory device having the through hole 61 as described above increases a contact area of the TMR element 13 with the landing pad 33 forming the lower interconnection layer, thereby enabling a reduction in contact resistance.

According to the second preferred embodiment of the first method for manufacturing the magnetic memory device, the write word line 11 is formed with a plurality of interconnections (two in the drawing), and the through hole 61 is provided between the write word lines 11a, 11b. In addition, the contact that is to establish a connection between the TMR element 13 and the landing pad 33 is formed inside the through hole. Thus, the write word lines 11a, 11b on the opposite sides of the through hole 61 may be arrayed at uniform intervals. Accordingly, there is no risk of a disconnection occurring due to a current flowing in such a way as to be one-sided to either of the write word lines 11 or an increased current density of finely formed interconnections, for instance.

A first preferred embodiment of a second method for manufacturing a magnetic memory device of the present invention will be described next with reference to FIG. 24A to FIG. 25D of cross-sectional views showing steps of the first preferred embodiment. The first preferred embodiment of the second method relates to a method that is applied for obtaining the magnetic memory device of the third preferred embodiment previously described with reference to FIG. 6.

The first preferred embodiment of the second method for manufacturing the magnetic memory device is different from the first preferred embodiment of the first method for manufacturing the magnetic memory device in steps ranging from a formation of a third insulator film to a forming of a fourth insulator film. The first preferred embodiment of the second method for manufacturing the magnetic memory device is similar in other steps as the first preferred embodiment of the first method for manufacturing the magnetic memory device. In this connection, in FIG. 24A to FIG. 25D, there are only shown steps subsequent to the formation of the third insulator film.

Firstly, a device isolation region 23 is formed on a semiconductor substrate 21 according to similar process as previously described with reference to FIGS. 20A to 20C. Next, a field effect transistor 24 forming a switching element is formed on the semiconductor substrate 21. Then, a first insulator film 41 that covers the MOS transistor 24 is formed, and a surface of the first insulator film 41 is subjected to planarization. Then, contact holes are opened respectively so as to reach diffusion layers 27, 28, and contacts 29, 30 including tungsten plugs are formed in the contact holes. Then, a conductive film is formed on the first insulator film 41 and then etched, and a sense line 14 connected to the contact 29 and a first landing pad 31 connected to the contact 30 are formed. Then, a second insulator film 42 that covers the sense line 15, the first landing pad 31 and others is formed, and a surface of the second insulator film 42 is subjected to planarization. Then, a contact hole is opened so as to reach the first landing pad 31, and a contact 32 including a tungsten plug is formed in the contact hole. Then, a conductive film is formed on the second insulator film 42 and etched, and the second landing pad 33 connected to the contact 32 is formed.

Figure 24A:
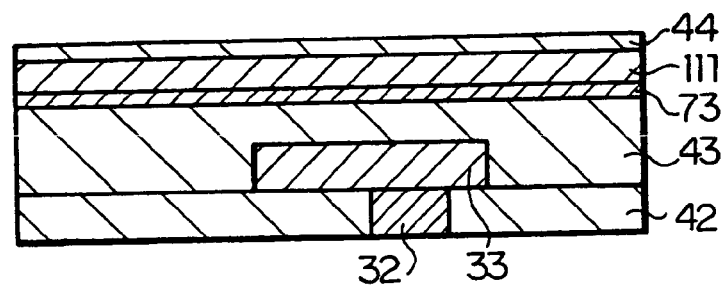
FIGS. 24A to 24D are cross-sectional views showing steps of a first example of a second method for manufacturing a magnetic memory device according a preferred embodiment of the present invention.

Next, as shown in FIG. 24A, the second insulator film 42 inclusive of the landing pad 33 connected to the contact 32 and others is covered with the third insulator film 43. Then, the third insulator film 43 is polished using the CMP process so as to ensure that a film of a predetermined thickness (thickness enough to ensure an electrical insulation on the second landing pad 33, for instance) of more will remain on the second landing pad 33. Specifically, the third insulator film 43 is formed with a silicon oxide by a thickness of 1000 nm. In this process, after a formation of the silicon oxide, a surface of the oxide silicon film is subjected to planarization by polishing through the CMP process so as to ensure that a silicon oxide film having a thickness of 500 nm, for instance, will remain so as to ensure a sufficient electrical insulation on the second landing pad 33.

Next, a barrier metal (not shown), a high permeability film 73 and an interconnection material layer 111 forming the write word line are formed on the third insulator film 43 by using the PVD process. Further, a fourth insulator film 44 is formed on the interconnection material layer 111.

The barrier metal is composed of a titanium (Ti) layer formed by a thickness of 5 nm and a titanium nitride (TiN) layer formed by a thickness of 20 nm on the titanium layer.

The high permeability film 73 may be formed with a soft magnetic material whose maximum permeability $\mu_m$ is equal to or more than 100, for instance. Specifically, an alloy containing nickel, iron and cobalt, a ferrite alloy or other soft magnetic materials may be used. The high permeability film 73 is formed by a thickness of 100 nm, for instance. Alternatively, other metallic compounds, metallic oxides or metallic nitrides containing one of cobalt (Co), iron (Fe) and Nickel (Ni), for instance, may be also used, as long as a maximum permeability $\mu_m$ of equal to or more than 100 is attainable.

The above materials may be used for high permeability films that will be available for various methods for manufacturing a magnetic memory device in the following description.

The interconnection material layer 111 is formed with aluminum (Al), copper (Cu) or an aluminum-copper (Al—Cu) alloy by a thickness of 300 nm, for instance.

The fourth insulator film 44 is formed with an aluminum oxide ($Al_2O_3$), for instance. A thickness of the fourth insulator film 44 may be a thickness enough to ensure the electrical insulation between a TMR element that will be formed in a later process and the write word line 11. The thickness of the fourth insulator film 44 shall be in a range of 3 nm to 50 nm, for instance.

Figure 24B:
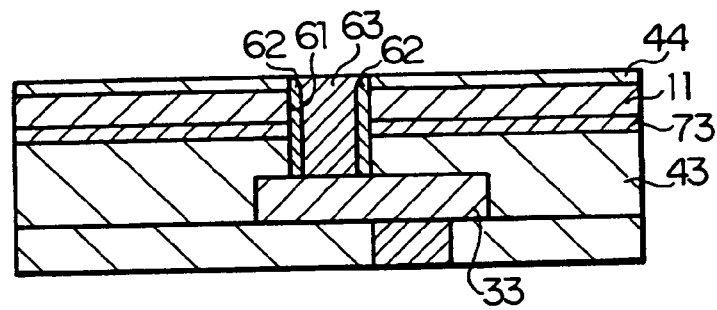

Next, as shown in FIG. 24B, a through hole 61 that extends from a surface of the fourth insulator film 44 to a second landing pad 33 is opened. Further, a contact 63 is formed in the through hole 61 through a side wall barrier film 62 on a side wall of the through hole 61. Specifically, a resist film (91) is formed on the fourth insulator film 44 in a similar manner as previously described with reference to FIG. 20C. Subsequently, the through hole 61 that extends to the second landing pad 33 through the interconnection material layer 111 and the high permeability film 73 is opened over a range of the fourth insulator film 44 to the third insulator film 43 by using the etching technology with the resist film (91) as an etching mask in a similar manner as previously described with reference to FIG. 20D.

Next, an insulator film forming the side wall barrier film is formed on an inner face of the through hole 61 and on a surface of the fourth insulator film 44 with a silicon oxide by a thickness of 20 nm, for instance, or a thickness enough to ensure the electrical insulation for the through hole 61 with a side wall portion thereof in a similar manner as previously described with reference to FIG. 21B. Thereafter, the insulator film is etched back, and the side wall barrier film 62 is formed on the side wall of the through hole 61.

Next, a tungsten film is formed on the fourth insulator film 44 such that the through hole 61 is filled with the tungsten film by using the typical technology for tungsten plug fabrication in a similar manner as previously described with reference to FIG. 20(6). Subsequently, an extra tungsten film on the fourth insulator film 44 is removed using the CMP, for instance, and the contact 63 including a tungsten plug is formed with tungsten remained in the through hole 61 through the side wall barrier film 62 on the side wall of the through hole 61. A surface of the fourth insulator film 44 is made plane with this CMP process.

Figure 24C:
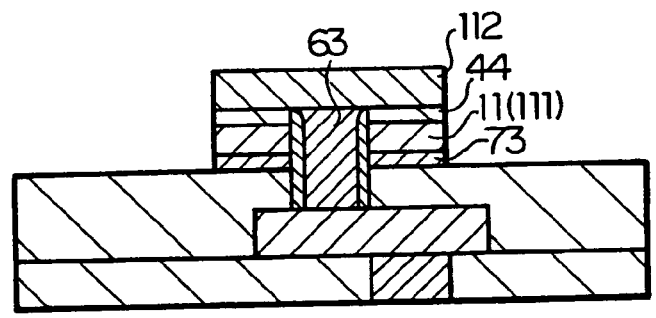

Next, as shown in FIG. 24C, a dummy film 112 that covers the contact 63 is formed on the fourth insulator film 44 with a film that is effective in etching the fourth insulator film 44 in a selective manner, for instance. In the present preferred embodiment, the dummy film 112 is formed with a silicon oxide, for instance.

Next, the dummy film 112, the interconnection material layer 111, the high permeability film 73 and the barrier metal (not shown) are sequentially etched with the photo resist (not shown) as a mask by using the lithography technology and the etching technology, and a write word line 11 with the dummy film 112 put thereon is formed. Thereafter, the photo resist is stripped.

Figure 24D:
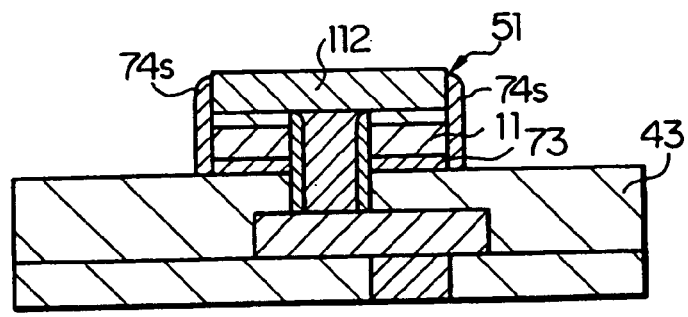

Next, as shown in FIG. 24D, a high permeability film that covers the dummy film 112 (Refer to FIG. 24A) is formed on the third insulator film 43 by using the PVD process. Then, the whole surface of the high permeability film is etched back, and a high permeability side wall 74s is formed on a side wall of the write word line with the dummy film 112 put thereon. In this manner, a flux concentrator 51 composed of the high permeability film 73 and the high permeability side wall 75s is formed.

Figure 25A:
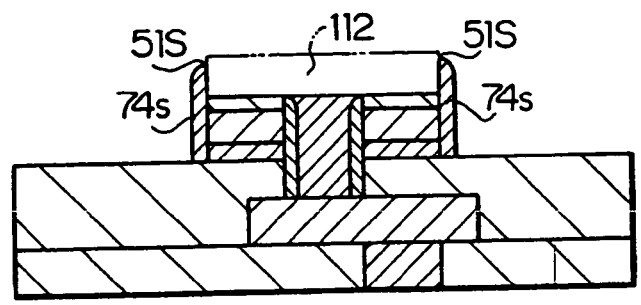
FIGS. 25A to 25D are cross-sectional views showing more steps of the first example of the second method for manufacturing the magnetic memory device according a preferred embodiment of the present invention.

Subsequently, as shown in FIG. 25A, only the dummy film 112 (portion shown by a chain two-dashed line) is stripped by means of selective etching. The high permeability side wall 74s forms a side wall portion of the flux concentrator 51, so that a height of an end 51S of the flux concentrator 51 is adjusted with a thickness of the dummy film 112. The end 51S of the flux concentrator 51 may be as high as an interface between a storage layer and a cap layer of a TMR element which will be formed in a later process, preferably over a height range of an interface between a tunnel barrier film and the storage layer to an interface between the storage layer and the cap layer, for instance. In addition, a distance between the high permeability side wall 74s and the TMR element that will be formed in the later process needs to be such a distance as to allow a galvano-magnetic flux having been concentrated on the end 51s to efficiently reach the storage layer. The above distance shall be equal to or less than 200 nm, preferably, equal to or less than 100 nm, for instance.

Figure 25B:
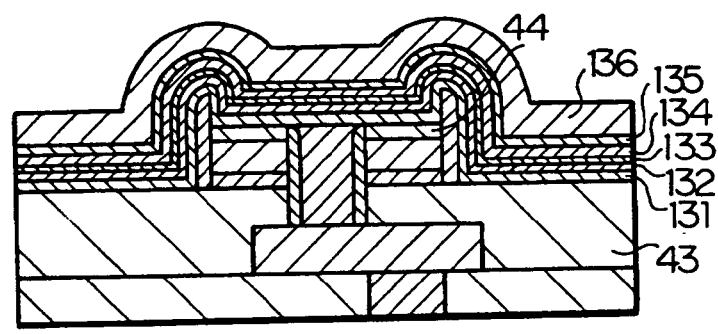

Next, as shown in FIG. 25B, a barrier layer (not shown) that covers the flux concentrator 51, an anti-ferromagnetic layer 131, a fixed magnetization layer 132 including a ferromagnetic material, a tunnel barrier layer 133, a storage layer 134 including a ferromagnetic material, a cap layer 135 and an electrode layer 136 are sequentially formed on the third insulator film 43 and the fourth insulator film 44. The barrier layer (not shown), the anti-ferromagnetic layer 131, the fixed magnetization layer 132, the tunnel barrier layer 133, the storage layer 134 of the ferromagnetic material, the cap layer 135 and the electrode layer 136 may be formed with the same materials as previously described in the first preferred embodiment.

Figure 25C:
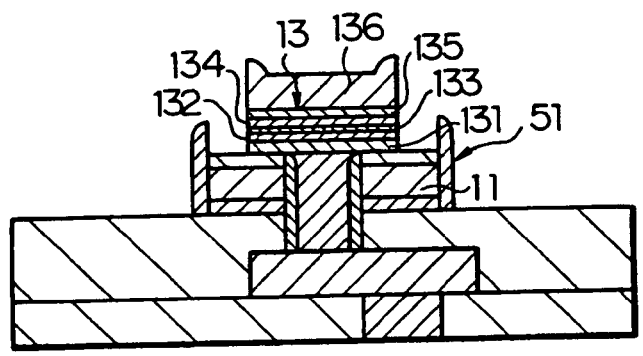

Next, as shown in FIG. 25C, the TMR element 13 is formed by etching a multi-layered film (composed of the electrode layer 136, the cap layer 135, the storage layer 134, the tunnel barrier layer 133, the fixed magnetization layer 132, the anti-ferromagnetic layer 131 and the barrier layer) forming the TMR element 13 with the photo resist as a mask by using the lithography technology and the etching (reactive ion etching) technology. Examples of etching gas used for the etching process include halogen gas containing chlorine (Cl) and a gas system resulting from adding ammonium ($NH_3$) to carbon monoxide (CO). Thereafter, the photo resist is stripped.

In the magnetic memory device having the above configuration, the flux concentrator 51 that surrounds the lower part and the side face of the write word line 11 projects from the write word line 11 toward the vicinity of a side face of the TMR element 13. Thus, a galvano-magnetic field generated from the write word line 11 may be efficiently applied to the storage layer 134 of the TMR element 13.

Figure 25D:
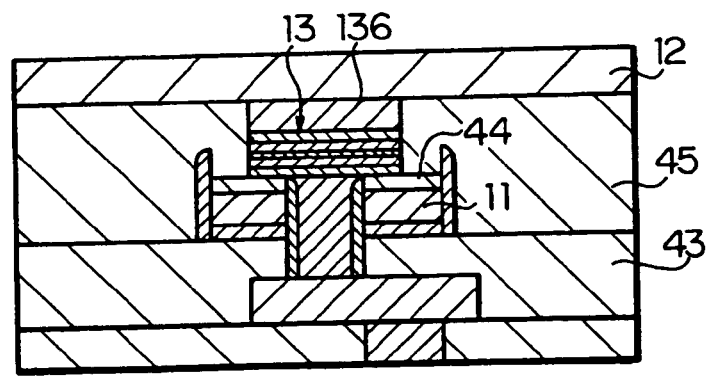

Next, as shown in FIG. 25D, a fifth insulator film 45 that covers the TMR element 13 is formed on the third insulator film 43 and the fourth insulator film 44. Specifically, the fifth insulator film 45 is formed with a silicon oxide or an aluminum oxide by using the CVD or PVD process, for instance. Thereafter, a surface of the fifth insulator film 45 is subjected to planarization by polishing through the CMP process, thereby allowing an upper surface of the electrode layer 136 of the TMR element 13 to be exposed to the outside.

Next, a bit line 12 connected to the electrode layer 136 of the TMR element 13 is formed on the fifth insulator film 45 by using the typical interconnection fabrication technology such that the bit line 12 crosses (or extends orthogonal to, for instance) the write word line 11 in a grade-separated manner with the TMR element 13 interposed therebetween. Simultaneously with a fabrication of the bit line 12, interconnections (not shown) of peripheral circuits and a bonding pad region (not shown) are also formed. Further, a sixth insulator film (not shown) forming a protection film is formed over the entire surface of the bit line 12 with a plasma-assisted silicon nitride film, for instance. Thereafter, a bonding pad portion is opened, and a wafer process of the magnetic memory device is completed.

The second method for manufacturing the magnetic memory device may be applied for obtaining the magnetic memory device of the sixth preferred embodiment as previously described with reference to FIG. 13, as long as the insulator film is provided between the high permeability film 73 and the first interconnection layer 111, and the side wall barrier film is formed on the side wall of the write word line 11 prior to a formation of the high permeability side wall 74s.

The second method for manufacturing the magnetic memory device includes the step of opening the through hole 61 that extends from the fourth insulator film 44 to the second landing pad 33 lower than the write word line (first interconnection) 11 through the write word line 11 and the flux concentrator 51, the step of forming the side wall barrier film 62 on the side wall of the through hole 61, and the step of forming the contact 63 in the through hole 61, thereby providing the magnetic memory device having the TMR element 13 located on the contact 63. Thus, a connection between the TMR element 13 and the second landing pad 33 is established by making use of a cell area of the TMR element 13 without newly creating an area of the contact 63 allotted to the cell area. Accordingly, there may be provided a MRAM composed of one switching element and one TMR element, in which the same access rate as the conventional MRAM of one switching element-one TMR element type, and a more reduction in cell area as compared with the conventional MRAM is enabled. A cell area of the MRAM composed of one switching element and one TMR element may be made smaller as much as a cell area of the cross-point MRAM.

The second method for manufacturing the magnetic memory device further includes the step of forming the flux concentrator 51 of the high permeability film so as to surround the opposite side faces of the write word line 11 and the opposite face of the write word line 11 to the side facing the TMR element 13, so that the concentrated galvano-magnetic field generated at a time of applying a current to the write word line 11 is concentrated more efficiently on the storage layer (which will be also called a recording layer) 134 of the TMR element 13 with the high permeability film formed on the opposite side faces of the write word line 11. Thus, it is possible to reduce current required for writing, thus reducing current consumption and also increasing lifetime of the write word line 11 against electromigration. Further, there is less drive current required, which reduces an area of a current drive circuit, thereby providing an increased integration level. Further, as leakage of magnetic field is also reduced, interference with adjacent cells is reduced.

A second preferred embodiment of the second method for manufacturing the magnetic memory device according a preferred embodiment of the present invention will be described next. In the following description, there is shown a method that is applied for obtaining the basic configuration of the magnetic memory device of the fifth preferred embodiment as previously described with reference to FIG. 12.

The second preferred embodiment of the second method relates to a modification of the method previously described with reference to FIG. 24A, and further includes a step of forming a high permeability film on a third insulator film 43 by using the PVD process after a formation of a barrier metal (not shown), a high permeability film 73 and an interconnection material layer 111 forming a write word line and a landing pad. Steps subsequent to a formation of the high permeability film are conducted in a similar manner as previously described with reference to FIG. 24A to FIG. 25D.

As a result, the second preferred embodiment of the second method may provide the magnetic memory device having a flux concentrator 51 that surrounds the write word line 11 with the high permeability film 73, a high permeability side wall 74s and the other high permeability film (not shown) and has the high permeability side wall 74s extending to the side of a TMR element 13. An end 51S of the high permeability side wall 74s forming a side wall portion of the flux concentrator 51 is determined and positioned in a similar manner as the first preferred embodiment of the second method for manufacturing a magnetic memory device.

A third preferred embodiment of the second method is also different from the method previously described with reference to FIG. 24A to FIG. 25D in the following steps. Specifically, the second method of the third preferred embodiment further includes a step of forming an insulator film (not shown) after a formation of a high permeability film 73 unlike the step previously described with reference to FIG. 24A, a patterning step of fabricating a write word line 11 in such a manner as to remain the high permeability film 73 without being etched, and a step of forming a side wall barrier film prior to a formation of a high permeability side wall 74s. Steps other than the above three steps are conducted in a similar manner as previously described with reference to FIG. 24A to FIG. 25D.

As a result, the second method of the third preferred embodiment may provide the magnetic memory device having a flux concentrator 51 including the high permeability film 73 and the high permeability side wall 74s so as to surround the side faces and the bottom side of the write word line 11 through the insulator film, as shown in FIG. 13. An end 51S of the high permeability side wall 74s forming a side wall portion of the flux concentrator 51 is determined and positioned in a similar manner as the first preferred embodiment of the second method for manufacturing the magnetic memory device.

The second and third preferred embodiments of the second method for manufacturing the magnetic memory device may also offer similar advantages as the first preferred embodiment of the second method for manufacturing the magnetic memory device.

A third method for manufacturing a magnetic memory device according a preferred embodiment of the present invention will be described next with reference to FIG. 26A to FIG. 26D showing a cross-sectional view of steps of this preferred embodiment. The third method relates to a method that is applied to obtain the magnetic memory device of the fourth preferred embodiment previously described with reference to FIG. 8.

Figure 26A:
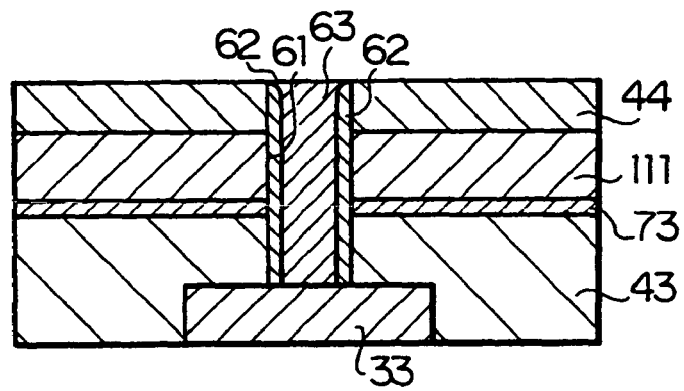
FIGS. 26A to 26D are cross-sectional views showing steps of an example of a third method for manufacturing a magnetic memory device according a preferred embodiment of the present invention.

According to the above third method, steps previous to a formation of a third insulator film 43 are conducted in a similar manner as previously described with reference to FIG. 20A. Thus, in the following description, steps subsequent to the formation of the third insulator film 43 will be given. First, as shown in FIG. 26A, a high permeability film 73, a first interconnection layer 111 and a fourth insulator film 44 are formed in ascending order on the third insulator film 43 in a similar manner as previously described with reference to FIG. 24A to FIG. 24D. Next, a through hole 61 that extends from the fourth insulator film 44 to a second landing pad 33 through the first interconnection layer 111, the high permeability film 73 and the third insulator film 43 is opened. A similar method as the above first method may be adopted in opening the through hole 61. Further, a side wall barrier film 62 is formed on a side wall of the through hole 61. Furthermore, a contact 63 is formed in the through hole 61 through the side wall barrier film 62.

Figure 26B:
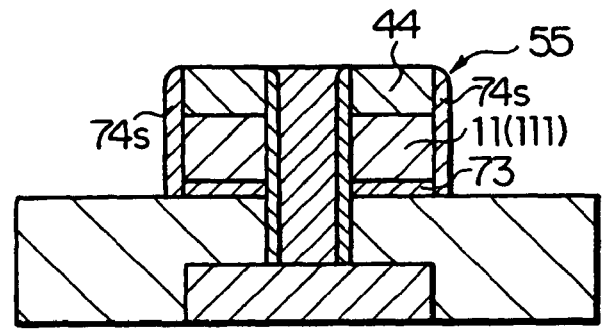

Next, as shown in FIG. 26B, a multi-layered film ranging from the fourth insulator film 44 to the high permeability film 73 is etched, and a write word line 11 is formed with the first interconnection layer 111. The write word line 11 is provided in a shape with the fourth insulator film 44 put thereon.

A high permeability side wall 74s including a high permeability material is formed on the side wall of a multi-layered structure formed in the shape of the write word line 11 by etching, and a flux concentrator 55 composed of the high permeability film 73 and the high permeability side wall 74s is formed.

Figure 26C:
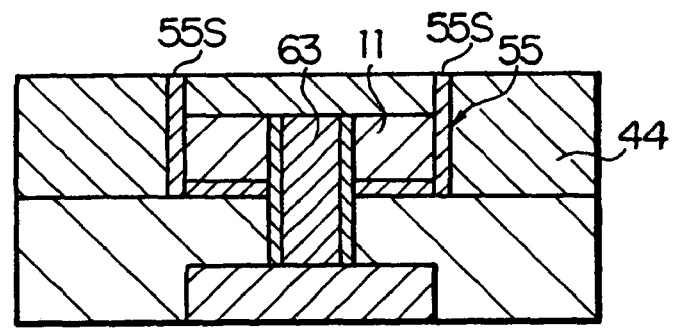

As shown in FIG. 26C, a fourth insulator film 44 that covers the third insulator film 43, the contact 63, the flux concentrator 55 and others are formed. In the above third method, a formation of the fourth insulator film right above the write word line 11 and a formation of the fourth insulator film 44 on the side of the write word line 11 are performed in two separate steps. Then, a surface of the fourth insulator film 44 formed in a latter process is subjected to planarization, thereby allowing an end 55S of the first flux concentrator 55 to be exposed to the outside.

Figure 26D:
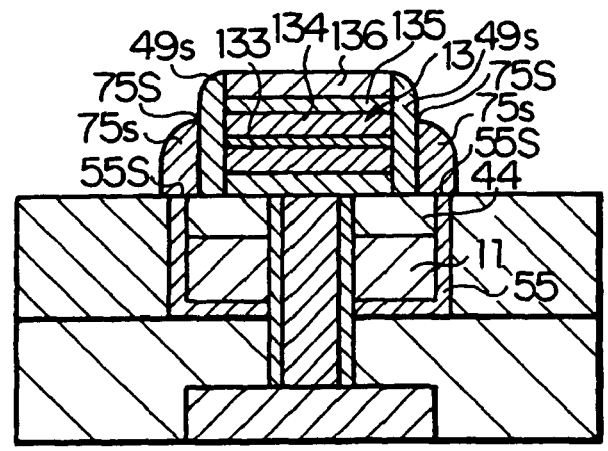

Next, as shown in FIG. 26D, a TMR element 13 is formed on the fourth insulator film 44 that covers the write word line 11 in a similar manner as previously described with reference to FIG. 25B and FIG. 25C. Then, a side wall barrier film 49s is formed on a side wall of the TMR element 13 by using a side wall formation technology employing the typical etching technology. Alternatively, if a sufficient height of the side wall barrier film 49s is not ensured, a dummy film may be formed on an uppermost layer of the films forming the TMR element 13 in advance of etching into the TMR element 13. In this process, the films forming the TMR element 13 are etched into the TMR element with the dummy film put thereon. Alternatively, instead of a formation of the dummy film, an electrode layer 136 forming the uppermost layer of the TMR element 13 may be formed thicker by a thickness equivalent to the dummy film. Thus, a height of the side wall barrier film 49s may be ensured with the dummy film or the electrode layer of a greater thickness.

Further, a high permeability side wall 75s is formed on the side wall of the TMR element 13 through the side wall barrier film 49s so as to be connected to an end 55S of the first flux concentrator 55 by using the side wall formation technology employing the typical etching-back technology. The high permeability side wall 75s preferably has a greater thickness at least on the side of the TMR element 13 than a side wall portion of the flux concentrator 55. In addition, an end 75S of the high permeability side wall 75s may be as high as an interface between a storage layer 134 and a cap layer 136 of the TMR element 13, preferably over a height range of an interface between a tunnel barrier layer 133 and the storage layer 134 to an interface between the storage layer 134 and the cap layer 135, like the height as much as the end 51S of the flux concentrator 51 and others. Further, a distance between the end 75S and the TMR element 13 is determined depending on a thickness of the side wall barrier film 49s. Thus, the thickness of the side wall barrier film 49s needs to be equivalent to such a distance as to allow a galvano-magnetic flux having been concentrated on the end 75S to efficiently reach the storage layer 134. The thickness of the side wall barrier film 49s shall be equal to or less than 200 nm, preferably, equal to or less than 100 nm, for instance.

Thereafter, although not shown, a fifth insulator film 45 that covers the TMR element 13, the high permeability side wall 75s and others is formed on the fourth insulator film 44 in a similar manner as previously described with reference to FIG. 25D. Then, a surface of the fifth insulator film 45 is subjected to planarization by polishing through the CMP process, thereby allowing an upper surface of the electrode layer 136 of the TMR element 13 to be exposed to the outside. Then, a bit line 12 connected to the electrode layer 136 of the TMR element 13 is formed on the fifth insulator film 45 by using the typical interconnection fabrication technology such that the bit line 12 crosses (or extends orthogonal to, for instance) the write word line 11 in a grade-separated manner with the TMR element 13 interposed therebetween. Simultaneously with a fabrication of the bit line 12, interconnections (not shown) of peripheral circuits and a bonding pad region (not shown) are formed. Further, a sixth insulator film (not shown) forming a protection film is formed on the entire surface of the bit line 12 with a plasma-assisted silicon nitride, for instance. Then, a bonding pad portion is opened, and a wafer process of the magnetic memory device is completed.

The third method for manufacturing the magnetic memory device includes the step of opening the through hole 61 that extends through the write word line 11, the flux concentrator 55 and others and the step of forming the contact 63 in the through hole through the side wall barrier film 62, thereby providing the magnetic memory device having the TMR element 13 located on the contact 63 in a similar manner as the above first method. Thus, a connection between the TMR element 13 and the other interconnection is established by making use of a cell area of the TMR element 13 without newly creating an area of the contact 63 allotted to the cell area. Accordingly, there may be provided a MRAM composed of one switching element and one TMR element, in which the same access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

The third method for manufacturing the magnetic memory device further includes the step of forming the flux concentrator 55 of the high permeability film so as to surround the opposite side faces of the write word line 11 and the opposite face of the write word line 11 to the side facing the TMR element 13 and the step of forming the high permeability side wall 49s, so that a galvano-magnetic field generated at a time of applying a current to the write word line 11 is concentrated efficiently on the storage layer (which will be also called a recording layer) of the TMR element 13 with the high permeability film formed on the opposite side faces of the write word line 11. Thus, it is possible to reduce current required for writing, thus reducing current consumption and also increasing lifetime of the write word line 11 against electromigration. Further, there is less drive current required, which reduces an area of a current drive circuit, thereby providing an increased integration level. Further, as leakage of magnetic field is also reduced, interference with adjacent cells is reduced. Furthermore, the end of the flux concentrator 55 has a greater thickness on the side of the TMR element 13 with the second high permeability side wall 49s, so that the galvano-magnetic field may be applied to the TMR element 13 more efficiently than the above first method.

The third method of the above preferred embodiment may also be applied for obtaining the magnetic memory device of the third preferred embodiment as previously described with reference to FIG. 6, as long as the end of the side wall of the flux concentrator 55 is determined to be in agreement with a lower end of the high permeability side wall 49s in such a manner as to set the end of the side wall of the flux concentrator 55 to be equal to that of the lower end of the high permeability side wall 49s.

Alternatively, the above third method may also adopt the following steps, specifically, a step of fabricating the write word line 11 by forming the insulator film on the high permeability film 73 prior to a fabrication of the write word line 11, a step of forming the high permeability side wall 74s so as to be connected to the high permeability film 73 after a formation of the side wall barrier film on the side wall of the write word line 11, and a step of forming the TMR element 13 connected to the contact 63 by forming the high permeability film on the fourth insulator film 44, while providing the through hole 61, the side wall barrier film 62, the contact 63 and others after a formation of the insulator film so as to establish a connection between the insulator film and the landing pad 33.

Next, the side wall barrier film 49s is formed on the side wall of the TMR element 13. In etching back the side wall barrier film 49s, the insulator film formed right beneath the TMR element 13 is also formed. Then, the high permeability side wall 75s is formed. In etching back the high permeability side wall 75s, the high permeability film exposed to the outside is also etched. By using a modification of the method having the above steps, it becomes possible to obtain the magnetic memory device of the seventh preferred embodiment as previously described with reference to FIG.

14. In this case, the high permeability side wall 75s has, also preferably, a greater thickness at least on the side of the TMR element 13 than the side wall portion of the flux concentrator 55. In addition, the above modification of the method may be also applied for obtaining the magnetic memory device of the sixth preferred embodiment, upon omitting the step of forming the insulator film and the high permeability film located right beneath the TMR element 13.

Figure 27A:
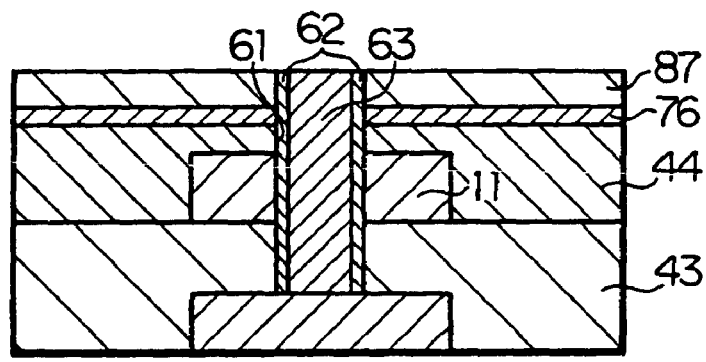
FIGS. 27A to 27C are cross-sectional views showing steps of an example of a fourth method for manufacturing a magnetic memory device according a preferred embodiment of the present invention.
Figure 27B:
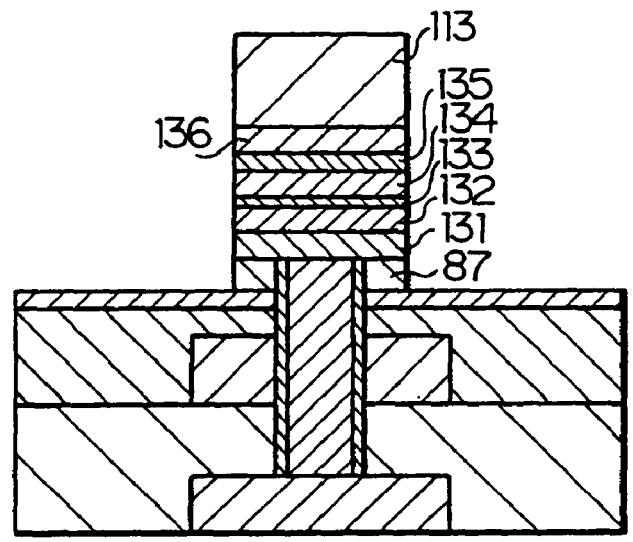

A fourth method for manufacturing a magnetic memory device according a preferred embodiment of the present invention will be described next with reference to FIG. 27A to FIG. 27B showing a cross-sectional view of steps of the above preferred embodiment. The fourth method relates to a method that is applied for obtaining the magnetic memory device of the eighth preferred embodiment previously described with reference to FIG. 15.

According to the above fourth method, steps previous to a formation of a third insulator film 43 are conducted in a similar manner as previously described with reference to FIG. 20A. Thus, in the following description, steps subsequent to the formation of the third insulator film 43 will be given. As shown in FIG. 27A, a write word line 11 is formed on the third insulator film 43. Then, a fourth insulator film 44 that covers the write word line 11 is formed. Thereafter, a surface of the fourth insulator film 44 is subjected to planarization by polishing through the CMP process, thereby allowing the write word line 11 to be exposed to the outside. Next, a plasma-assisted CVD oxide, a plasma-assisted nitride or alumina is formed. A thickness of the formed film shall be equal to or less than 200 nm, preferably, equal to or less than 100 nm. Then, a high permeability film 76 and an insulator film 87 are formed in ascending order on the fourth insulator film 44.

Next, a through hole 61 that extends from the insulator film 87 to a second landing pad 33 through the high permeability film 76, the fourth insulator film 44, the write word line 11 and the third insulator film 43 is opened. Then, a side wall barrier film 62 is formed on a side wall of the through hole 61. Further, a contact 63 having a conductivity is formed in the through hole 61 through the side wall barrier film 62. A similar method as the above first method may be also applied to provide the through hole 61, the side wall barrier film 62 and the contact 63.

Next, as shown in FIG. 27B, the TMR element 13 is formed. Specifically, a barrier layer (not shown), an antiferromagnetic layer 131, a fixed magnetization layer 132, a tunnel barrier layer 133, a storage layer 134, a cap layer 135 and an electrode layer 136 are formed in ascending order on an insulator film 87 in a similar manner as previously described in the above first method. In this step, a dummy layer 113 is further formed on the electrode layer 136. Then, a multi-layered film ranging from the dummy film 113 to the barrier layer is etched into a shape of the TMR element 13 so as to be connected to the contact 63 by using the lithography technology and the etching technology. In this manner, there is provided the TMR element 13 that has the dummy film 133 put thereon and is connected to the contact 63. Alternatively, instead of a formation of the dummy film 113, the electrode layer 136 forming the uppermost layer of the TMR element 13 may be also formed thicker by a thickness equivalent to the dummy film 113. Alternatively, no dummy or damascene film 113 is required, if the electrode layer 136 has a thickness enough so as not to require formation of the dummy film 113.

Figure 27C:
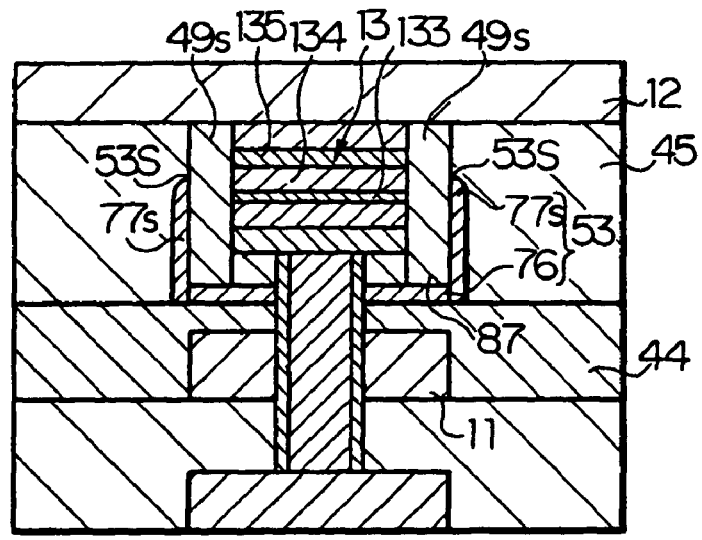

Next, as shown in FIG. 27C, a side wall barrier film 49s is formed on the side wall of the TMR element 13 by using the side wall formation technology employing the typical etching-back technology. In the etching-back process, the insulator film 87 is also etched back, thereby allowing the high permeability film 76 to be exposed to the outside. Further, a flux concentrator 53 is formed by forming a high permeability side wall 77s on the side wall of the TMR element 13 through the side wall barrier film 49s using the side wall formation technology employing the typical etching-back technology. An end 53S of a side wall (high permeability side wall 77s) of the flux concentrator 53 may be as high as an interface between the storage layer 134 and the cap layer 135 of the TMR element 13, preferably over a height range of an interface between the tunnel barrier layer 133 and the storage layer 134 to an interface between the storage layer 134 and the cap layer 133, for instance. A distance x between the end 53S of the flux concentrator 53 and the TMR element 13 needs to be such a distance as to allow a galvano-magnetic flux having been concentrated on the end 53S of the flux concentrator 53 to efficiently reach the storage layer 134. The above distance x shall be equal to or less than 200 nm, preferably, equal to or less than 100 nm, for instance. Thereafter, the dummy film (See FIG. 27B) is stripped.

Next, a fifth insulator film 45 that covers the TMR element 13, the flux concentrator 53 and others is formed on the fourth insulator film 44 in a similar manner as previously described with reference to FIG. 25D. Then, a surface of the fifth insulator film 45 is subjected to planarization by polishing through the CMP process, thereby allowing an upper surface of the electrode layer 136 of the TMR element 13 to be exposed to the outside. Then, a bit line 12 connected to the electrode layer 136 of the TMR element 13 is formed on the fifth insulator film 45 by using the typical interconnection fabrication technology such that the bit line 12 crosses (or extends orthogonal to, for instance) the write word line 11 in a grade-separated manner with the TMR element 13 interposed therebetween. Simultaneously with a fabrication of the bit line 12, interconnections (not shown) of peripheral circuits and a bonding pad region (not shown) are also formed. Further, a sixth insulator film (not shown) forming a protection film is formed over the entire surface of the bit line 12 with a plasma-assisted silicon nitride, for instance. Then, a bonding pad portion is opened, and a wafer process of the magnetic memory device is completed.

The fourth method for manufacturing the magnetic memory device includes the step of opening the through hole 61 that extends through the write word line 11, the flux concentrator 53 and others, and the step of forming the contact 63 in the through hole 61 through the side wall barrier film 62, thereby providing the magnetic memory device having the TMR element 13 located on the contact 63 in a similar manner as the above first method. Thus, a connection between the TMR element 13 and the landing pad 33 is established by making use of a cell area of the TMR element 13 without newly creating an area of the contact 63 allotted to the cell area. Accordingly, there may be provided a MRAM composed of one switching element and one TMR element, in which a similar access rate as the conventional MRAM of one switching element-one TMR element type is maintained, and a more reduction in cell area as compared with the conventional MRAM is enabled. A cell area of the MRAM composed of one switching element and one TMR element may be made smaller as much as a cell area of the cross-point MRAM.

The fourth method for manufacturing the magnetic memory device further includes the step of forming the flux concentrator 53 after the fabrication of the write word line 11, so that a galvano-magnetic field generated at a time of applying a current to the write word line 11 is concentrated efficiently on the storage layer (which will be also called a recording layer) of the TMR element 13 through the end 53S of the flux concentrator 53. Thus, it is possible to reduce current required for writing, thus reducing current consumption and also increasing lifetime of the write word line 11 against electromigration. Further, there is less drive current required, which reduces an area of a current drive circuit, thereby providing an increased integration level. Further, as leakage of magnetic field is also reduced, interference with adjacent cells is reduced.

A fifth method for manufacturing a magnetic memory device according a preferred embodiment of the present invention will be described next with reference to FIGS. 28A to 29C of cross-sectional views showing steps of this preferred embodiment. The fifth method relates to a method that is applied for obtaining the magnetic memory device of the ninth or the eleventh preferred embodiment previously described with reference to FIG. 16.

Figure 28A:
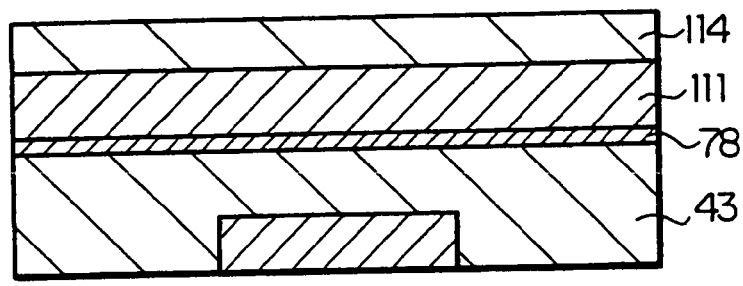
FIGS. 28A to 28D are cross-sectional views showing steps of an example according to a fifth method for manufacturing a magnetic memory device according a preferred embodiment of the present invention.

According to the above fifth method, steps previous to formation of a third insulator film 43 are conducted in a similar manner as previously described with reference to FIG. 20A. Thus, in the following description, steps subsequent to the formation of the third insulator film 43 will be given. First, as shown in FIG. 28A, a first high permeability film 78, a first interconnection layer 111 and a dummy film 114 are formed in ascending order on the third insulator film 43 in a similar manner as previously described with reference to FIG. 24A.

Figure 28B:
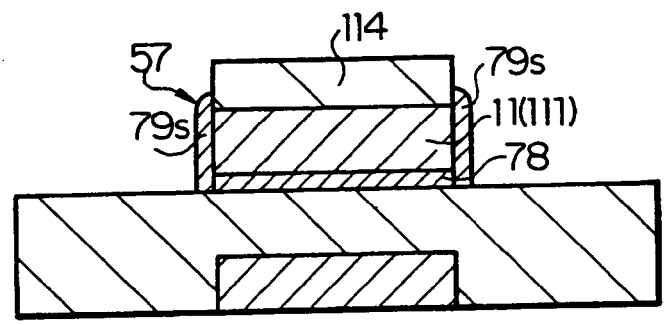

Next, as shown in FIG. 28B, a multi-layered film ranging from the dummy film 114 to the first high permeability film 78 is etched, and the write word line 111 is formed with the first interconnection layer 111. The write word line 11 is provided in a shape with the dummy film 114 put thereon.

Next, a first high permeability side wall 79s including high permeability material is formed on a side wall of a multi-layered structure formed into the shape of the write word line 11 by etching, and a first flux concentrator 57 composed of the first high permeability film 78 and the first high permeability side wall 79s is formed. Thereafter, the dummy film 114 is selectively stripped. Alternatively, the write word line 11 with the first high permeability film 78 remained may be also formed. In this case, a removal of an extra portion of the first high permeability film 78 on the third insulator film 43 will do in the step of forming the first high permeability side wall 79s. In this step of forming the first high permeability side wall 79s, if the end of the first high permeability side wall 79s is determined to be in alignment with an upper surface of the write word line 11, the magnetic memory device of the ninth preferred embodiment will be obtainable. Alternatively, if the end of the first high permeability side wall 79s is formed to be projecting from the upper surface of the write word line 11, the magnetic memory device of the eleventh preferred embodiment will be attainable. In figures, there is shown a case where the magnetic memory device of the eleventh preferred embodiment is obtained.

Figure 28C:
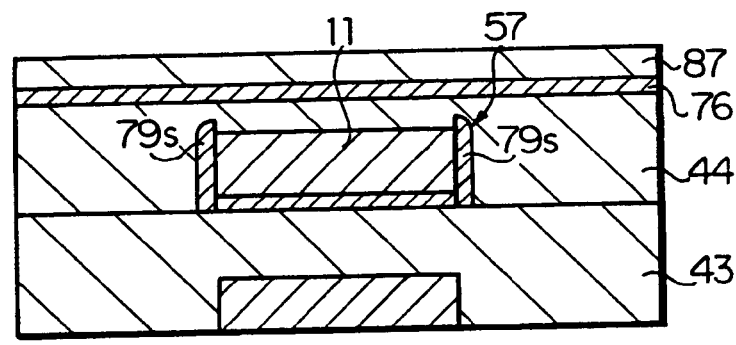

Next, as shown in FIG. 28C, a fourth insulator film 44 that covers the first flux concentrator 57, the write word line 11 and others is formed on the third insulator film 43. Then, a surface of the fourth insulator film 44 is subjected to planarization by polishing through the CMP process. In polishing, it does not matter if an end of a side wall portion (first high permeability side wall 79s) of the first flux concentrator 57 is exposed to the outside. Further, a second high permeability film 76 and an insulator film 87 are formed in ascending order on the fourth insulator film 44 in a similar manner as the above fourth method.

Figure 28D:
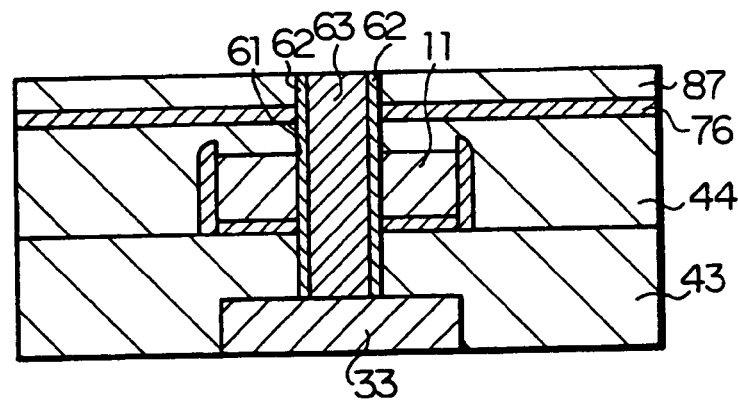

Next, as shown in FIG. 28D, a through hole 61 is opened, which extends to the landing pad 33 through the insulator film 87, the high permeability film (second high permeability film) 76, the fourth insulator film 44, the write word line 11, the first flux concentrator 57 and the third insulator film 43. A similar manner as the above first method may be adopted in opening the through hole 61. Further, a side wall barrier film 62 is formed on a side wall of the through hole 61. Further, a contact 63 is formed in the through hole 61 through the side wall barrier film 62.

Figure 29A:
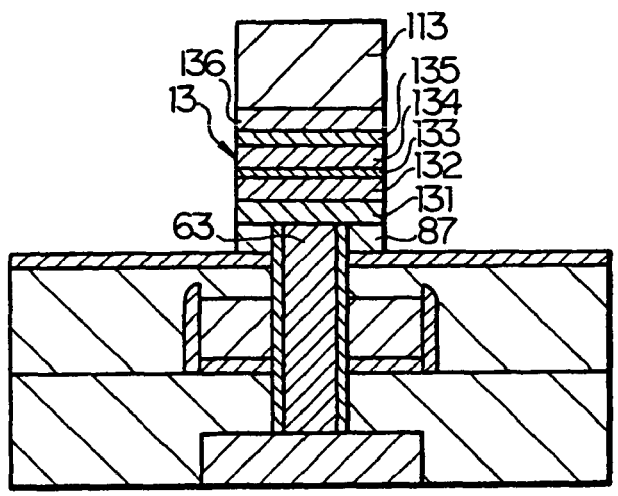
FIGS. 29A to 29C are cross-sectional views showing more steps of the preferred embodiment of the fifth method for manufacturing the magnetic memory device according a preferred embodiment of the present invention.

Then, as shown in FIG. 29A, a barrier layer (not shown), an anti-ferromagnetic layer 131, a fixed magnetization layer 132, a tunnel barrier layer 133, a storage layer 134, a cap layer 135 and an electrode layer 136 are formed in ascending order on the insulator film 87 in a similar manner as previously described in the above first method. In this process, a dummy film 113 is further formed in a similar manner as the above fourth method. Then, a multi-layered film ranging from the dummy film 113 to the barrier layer is etched into a shape of a TMR element 13 by using the lithography technology and the etching technology, and the TMR element 13 is formed so as to be connected to the contact 63. In this manner, there is provided the TMR element 13 that has the dummy film put thereon and is connected to the contact 63. Alternatively, instead of a formation of the dummy film 113, the electrode layer 136 forming the uppermost layer of the TMR element 13 may be formed thicker by a thickness equivalent to the dummy film 113.

Figure 29B:
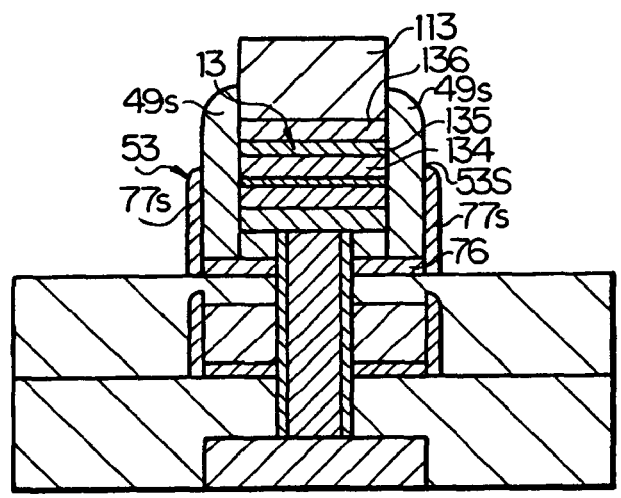

Next, as shown in FIG. 29B, a side wall barrier film 49s is formed on a side wall of the TMR element 13 by using the side wall formation technology employing the typical etching-back technology. In etching back the insulator film, the insulator film 87 is also etched back, thereby allowing the second high permeability film 76 to be exposed to the outside. Further, a high permeability side wall (second high permeability side wall) 77s is formed on a side wall of the TMR element 13 through the side wall barrier film 49s by using the side wall formation technology employing the typical etching-back technology. In this manner, there is provided the second flux concentrator 53 composed of the second high permeability film 76 and the second high permeability side wall 77s. An end 53S of a side wall (second high permeability side wall 77s) of the flux concentrator 53 may be as high as an interface between the storage layer 134 and the cap layer 133 of the TMR element 13, preferably over a height range of an interface between the tunnel barrier layer 133 and the storage layer 134 to an interface between the storage layer 134 and the cap layer 133, for instance. A distance between the end 53S of the flux concentrator 53 and the TMR element 13 needs to be such a distance as to allow a galvano-magnetic flux having been concentrated on the end 53S of the flux concentrator 53 to efficiently reach the storage layer 134. The above distance shall be equal to or less than 200 nm, preferably, equal to or less than 100 nm, for instance. Thereafter, the dummy film 113 is stripped. Alternatively, instead of a formation of the dummy film 113, the electrode layer 136 may be formed thicker by a thickness equivalent to the dummy film 113. Alternatively, no dummy or damascene film is required, if the electrode layer 136 has a thickness enough so as not to require formation of the dummy film 113.

Figure 29C:
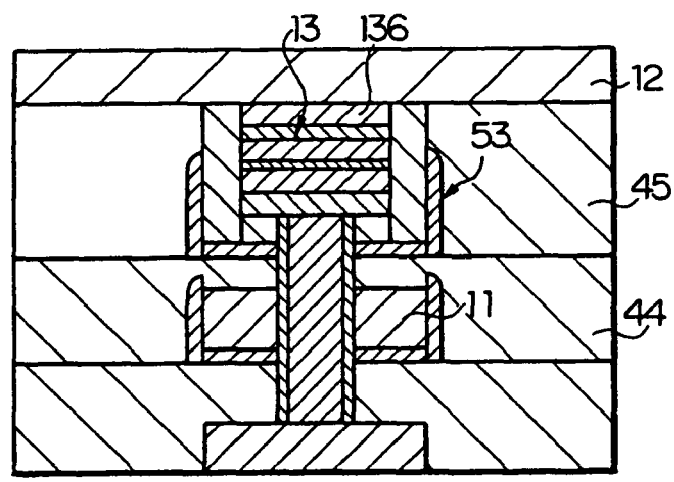
Figure 30:
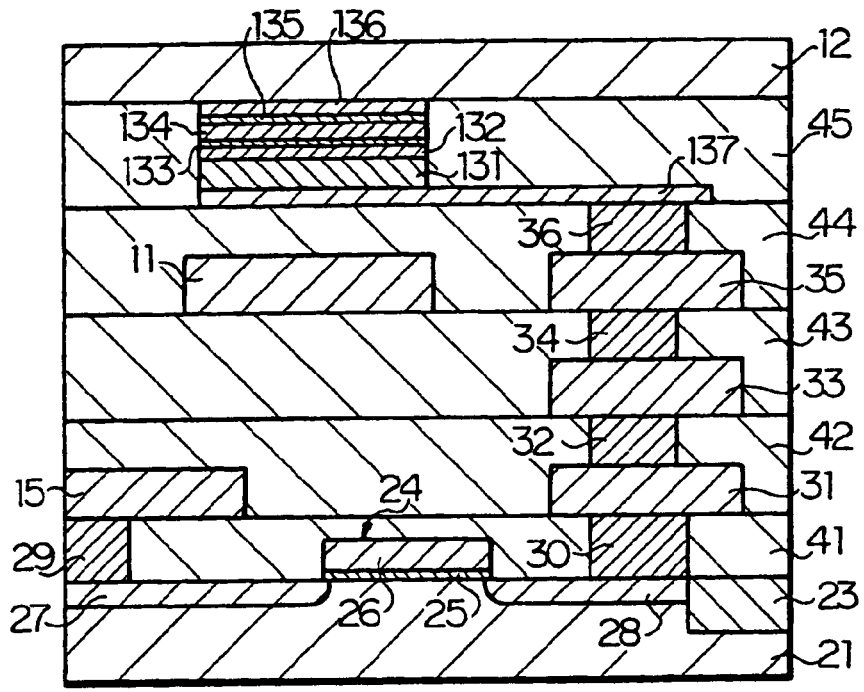
FIG. 30 is showing a cross-sectional view of a schematic configuration of a conventional MRAM of one switching element-one TMR element type.
Figure 31:
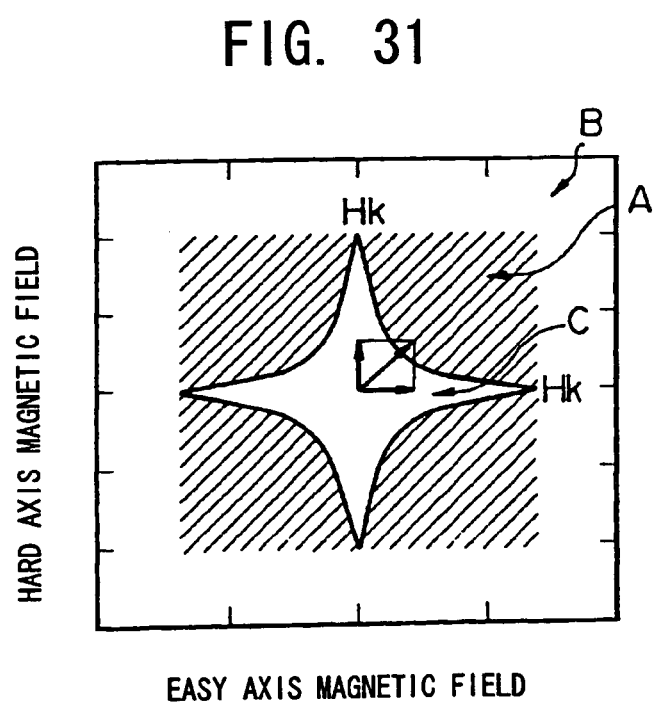
FIG. 31 is a graph of an asteroid curve showing an inverted threshold value in a magnetization orientation of a storage layer with an easy axis magnetic field $H_{EA}$ and a hard axis magnetic field $H_{HA}$.
Figure 32:
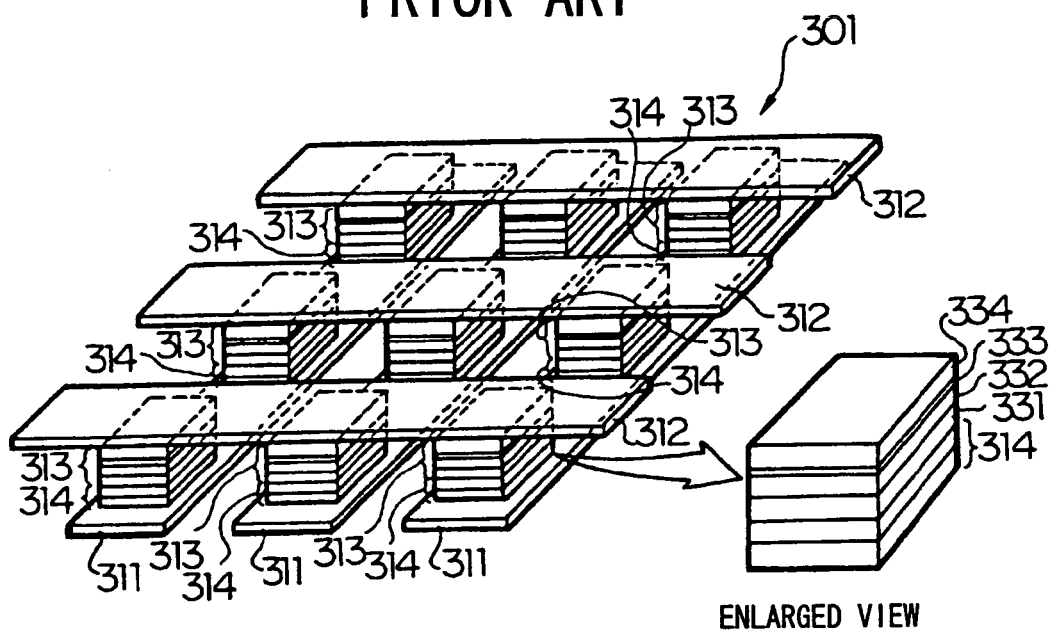
FIG. 32 is a perspective view showing a basic configuration of a conventional cross-point MRAM.
Figure 33:
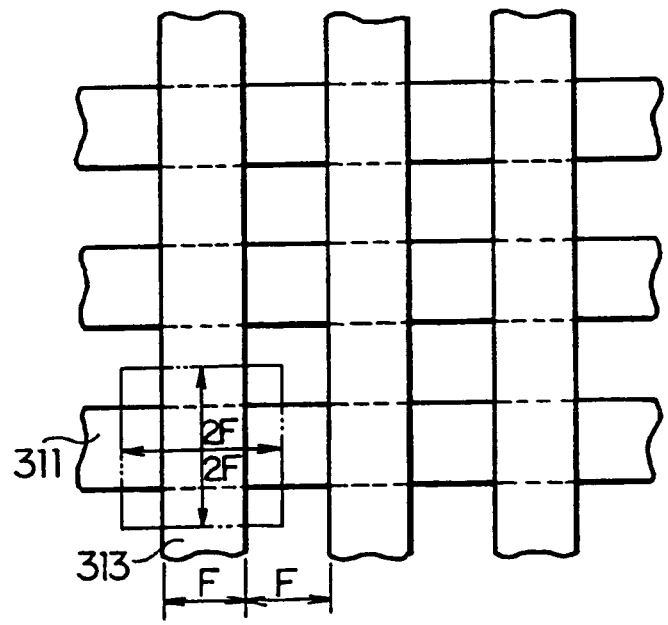
FIG. 33 is a layout diagram showing a basic configuration of a conventional cross-point MRAM.
Figure 34:
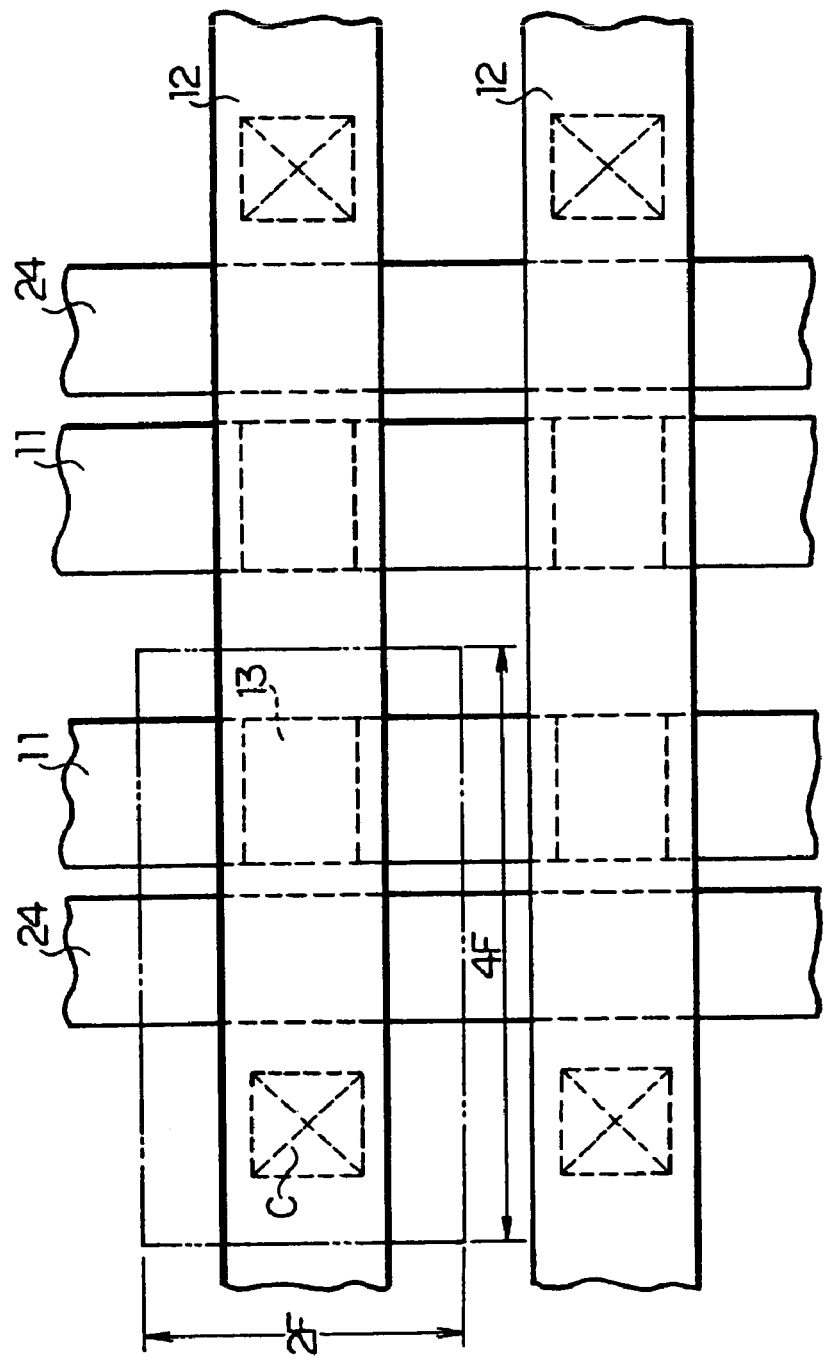
FIG. 34 is a layout drawing showing a basic configuration of a conventional MRAM of one switching element-one TMR element type.

Then, as shown in FIG. 29C, a fifth insulator film 45 that covers the TMR element 13, the second flux concentrator 53 and others is formed on the fourth insulator film 44 in a similar manner as previously described with reference to FIG. 25D. Then, a surface of the fifth insulator film 45 is subjected to planarization by polishing through the CMP process, thereby allowing an upper surface of the electrode layer 136 of the TMR element 13 to be exposed to the outside. Then, a bit line 12 connected to the electrode layer 136 of the TMR element 13 is formed on the fifth insulator film 45 by using the typical interconnection fabrication technology such that the bit line 12 crosses (or extends orthogonal, for instance) the write word line 11 in a grade-separated manner with the TMR element 13 interposed therebetween. Simultaneously with a fabrication of the bit line 12, interconnections (not shown) of peripheral circuits and a bonding pad region (not shown) are also formed. Further, a sixth insulator film (not shown) forming a protection film is formed over the entire surface of the bit line 12 with a plasma-assisted silicon nitride, for instance. Then, a bonding pad portion is opened, and a wafer process of the magnetic memory device is completed.

In the fifth method for manufacturing the magnetic memory device, if an insulator film is provided between the write word line 11 and the first flux concentrator 57, the magnetic memory device of the tenth or the twelfth preferred embodiment will be obtainable. The insulator film may be provided between the write word line 11 and the first flux concentrator 57, as long as the side wall barrier film is formed on the side wall of the write word line 11 before a formation of the first high permeability side wall 79s in such a manner as to form an insulator film between the high permeability film 78 and the first interconnection layer 111.

The fifth method for manufacturing the magnetic memory device includes the step of opening the through hole 61 that extends through the write word line 11, the first flux concentrator 57, the second flux concentrator 53 and others and also the step of forming the contact 63 in the through hole 61 through the side wall barrier film 62, thereby providing the magnetic memory device having the TMR element 13 located on the contact 63 in a similar manner as the above first method. Thus, a connection between the TMR element and the second landing pad 33 connected to the switching element is established by making use of a cell area of the TMR element 13 without newly creating an area of the contact 63 allotted to the cell area. Accordingly, there may be provided a MRAM composed of one switching element and one TMR element, in which a similar access rate as the conventional MRAM of one switching element-one TMR element type is maintained, and a more reduction in cell area as compared with the conventional MRAM is enabled. A cell area of the MRAM composed of one switching element and one TMR element is made smaller as much as a cell area of the cross-point MRAM.

In addition, the fifth method for manufacturing the magnetic memory device further includes the step of forming the first flux concentrator of the high permeability film so as to surround the opposite side faces of the write word line and the opposite face of the write word line 11 to the side facing the TMR element 13, and a step of forming the second flux concentrator 53 of the high permeability film so as to be located between the write word line 11 and the TMR element 13 while extending along the side face of the TMR element 13 through the insulator film, so that a galvano-magnetic field generated at a time of applying a current to the write word line is concentrated efficiently on the storage layer (which will be also called a recording layer) 134 of the TMR element 13 through a transfer from the first flux concentrator 57 to the second flux concentrator 53. Thus, it is possible to reduce current required for writing, thus reducing current consumption and also increasing lifetime of the write word line 11 against electromigration. Further, there is less drive current required which reduces an area of a current drive circuit, thereby providing an increased integration level. Further, as leakage of magnetic field is also reduced, interference with adjacent cells is reduced.

In the above preferred embodiments of the methods for manufacturing the magnetic memory device, an end of the side wall portion of each flux concentrator on the side of the TMR element 13 may be as high as an interface between the storage layer 134 and the cap layer 135 of the TMR element 13, preferably over a height range of an interface between the tunnel barrier layer 133 and the storage layer 134 to an interface between the storage layer 134 and the cap layer 135, for instance. In addition, a distance between the end of the flux concentrator and the TMR element 13 needs to be such a distance as to allow a galvano-magnetic flux having been concentrated on the end of the flux concentrator to efficiently reach the storage layer 134. The above distance shall be equal to or less than 200 nm, preferably, equal to or less than 100 nm, for instance.

It is to be noted that a means for planarization of each insulator film in the above manufacturing methods is not limited to polishing through the CMP process. Other planarization technologies (such as planarization with etching-back or re-flow and planarization of etching-back after a re-flow treatment) may be also employed.

In the above preferred embodiments of the second to the fifth methods for manufacturing the magnetic memory device, the write word line 11 is formed with a single interconnection. Alternatively, a plurality of interconnections (two, for instance) may be also employed. In this case, the through hole 61 is provided between the plurality of interconnections as previously described with reference to FIG. 23.

Furthermore, it should be pointed out that the present invention is not limited to the above-mentioned preferred embodiments. It is therefore to be understood by those of ordinary skill in the art that any changes, variations, combinations and sub-combinations may be practiced otherwise than as specifically described herein without departing from the scope and spirit of the present invention.

What is claimed is:

1. A magnetic memory device having a non-volatile magnetic section comprising:
    a first interconnection;
    a second interconnection crossing said first interconnection in a grade-separated manner;
    an interconnection layer separate from said first and second interconnections;
    a tunnel magneto resistance element electrically insulated from said first interconnection and electrically connected to said second interconnection, the tunnel magneto resistance element including a tunnel barrier layer interposed between ferromagnetic materials within a region in which said first and said second interconnections cross;
    a through hole through which said tunnel magneto resistance element is electrically connected with a connection in said interconnection layer, said through hole extending through said first interconnection and having an interior insulated from said first interconnection; and
    an electrically conductive contact in said through hole interconnecting said interconnection layer and a side of said tunnel magneto resistance element which is opposite to a side to which said second interconnection is connected, wherein,
said non-volatile magnetic section stores information by utilizing a change in resistance depending on whether spin directions of said ferromagnetic materials are parallel or antiparallel; and
interconnections are electrically conductive members.

2. The magnetic memory device according to claim 1, wherein said first interconnection comprises a plurality of interconnections.

3. The magnetic memory device according to claim 1, wherein said first interconnection includes a flux concentrator comprising a high permeability film provided at least on both sides of said first interconnection and on an surface which is opposite to the side that faces said tunnel magneto resistance element; at least one of said high permeability films on the side face of said first interconnection projects from said first interconnection toward said tunnel magneto resistance element; and said through hole extends through said first interconnection and said flux concentrator while being insulated from both said first interconnection and said flux concentrator.

4. The magnetic memory device according to claim 1, further comprising: a flux concentrator including a high permeability film provided between said first interconnection and said tunnel magneto resistance element, and on the side face of said tunnel magneto resistance element via an insulator film; and said through hole extends through said first interconnection and said flux concentrator while being insulated from both said first interconnection and said flux concentrator.

5. The magnetic memory device according to claim 1, further comprising: a first flux concentrator including a high permeability film provided at least on both sides of said first interconnection, and on an surface which is opposite to the side that faces said tunnel magneto resistance element; a second flux concentrator including a high permeability film provided between said first interconnection and said tunnel magneto resistance element, and on the side face of said tunnel magneto resistance element via an insulator film; and said through hole extends through said first interconnection and said first and second flux concentrators while being insulated from said first interconnection and said first and second flux concentrators.

* * * * *